US011341627B2

(12) United States Patent
Sarkisian et al.

(10) Patent No.: US 11,341,627 B2
(45) Date of Patent: May 24, 2022

(54) MACHINE LEARNING TOOL FOR STRUCTURES

(71) Applicant: Skidmore Owings & Merrill LLP, New York, NY (US)

(72) Inventors: Mark P. Sarkisian, San Anselmo, CA (US); Samantha Walker, Paris (FR)

(73) Assignee: SKIDMORE OWINGS & MERRILL LLP, New York, NY (US)

( * ) Notice: Subject to any disclaimer, the term of this patent is extended or adjusted under 35 U.S.C. 154(b) by 74 days.

(21) Appl. No.: 16/794,871

(22) Filed: Feb. 19, 2020

(65) Prior Publication Data
US 2020/0279364 A1 Sep. 3, 2020

Related U.S. Application Data

(60) Provisional application No. 62/812,029, filed on Feb. 28, 2019.

(51) Int. Cl.
*G06T 7/00* (2017.01)
*G06N 20/00* (2019.01)
*G06F 16/25* (2019.01)
*G06F 30/13* (2020.01)
*G06N 5/04* (2006.01)

(52) U.S. Cl.
CPC .......... *G06T 7/0004* (2013.01); *G06F 16/252* (2019.01); *G06F 30/13* (2020.01); *G06N 5/04* (2013.01); *G06N 20/00* (2019.01); *G06T 2207/10028* (2013.01); *G06T 2207/20081* (2013.01); *G06T 2207/20084* (2013.01); *G06T 2207/30132* (2013.01)

(58) Field of Classification Search
CPC .............................. G06T 7/0004; G06N 20/00
See application file for complete search history.

(56) References Cited

U.S. PATENT DOCUMENTS

| 7,587,061 | B1 | 9/2009 | Pacenti |
| 9,082,015 | B2 | 7/2015 | Christopulos et al. |
| 2004/0054568 | A1 | 3/2004 | Bradley et al. |
| 2015/0213315 | A1 | 7/2015 | Gross et al. |
| 2017/0132835 | A1 | 5/2017 | Halliday et al. |

(Continued)

FOREIGN PATENT DOCUMENTS

| CN | 103605970 A | 2/2014 |
| GB | 2556976 A | 6/2018 |
| WO | WO 2018/165753 | 9/2018 |

OTHER PUBLICATIONS

PCT Preliminary Report of Patentability issued in connection with related PCT/US2020/018770 dated Sep. 10, 2021.

(Continued)

*Primary Examiner* — Tuan H Nguyen
(74) *Attorney, Agent, or Firm* — Dentons US LLP

(57) ABSTRACT

A machine learning tool for structures to (1) design structures, (2) verify construction and (3) assess damage due to deterioration, change of properties or a destructive event. The tool comprises various pre-trained machine learning models and post-processing algorithms. The tool includes a user interface that allows users to upload their data, analyze it through one or more pre-trained machine learning models and post-process the machine learning results in various ways. The tool displays the results and allows users to export them in various formats.

13 Claims, 72 Drawing Sheets

(56) References Cited

U.S. PATENT DOCUMENTS

| | | | |
|---|---|---|---|
| 2017/0270612 A1 | 9/2017 | Howe et al. | |
| 2017/0270650 A1 | 9/2017 | Howe et al. | |
| 2018/0089763 A1 | 3/2018 | Okazaki | |
| 2018/0247416 A1 | 8/2018 | Ruda et al. | |
| 2018/0373931 A1* | 12/2018 | Li | G06Q 40/08 |
| 2020/0074171 A1* | 3/2020 | Gurav | G06K 9/34 |

OTHER PUBLICATIONS

Mitomi, H., et al., "Automated Damage Detection of Buildings from Aerial Television Images of the 2001 Gujarat, India Earthquake", Earthquake Disaster Mitigation Research Center, NIED, IEE, US, vol. 1, pp. 147-149.

Naito, Shohei, et al., "Damage Detection Method for Building with Machine-Learning Techniques Utilizing Images of Automobile Running Surveys Aftermath of the 2016 Kumamoto Earthquake", Journal of Disaster Research, vol. 13, No. 5, 2018, pp. 928-942.

Dori, D. et al., "From Engineering Drawings to 3D CAD models: are we ready now?", Computer-Aided Design, vol. 27, No. 4, Apr. 1995, pp. 243-254.

Diaz, A., et al., "Preliminary Observations in the Aftermath of the Sep. 19, 2017 Peubla-Morelos Earthquake", https://www.som.com/ideas/research/preliminary_observations_in_the_aftermath_of_the_september_19_2017_pueblamorelos_earthquake, Sep. 2017.

Menges, A., et al., "Applying Machine Learning to Generative Architectural Design", http://fresheyes.ksteinfe.com/, Dec. 17, 2017, 4 pages.

Mark Sarkisian, et al. "Building Thinking Machines: Enhancing the Built Environment through Artificial Intelligence", https://www.seaoc.org/store/ViewProduct.aspx?id=12341016. Mar. 31, 2018.

Liu, Chen, et al., "Deep Multi-Modal Image Correspondence Learning", https://arxiv.org/abs/1612.01225, Dec. 5, 2016.

Muthuveerappan, C., et al., "A Knowledge Based System for Element Recognition in 2D Construction Drawings for an Automated Bills of Quantities", https://www.researchgate.net/publication/260655681_A_Knowledge_Based_System_for_Element_Recognition_in_2D_Construction_Drawings_for_an_Automated_Bills_of_Quantities, Mar. 11, 2014.

PCT Search Report issued in connection with related PCT Application No. PCT/US2020/018770 dated Apr. 3, 2020.

* cited by examiner

FIGURE 8A
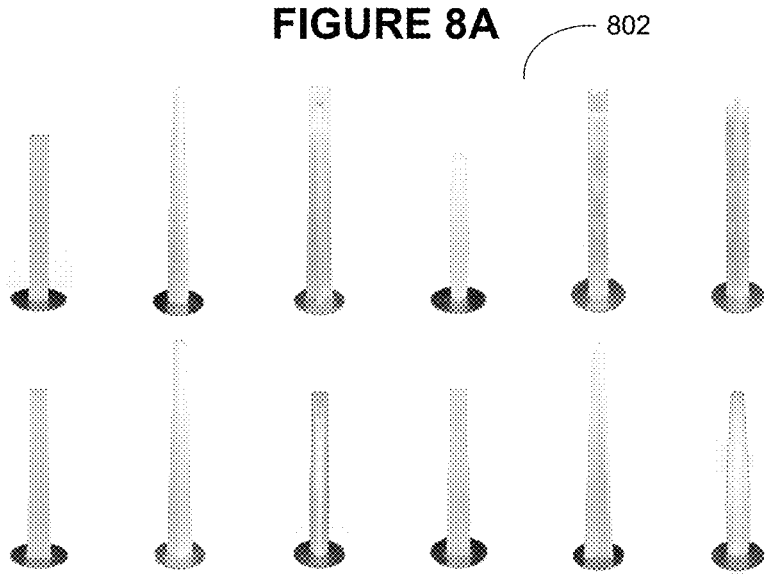
Figure 8A-1
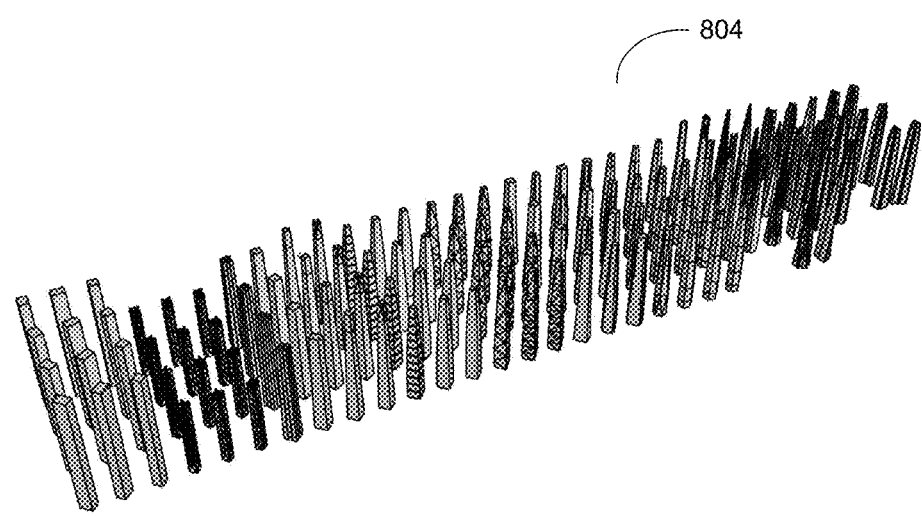
Figure 8A-2
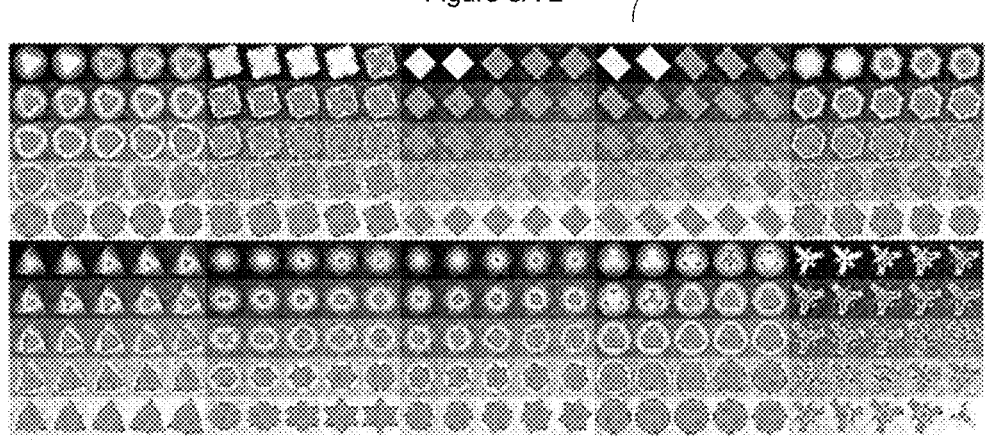
Figure 8A-3

FIGURE 8B
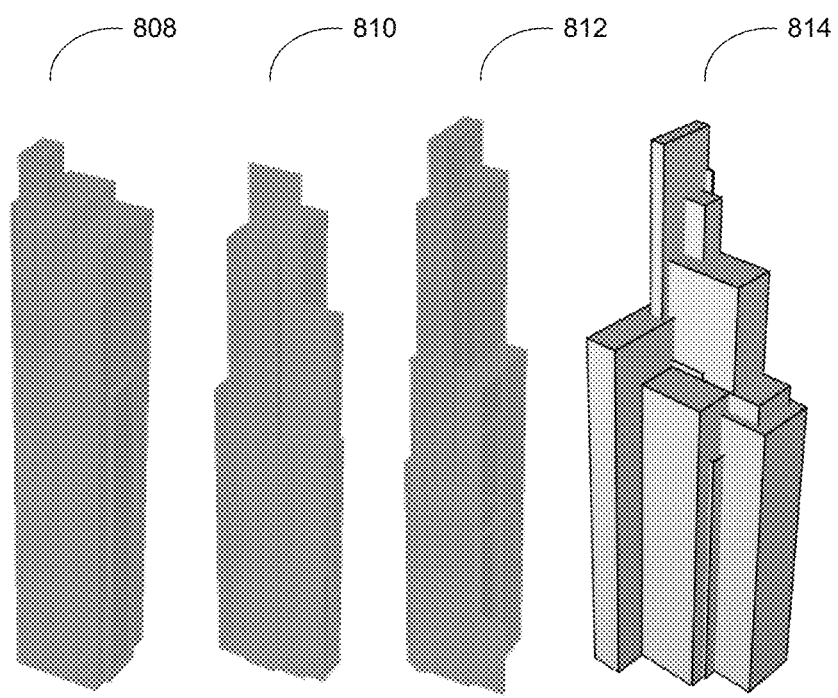
Figure 8B-1
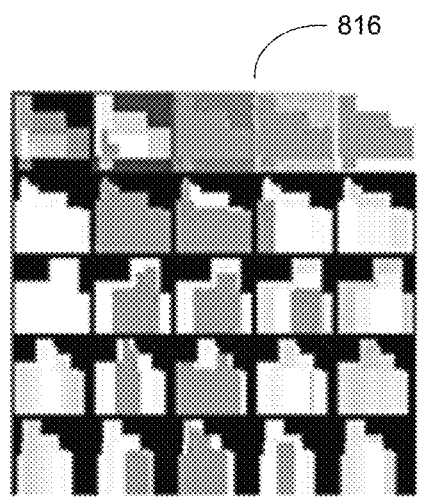
Figure 8B-2

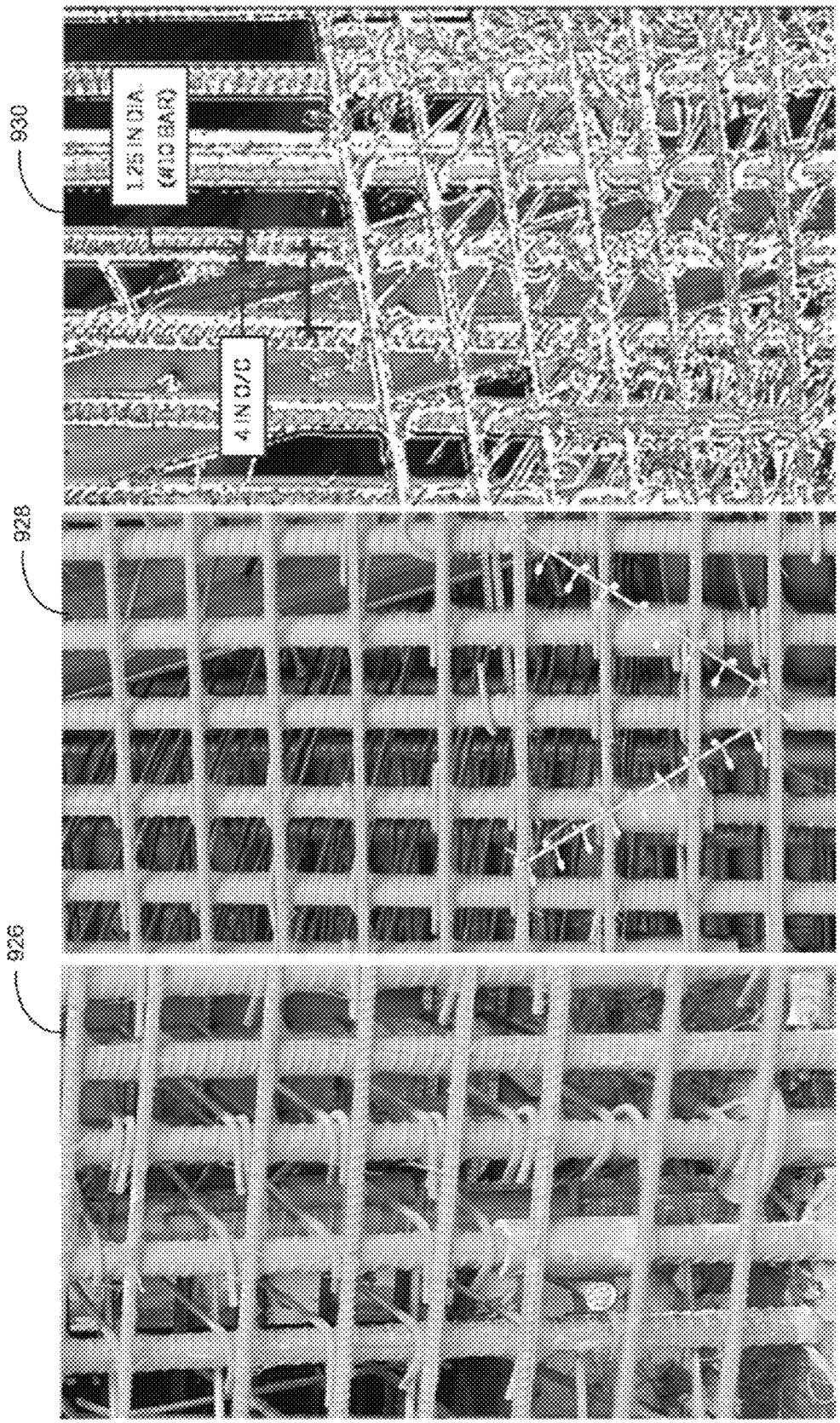

FIGURE 10F
Figure 10F-1
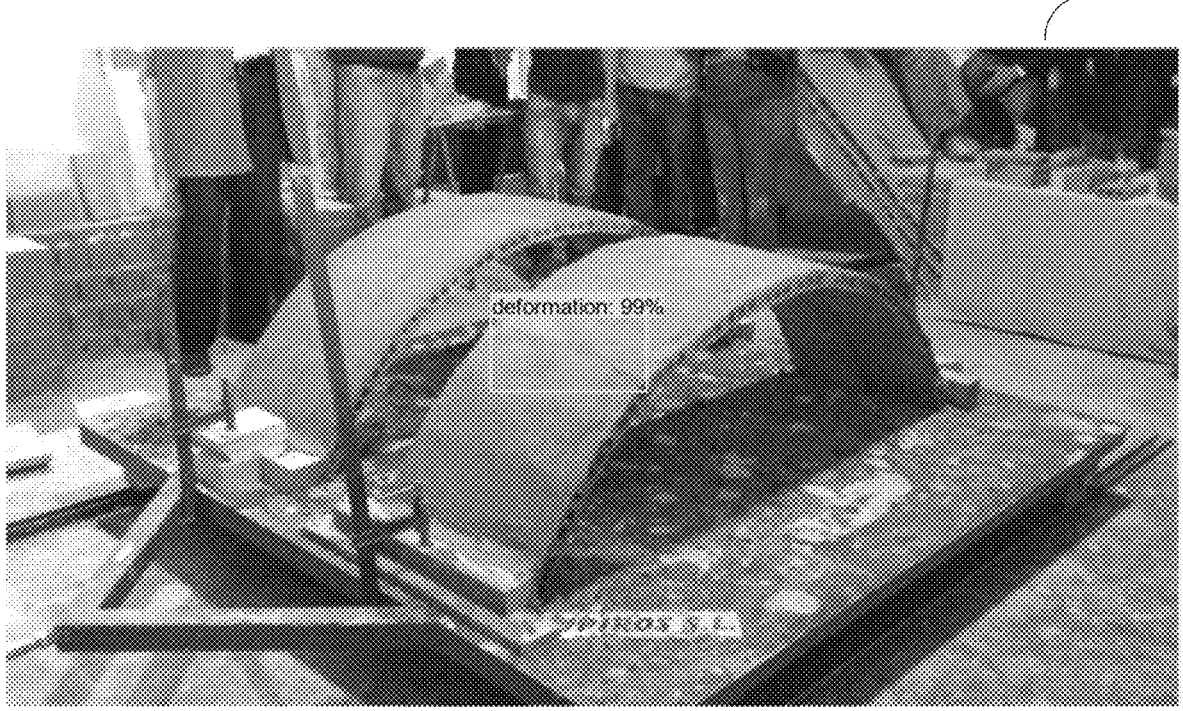
Figure 10F-2

FIGURE 10G
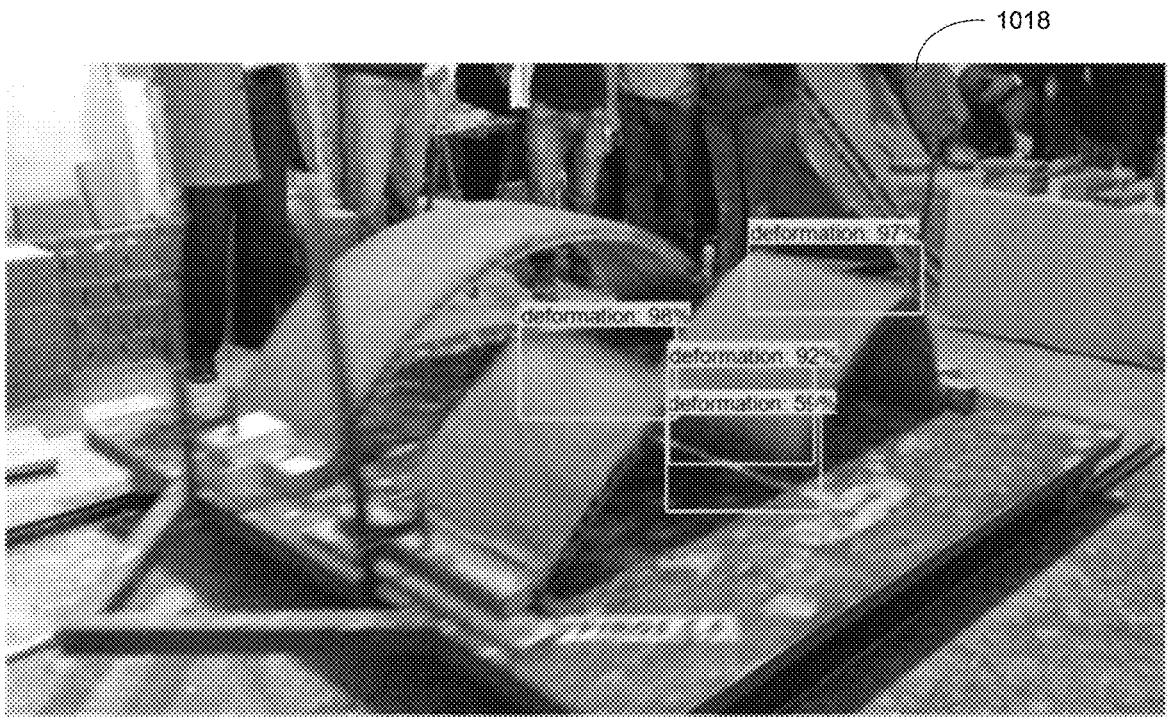
Figure 10G-1
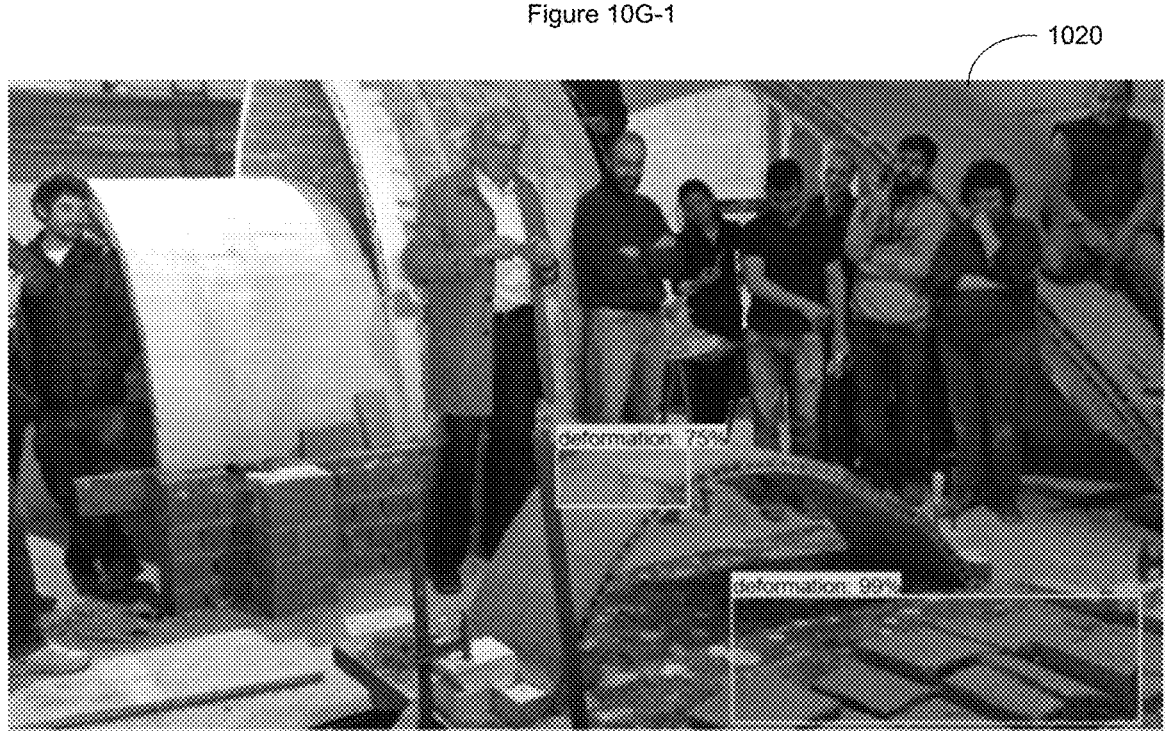
Figure 10G-2

FIGURE 10M
Figure 10M-1
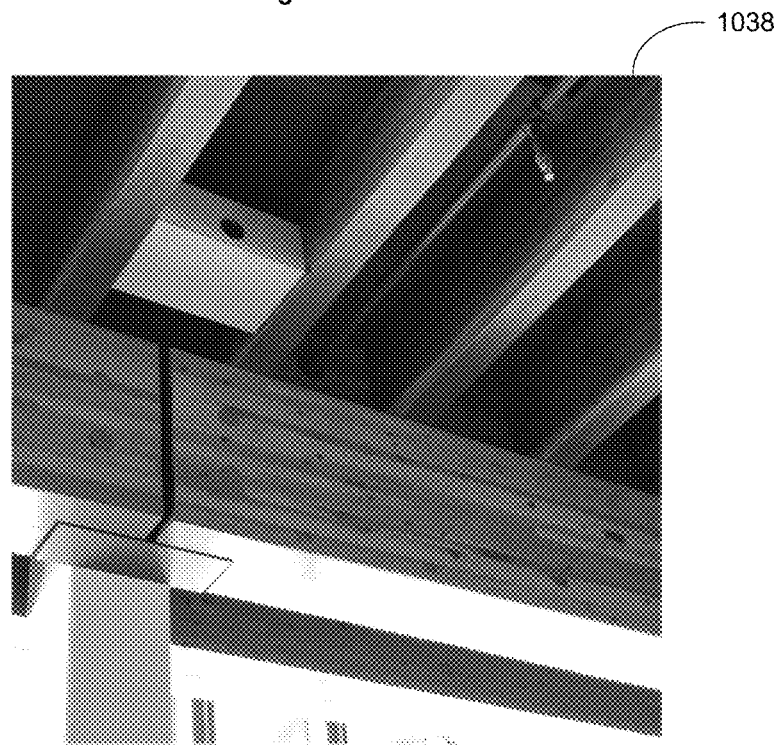
Figure 10M-2

FIGURE 10N
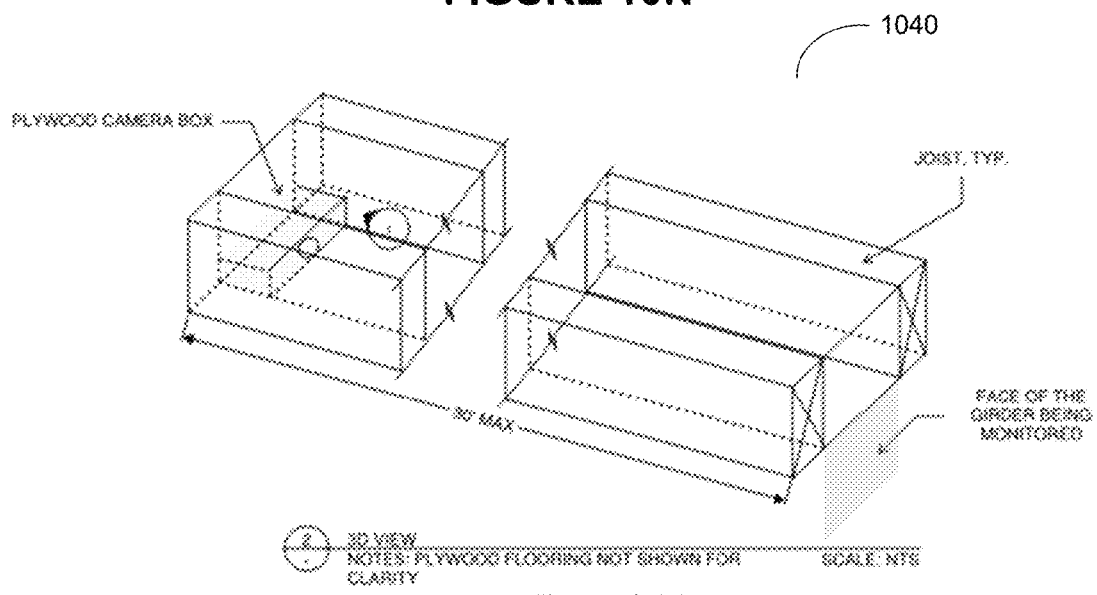
Figure 10N-1
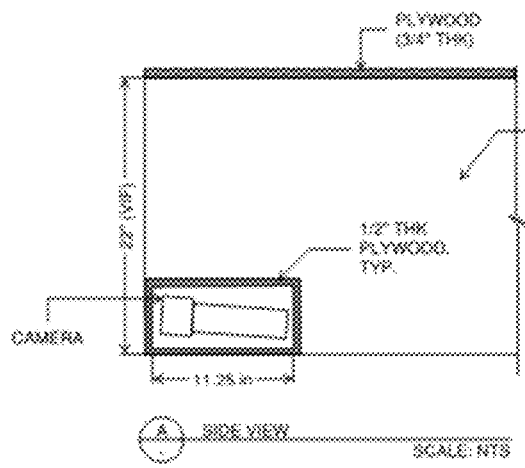
Figure 10N-2
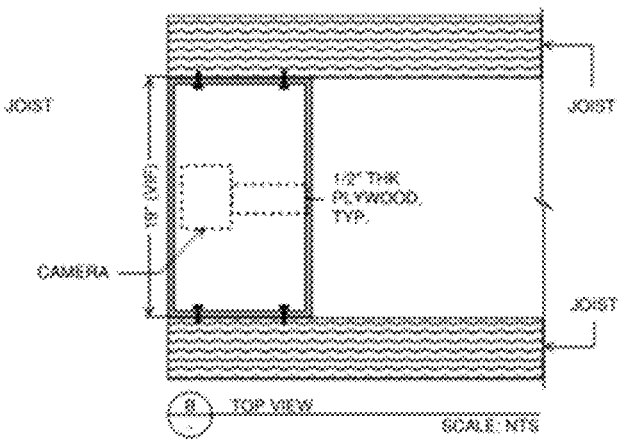
Figure 10N-3
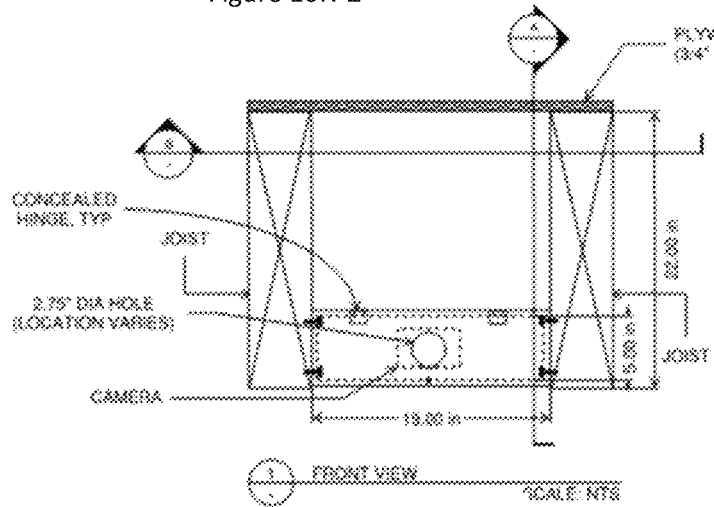
Figure 10N-4
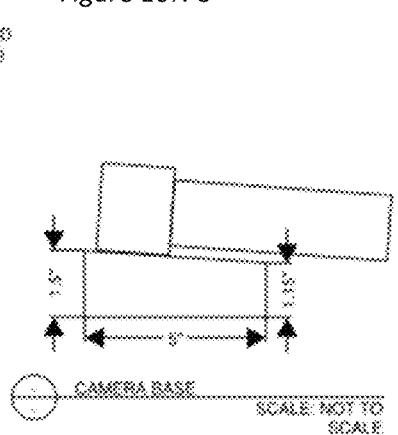
Figure 10N-5

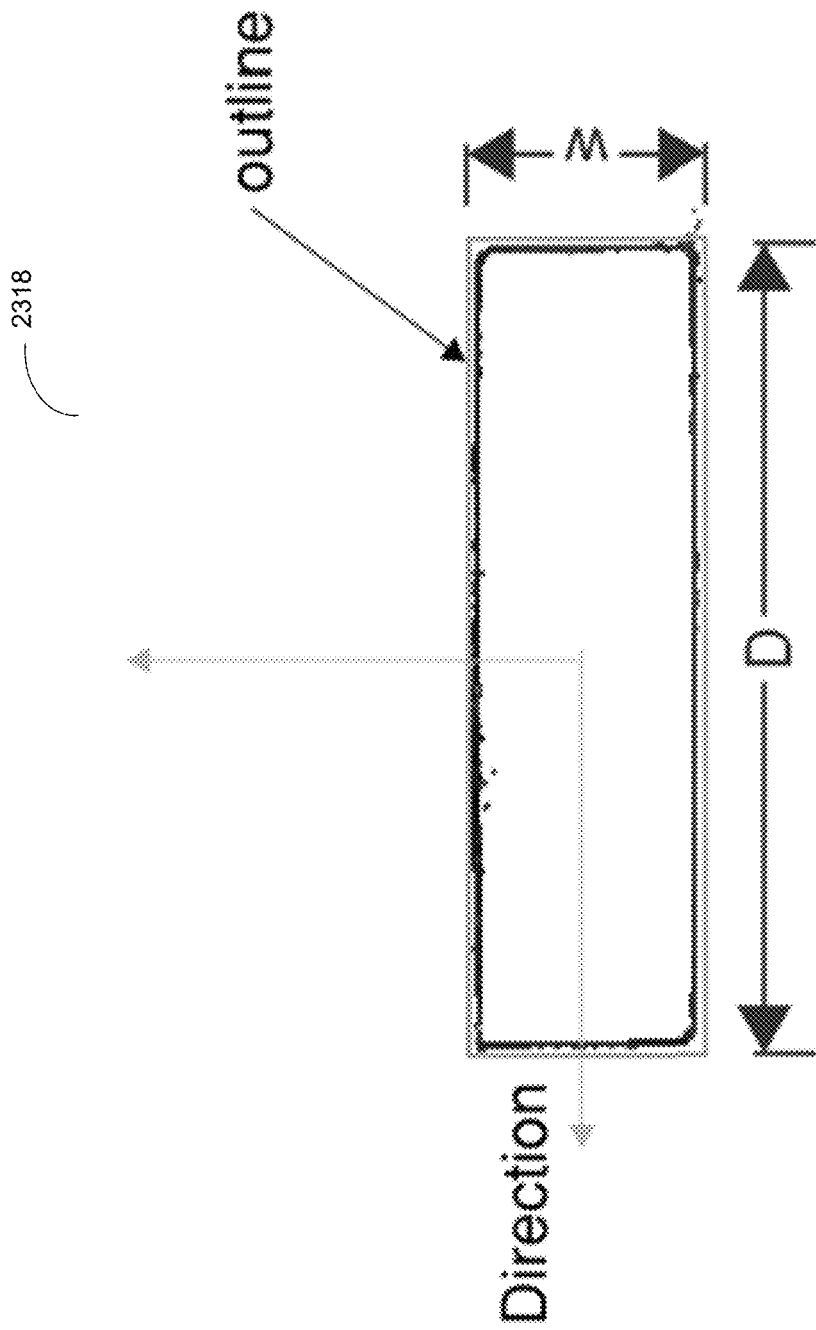

MACHINE LEARNING TOOL FOR STRUCTURES

RELATED APPLICATION DATA

This application claims the benefit of priority to U.S. Patent Application No. 62/812,029 filed Feb. 28, 2019, the entirety of which is incorporated herein by reference to the extent permitted by law.

FIELD OF TECHNOLOGY

The present disclosure relates to tools employing machine learning. The present disclosure also relates to automated structure assessments.

BACKGROUND

The design of a structure is typically collectively performed by various professionals that are specialists in their respective field, including but not limited to geotechnical engineers, structural engineers, mechanical engineers, electrical engineers, architects and interior designers. Each professional group depends on the others for expertise in their respective field. The design considerations typically include multiple variables such as program use, shape, aesthetics, wind and seismic effects, solar effects, energy, water use, etc. The consideration of these variables is typically performed by trial and error informed by the experience and knowledge of the different professionals involved.

To communicate the design to other stakeholders, professionals produce drawing sets and specification documents that are submitted to other professionals, the client and the general contractor. These drawings and specifications, referred to collectively as the contract documents, are then distributed to subcontractors. The subcontractors subsequently convert them into shop drawings depicting the portions of the structure that correspond to their respective trade. These shop drawings are reviewed by the general contractor and the professionals for compliance with the contract documents. They are then used to fabricate pieces and build the structure. Drawings can be produced by hand, using 2D drawing software or using 3D modeling software.

Throughout the construction process, contractors will implement quality assurance/quality control (QA/QC) procedures to assure the quality of the work and ensure that it meets expectations. In addition, inspectors will inspect the construction work and compare it to the construction documents to ensure the structure is being built as intended. The inspection dates and times are coordinated in advance between the inspection company and the contractor(s). Inspectors will physically visit the site, manually inspect the item(s) in question and prepare an inspection report to document their findings.

Changes typically occur over the course of construction, whether due to design changes, contractor mistakes, unforeseen conditions or other reasons. The general contractor records these changes and, once the structure is complete, submits an as-built drawing set to the client.

Over the course of a structure's life, it will be inspected and repaired to maintain it. These inspections are typically performed manually and can expensive, time-consuming and dangerous. They are performed discontinuously over intervals that could span decades. Therefore, issues that could lead to major damage or even collapse of a structure may be missed during these inspections.

After a natural disaster, damaged structures are visually inspected by qualified professionals. Because of the overwhelming need for inspections and the limited supply of experts, home and business owners of damaged buildings can wait months for an inspection to be completed. In some cases, they cannot occupy their home or operate their business until this inspection is complete. One of the greatest economical losses associated with natural disasters is due to downtime from repair and rebuilding, which is exacerbated by the slow manual inspection process.

The traditional processes described above that occur over the course of a structure's life, from design to construction to operation and maintenance, are generally manual, inefficient and leave room for error. This invention incorporates machine learning into these processes to automate them, improve their efficiency and reduce error.

SUMMARY

Disclosed herein are one or more inventions relating to a system or tool using machine learning in connection with assessments of structures. This new tool is mainly referred to herein as a machine learning tool for structures, although sometimes it is also referred to simply as the tool or the machine learning tool. This machine learning tool for structures is specially trained and programmed to use machine learning to assess performance of structures, identify entireties or portions of structures from images or drawings, assess damage to structures, or any combination of the foregoing. References throughout the present disclosure to machine learning encompass deep learning. It is to be understood that the present invention(s) fall within the deep learning subset of machine learning.

In addressing resiliency, this machine learning tool can be scaled and used to establish resiliency programs for a wide range of users from individual property owners to cities, counties, or countries where structures are assessed before and after a natural or man-made disaster. This assessment can be interfaced with broader resiliency plans addressing critical needs following an event.

In an embodiment, a machine learning tool comprises: a computing system with one or more data processors and memory; a user interface via which information can be output to a user and via which information and data can be input by the user, the data identifying one or more structures, components thereof, or both; a database in which the data are stored; a database management system that communicates with the database to store and retrieve the data in and from the database; and non-transient data processor executable instructions stored in the memory, the instructions comprising one or more pre-trained machine learning models, wherein the one or more machine learning models are pre-trained to process the data in the database to evaluate performance or design of a structure from images, point cloud data, or three-dimensional representations or drawings thereof, identify components of a structure from an image or point cloud data, identify one or more components of a structure and extract related text from a drawing, identify and assess damage in a structure from an image or point cloud data, or any combination of the foregoing.

In an embodiment, a machine learning tool comprises: a computing system with one or more data processors and memory; a user interface via which information can be output to a user and via which information and data can be input by the user, the data identifying one or more structures, components thereof, or both; a database in which the data are stored; a database management system that communicates with the database to store and retrieve the data in and from the database; and non-transient data processor executable instructions stored in the memory, the instructions comprising one or more pre-trained machine learning models and one or more post-processing algorithms, wherein, the one or more machine learning models are pre-trained to process the data in the database to evaluate performance or design of a structure from images, point cloud data, or three-dimensional representations or drawings thereof, identify components of a structure from an image or point cloud data, identify one or more components of a structure and extract related text from a drawing, identify and assess damage in a structure from an image or point cloud data, or any combination of the foregoing, and the one or more post-processing algorithms comprise, a quantity algorithm, a measurement algorithm, a comparison algorithm, a digital model generation algorithm, or any combination of the foregoing.

In an embodiment, the one or more machine learning models are pre-trained to process the data in the database to evaluate a design of a structure, identify components of a structure, and assess damage in a structure.

In an embodiment, the one or more post-processing algorithms comprise, a quantity algorithm, a measurement algorithm, a comparison algorithm, and a digital model generation algorithm.

In an embodiment, the one or more machine learning models are pre-trained to process the data in the database to evaluate a design of a structure, identify components of a structure, and assess damage in a structure, and the one or more post-processing algorithms comprise, a quantity algorithm, a measurement algorithm, a comparison algorithm, and a digital model generation algorithm.

In an embodiment, the components of a structure include structural components and non-structural components.

In an embodiment, the quantity algorithm sums a number of instances of each class identified by the one or more the machine learning model to provide a total count of identified instances for each class.

In an embodiment, the measurement algorithm comprises the steps of: using computer vision, detecting edges in regions identified by the one or more machine learning models, calculating pixel distances within those regions and converting the pixel distance to another unit of distance specified by the user based on camera properties and its spatial relationship to a structure.

In an embodiment, the comparison algorithm comprises the steps of: comparing information extracted from the one or more machine learning models to a benchmark input by the user, obtained automatically through machine learning analysis of physical drawings, or obtained automatically from a digital drawing or a digital model; and reporting out any deviations between the original machine learning results and the benchmark.

In an embodiment, the digital model generation algorithm comprises using results from the one or more machine learning models to generate two-dimensional digital drawings or a three-dimensional digital model of the identified elements by grouping the pixels or points for each class identified by the one or more machine learning models and converting them into two-dimensional lines or three-dimensional components with the lines being created by reducing the groups of pixels or points down to lines or polylines running through a center of that pixel or point group. Components are created by determining the outer limits of the machine learning identified pixel or point group, determining its dimensions, location and orientation, and generating the appropriate component based on the class, centroid (location), angle (orientation) and dimension information obtained above.

The digital drawing/model could be linked through a cloud platform or through a software plugin.

In an embodiment, A machine learning tool comprises: a computing system with one or more data processors and memory storing data processor executable instructions; a user interface via which information can be output to a user and via which information and data can be input by the user; a database in which the data is stored; a database management system that communicates with the database to store and retrieve the data in and from the database; and the data processor executable instructions stored in the memory, wherein, the data processor executable instructions effect the steps of: processing the data using pre-trained machine learning models and evaluate a design of a structure, identify components of a structure, assess damage in a structure, or any combination of the foregoing, and process results from the prior step by invoking a quantity algorithm, a measurement algorithm, a comparison algorithm, a digital model generation algorithm, or any combination of the foregoing.

In an embodiment, machine learning is used to analyze raw data uploaded by the user to evaluate the design of a structure, identify components and/or assess damage due to deterioration, change of properties or a destructive event.

In another embodiment the machine learning analyzed data is used to determine quantities and/or measurements.

In another embodiment, the machine learning analyzed data is used to automatically generate a digital model of the structure.

In another embodiment, the machine learning analyzed data is compared against a benchmark in the form of specified tolerances, 2D drawings, a 3D digital model or the like.

In another embodiment, the results obtained from the invention can be displayed and exported in various formats.

These and other aspects and features are described below in greater detail.

BRIEF DESCRIPTION OF THE DRAWINGS

The accompanying drawings, which are incorporated in and constitute a part of this specification, illustrate an implementation of the present invention(s) and, together with the description, serve to explain the advantages and principles of the invention(s). In the drawings:

FIGS. 8A, 8A-1, 8A-2, 8A-3, 8B, 8B-1, 8B-2, 9A, 9B, 9C, 9D, 9E, 9F, 9G, 9H, 9I, 9J, 9K, 9L, 10A, 10B, 10C, 10D, 10E, 10F, 10G, 10H, 10I, 10J, 10K, 10L, 10M, 10N, and 10N-1-10N-5 illustrate various applications and results that have been obtained from a machine learning tool such as the machine learning tool for structures of FIGS. 2 and 3.

FIGS. 20B to 21F are images useful in describing the steps of FIG. 20A.

FIGS. 21B to 21K illustrate are images useful in describing the steps of FIG. 21A.

FIG. 23B is an image useful for explaining the steps of FIG. 23A.

DETAILED DESCRIPTION

While various embodiments of the present invention(s) are described herein, it will be apparent to those of skill in the art that many more embodiments and implementations are possible that are within the scope of the invention(s). Accordingly, the present invention(s) is/are not to be restricted except in light of the attached claims and their equivalents.

Described herein is a machine learning tool for structures that can be used to (1) design structures, (2) verify construction and/or (3) assess damage due to deterioration, change of properties or a destructive event, among other things. The traditional processes that occur over the course of a structure's life, from design to construction to operation and maintenance, are generally manual, inefficient and leave room for error. In accordance with principles disclosed herein, machine learning can be incorporated into these processes to automate them, improve their efficiency and reduce error.

In accordance with principles disclosed herein, machine learning models can be used to evaluate performance of a structure from drawings thereof (e.g. under different wind loads or seismic events), identify components of a structure from an image, identify components of a structure from a drawing, identify and assess damage in a structure from an image, or any combination of the foregoing. The raw data can be photos, renderings, hand or digital drawings, point cloud data or the like. The machine learning tool for structures can compute quantities and measurements related to these items. The machine learning tool for structures can compare the items as well as quantities and/or measurements against an appropriate benchmark. The benchmark can be obtained through drawings, digital models or other formats.

FIGS. 1 to 7 are diagrams illustrating the processes and architecture of the machine learning tool for structures. Reference is also made to FIGS. 11-19 to understand how a user interacts with the machine learning tool. The user interface shown in FIGS. 11-19 is provided as an example. The machine learning tool for structures' user interface may differ from the one shown in these figures.

Figure 1:
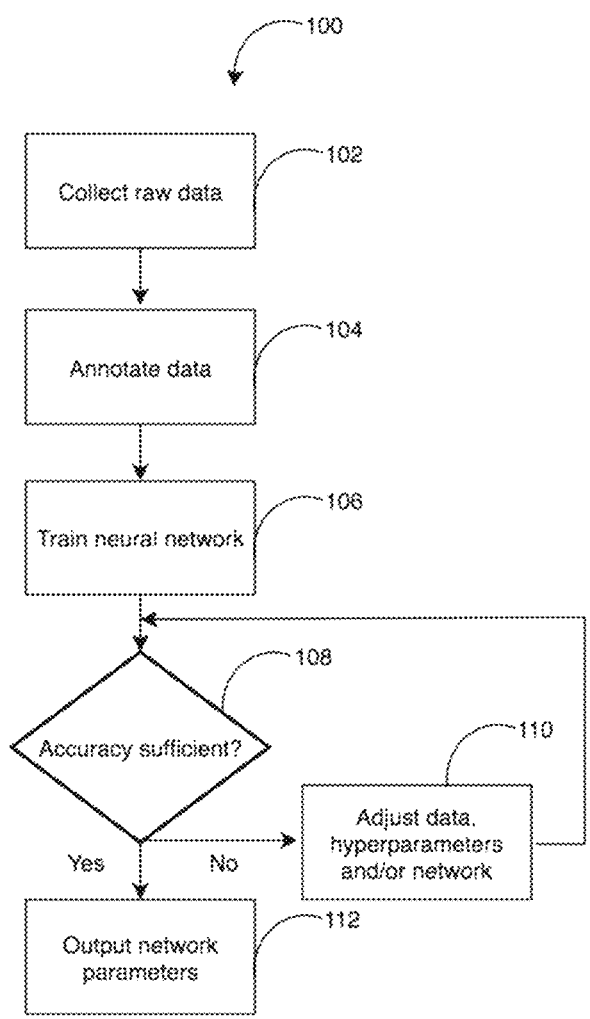
FIG. 1 depicts a flow chart showing the process for training machine learning models in accordance with principles disclosed herein.

FIG. 1 depicts a flow chart showing the process for training the machine learning algorithms to create the machine learning models for the present machine learning tool for structures. To start, the raw data is collected in step 102. As noted above, the raw data can be in various forms including photographs, renderings, hand or digital drawings, point cloud data or the like. The photographs can be obtained at eye level and/or using above head drones. Preferably, the raw data is image data relating to structures or components thereof. The photographs can be obtained through digital cameras, digital single-lens reflex (DSLR) cameras, cell phone cameras, drones, satellite imagery, point cloud data, scanned documents or other means. The point cloud data can be obtained through 3D laser scanning or other means. The raw data is electronically annotated in step 104 by assigning overall, object-, pixel- or point-level annotations depending on whether classification, object detection, segmentation or other machine learning techniques are to be used.

Figure 9A:
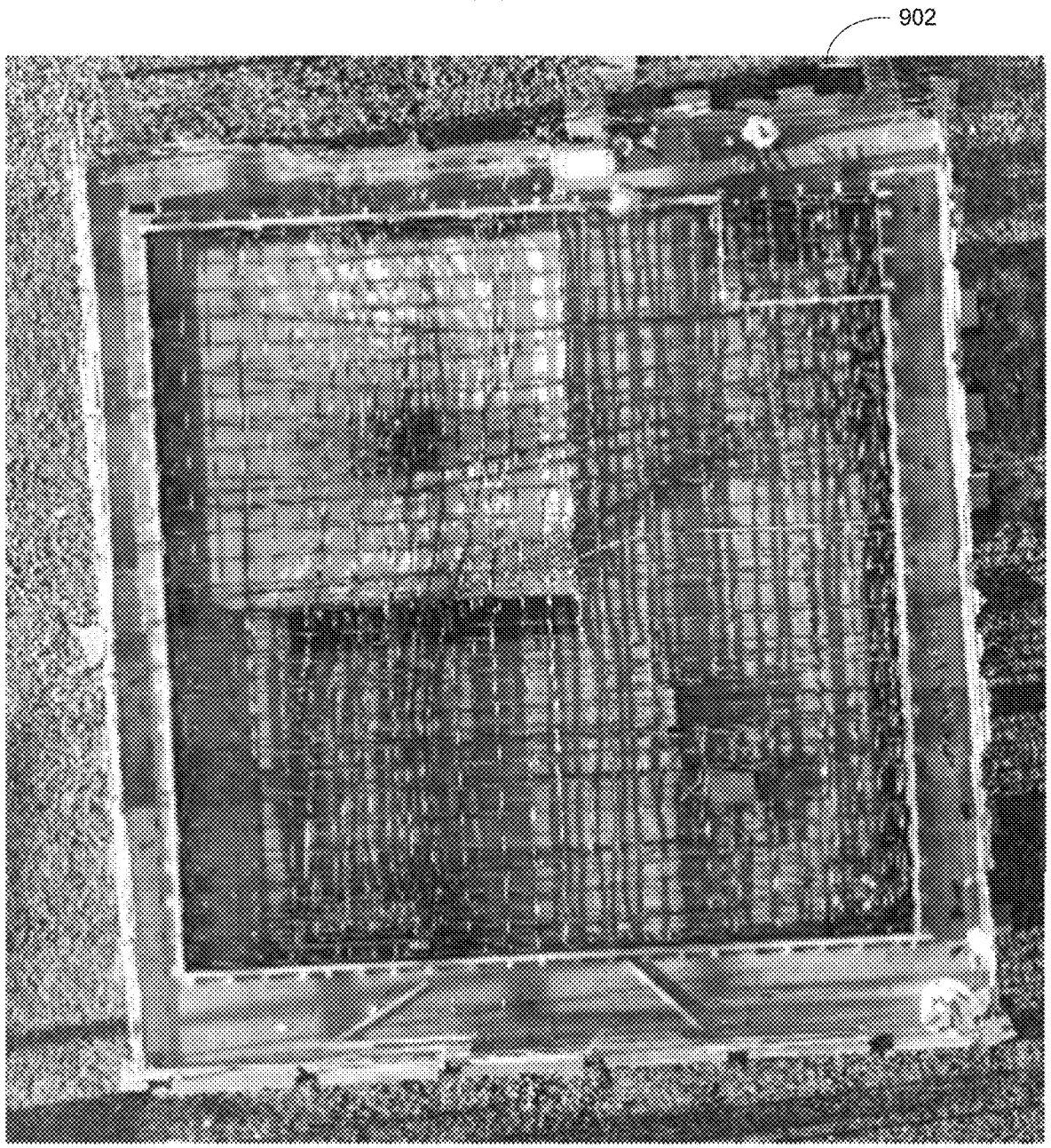
Figure 9B:
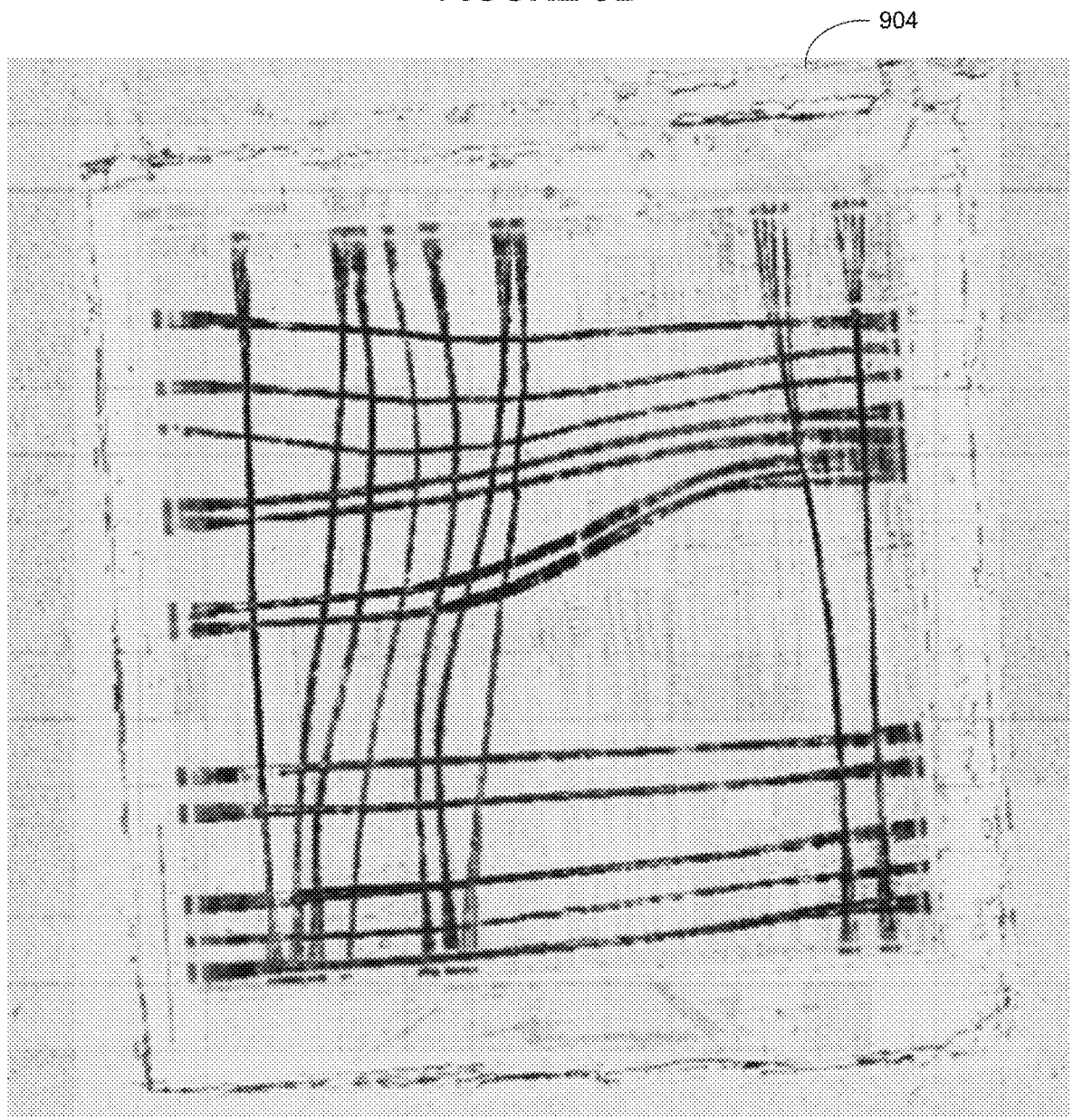
Figure 9C:
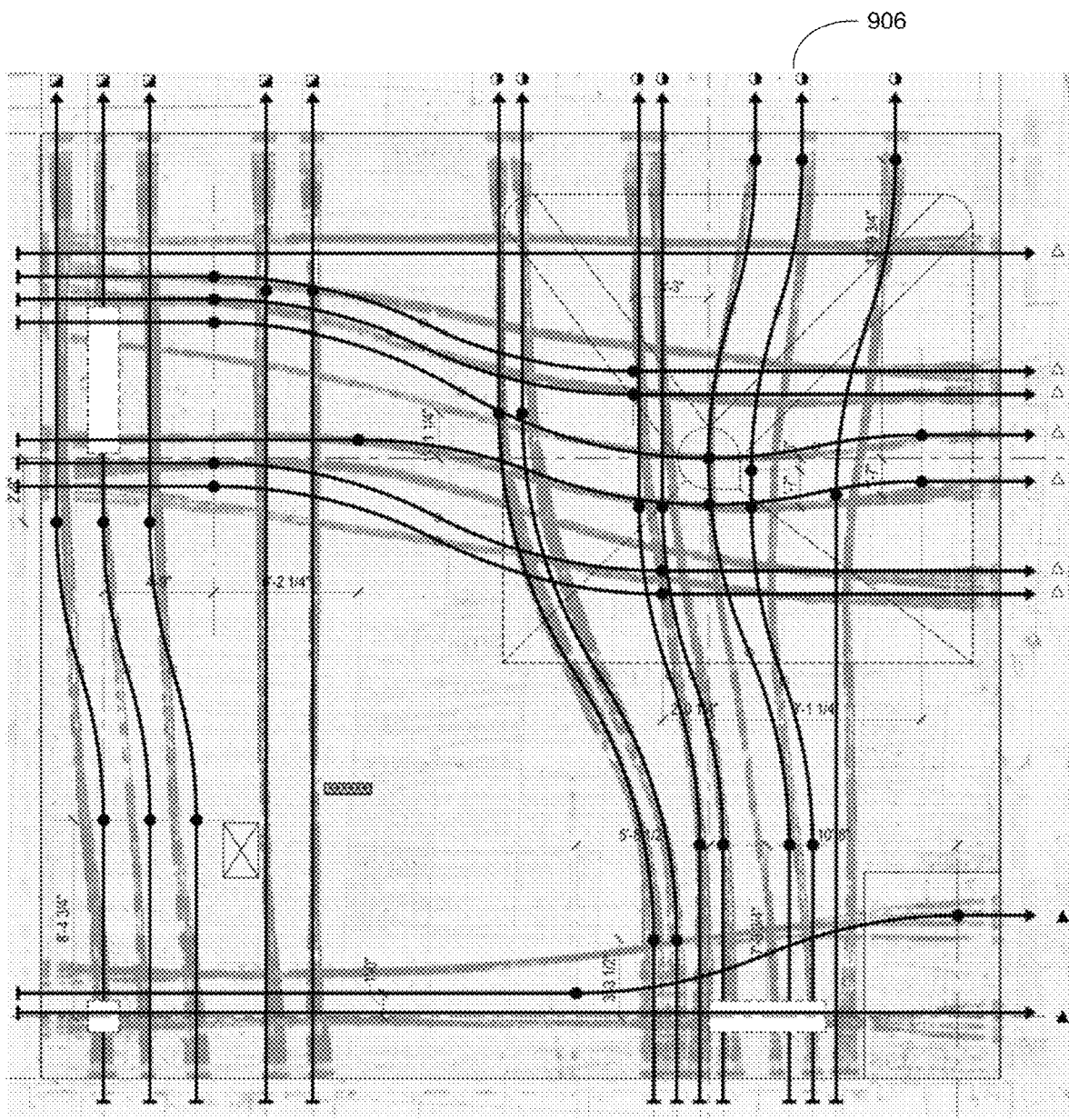
Figure 9D:
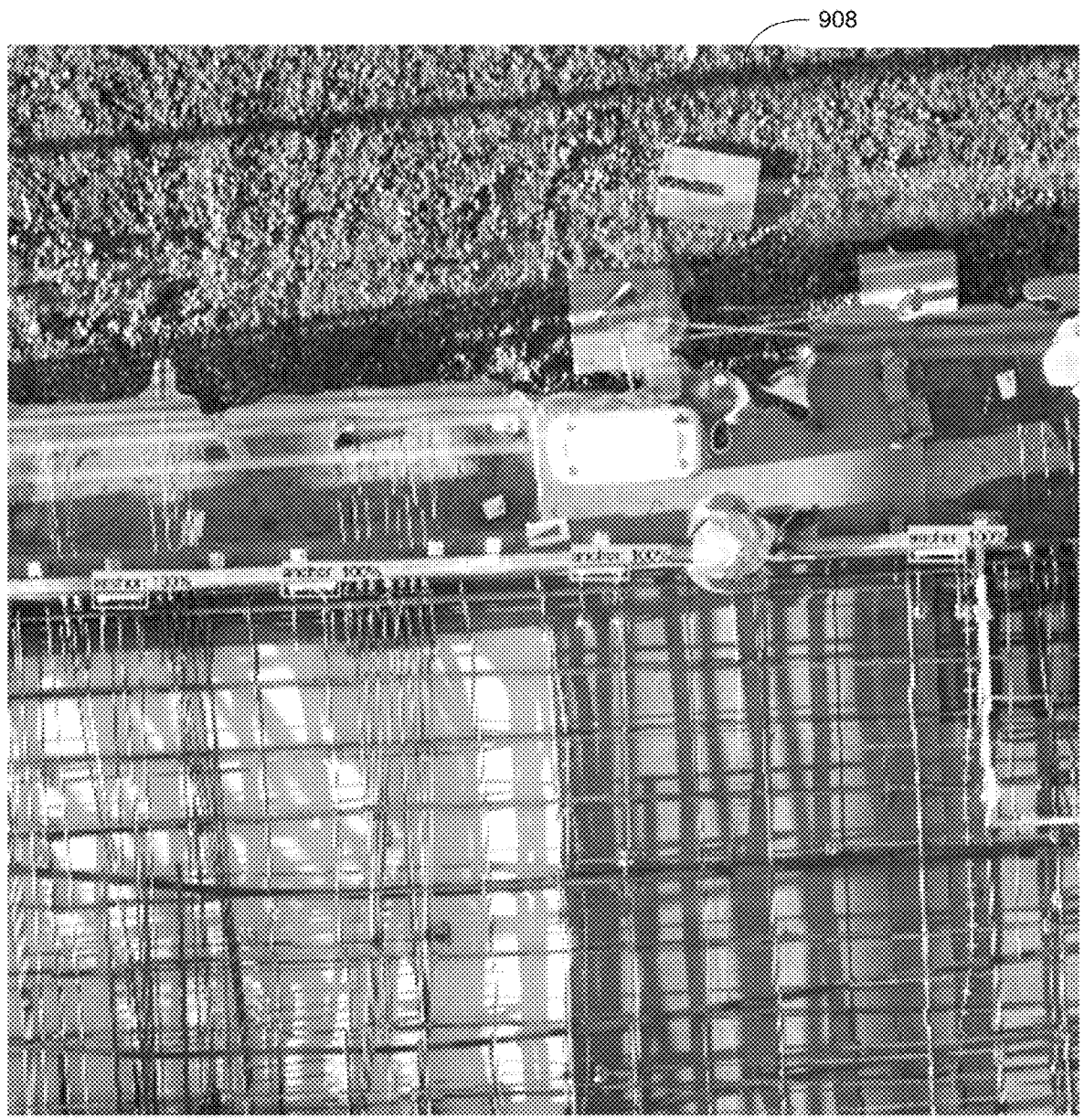
Figure 9E:
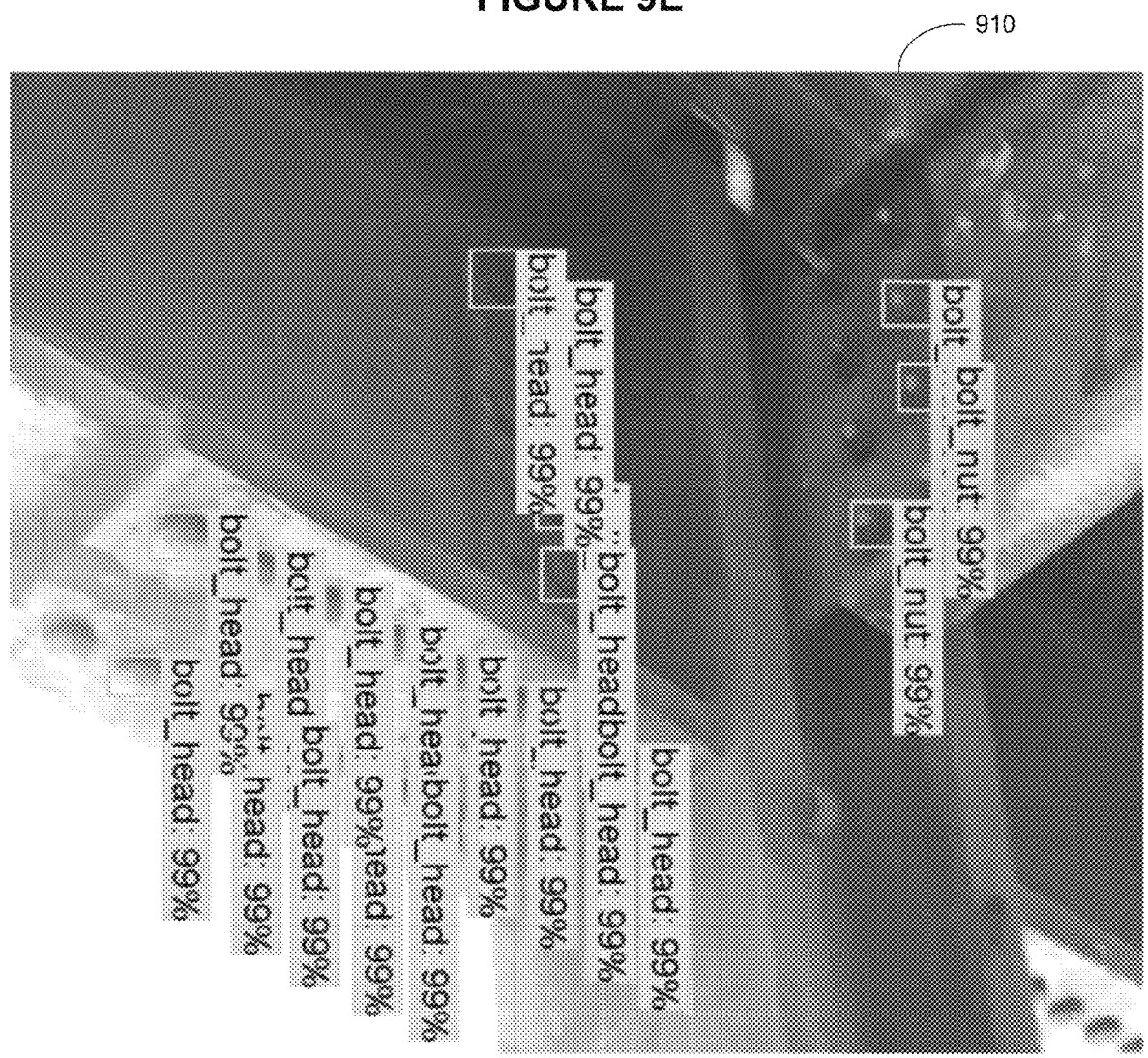
Figure 9F:
Figure 9G:
Figure 9H:
Figure 9I:
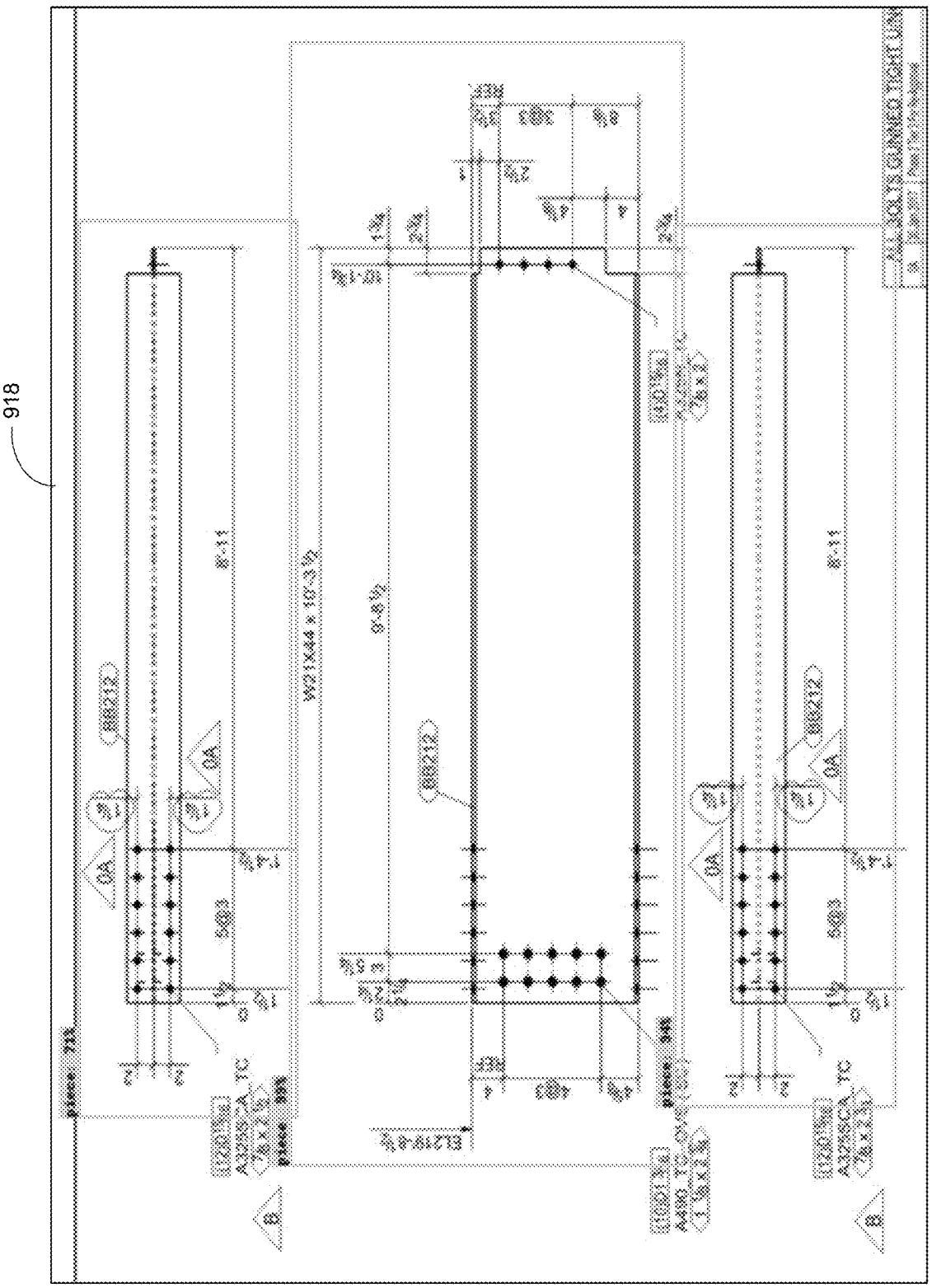
Figure 9J:
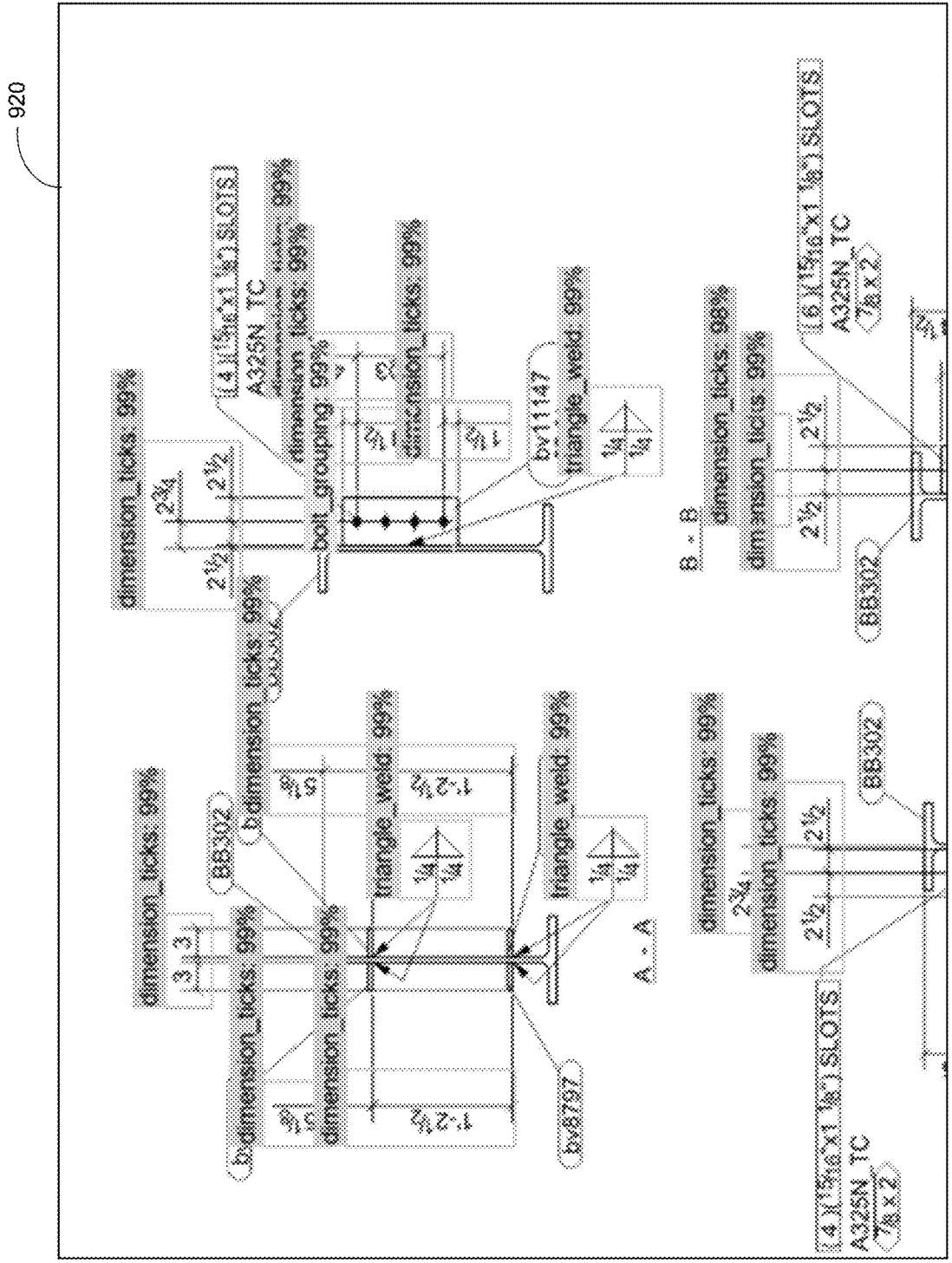
Figure 9K:
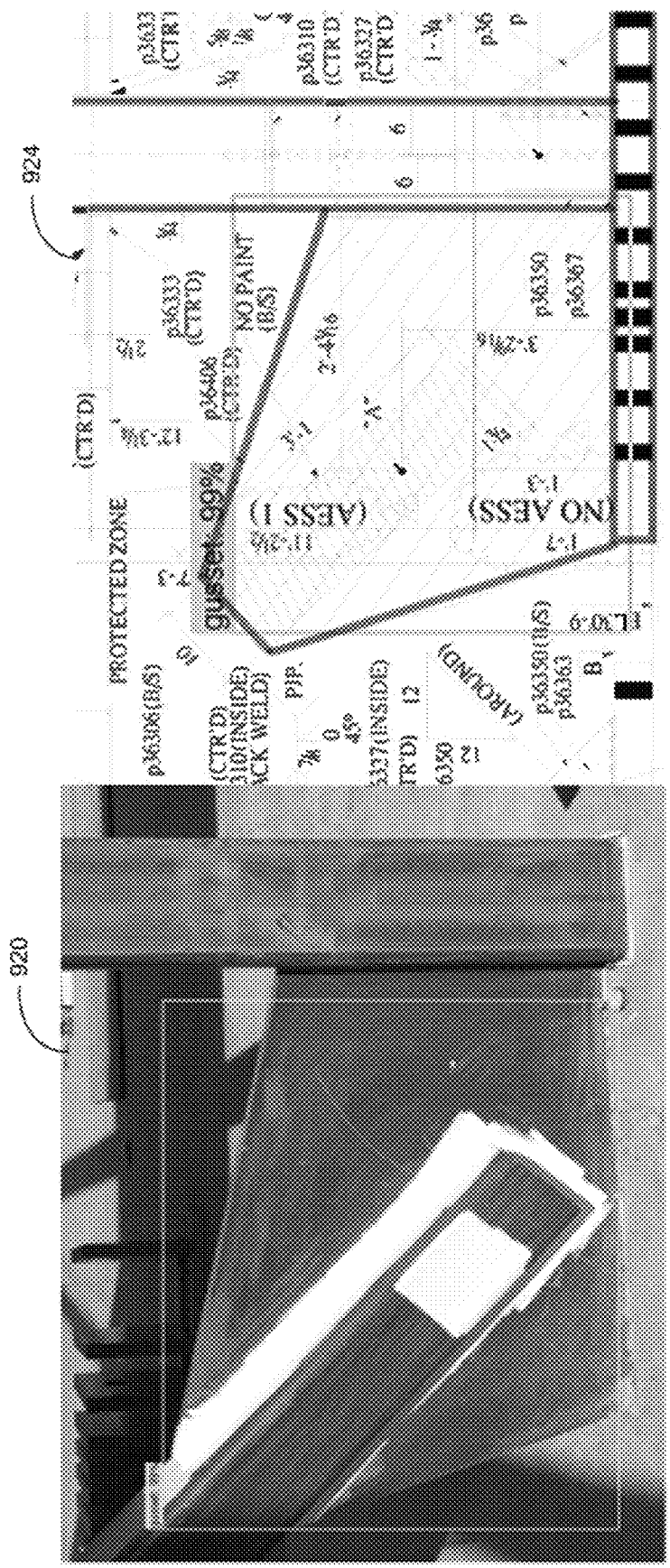
Figure 10A:
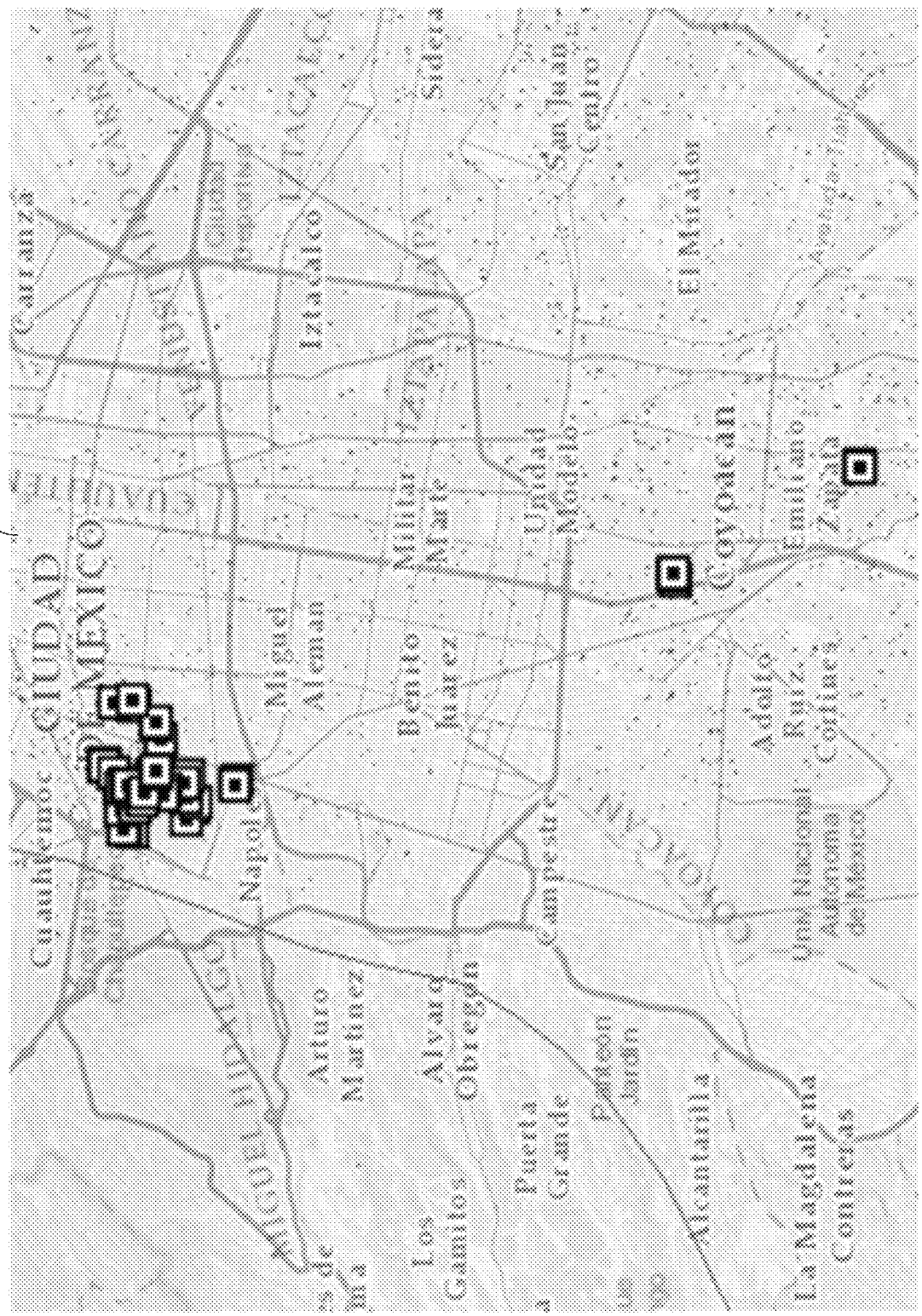
Figure 10B:
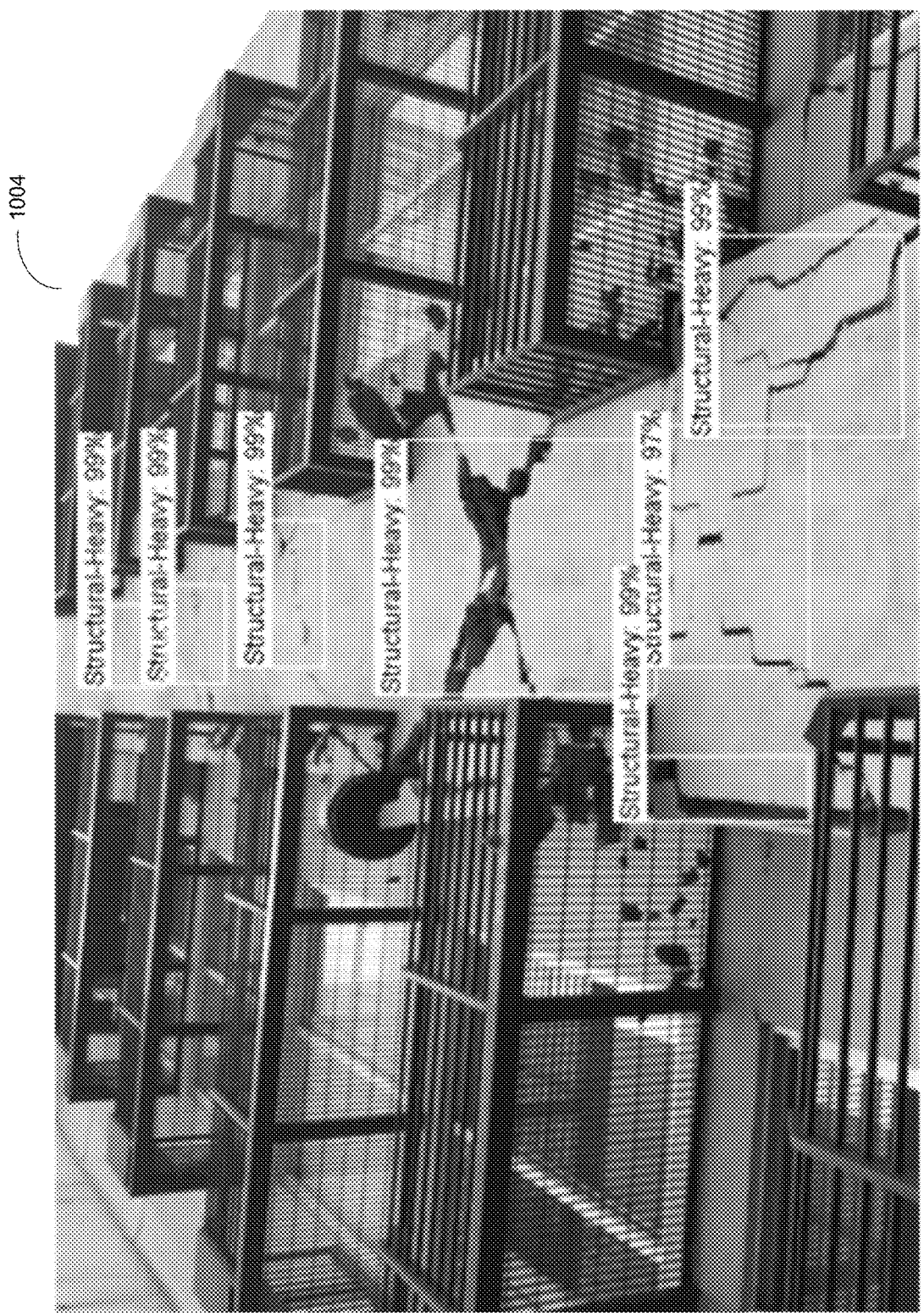
Figure 10C:
Figure 10D:
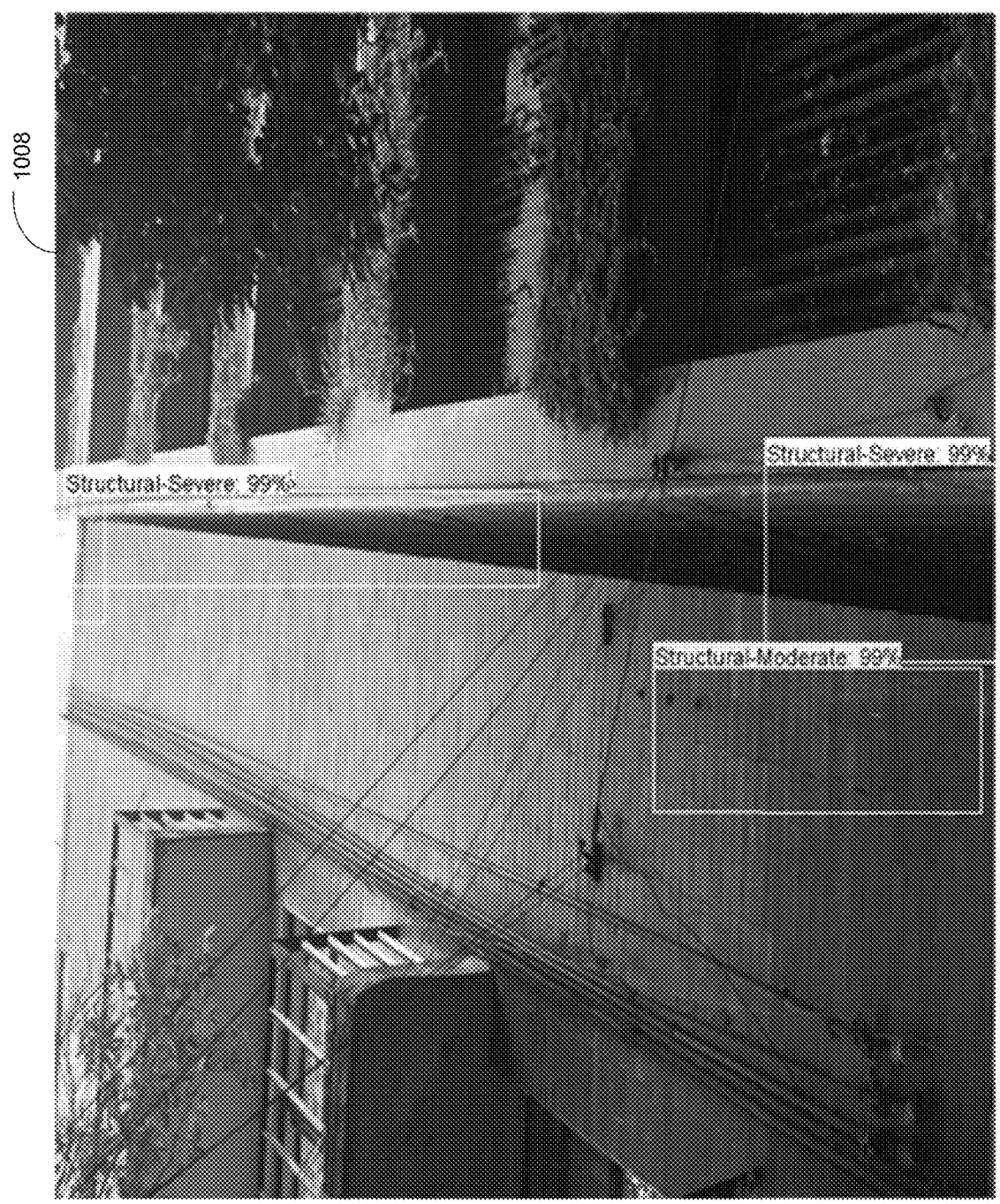
Figure 10H:
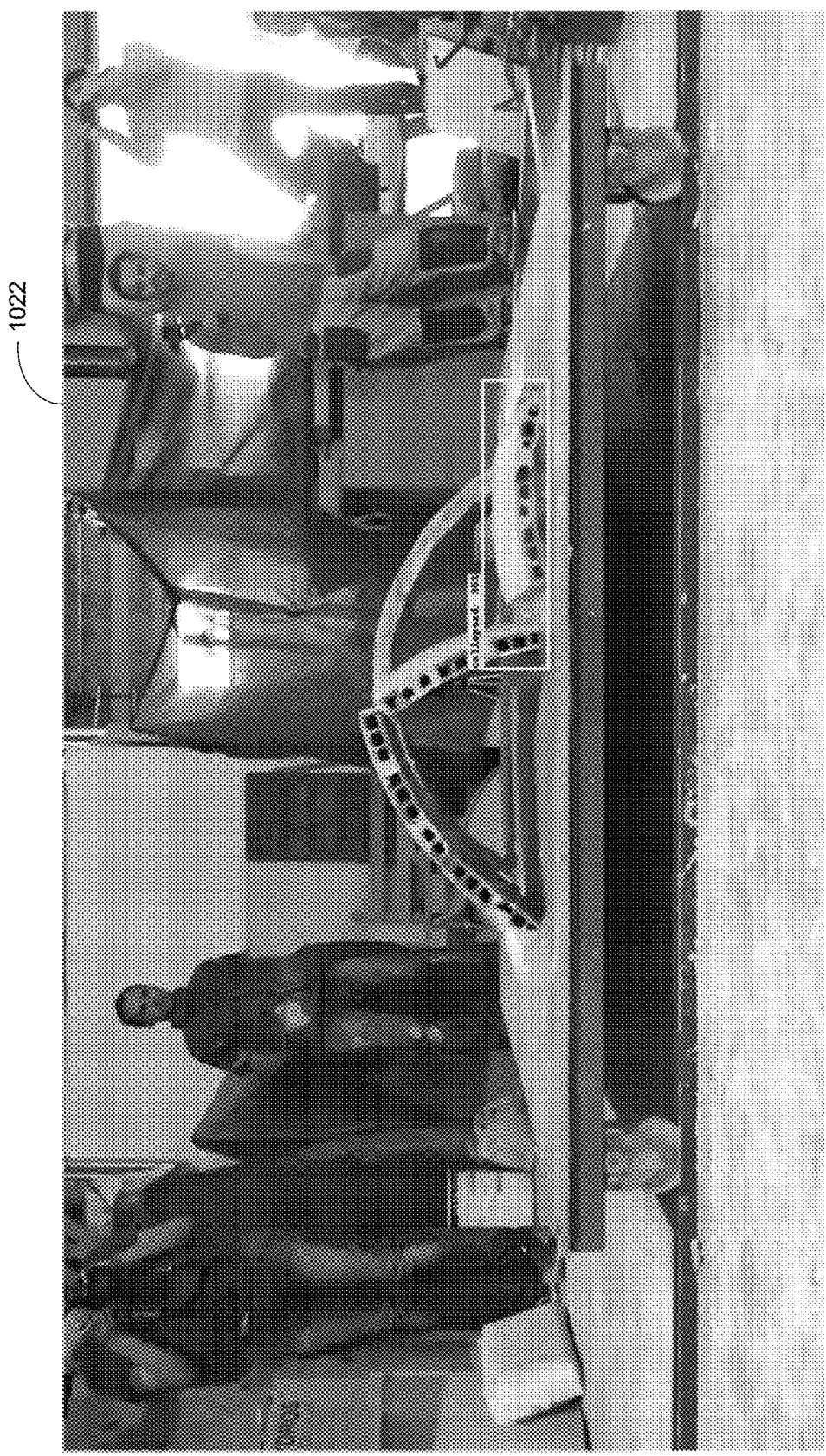
Figure 10I:
Figure 10J:
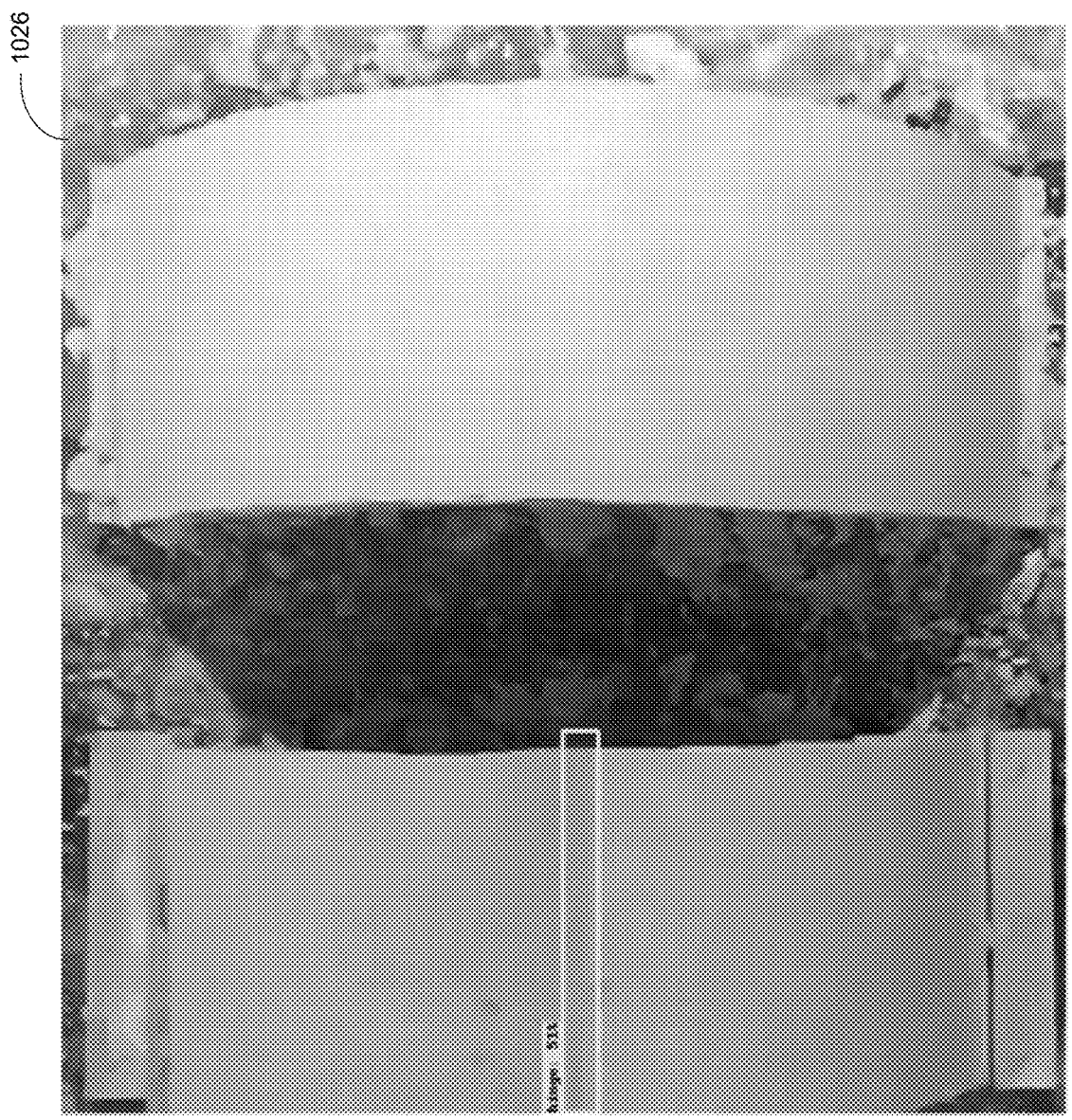
Figure 10K:
Figure 10L:

In step 106, the annotated data are used as inputs to train an existing neural network or other type of machine learning algorithm. References to neural networks in this disclosure include deep neural networks. Some common machine learning algorithms are Nearest Neighbor, Naïve Bayes, Decision Trees, Linear Regression, support Vector Machines, and Neural Networks. Such machine learning algorithms and how to train them, are well known although different vendors or suppliers may only support a subset of them. For example, Amazon Corporation's Amazon Machine Learning (Amazon ML) currently only supports three types of algorithms: binary classification, class classification, and regression. Google's open source TensorFlow machine learning framework was utilized to train open source neural networks or other types of machine learning algorithms in connection with the development of the present machine learning tool for structures. Different machine learning frameworks may also be incorporated into this invention. Examples of the open source neural networks used are YOLO, Faster R-CNN, DeepLabV2, ResNet-101, PointNet and PointNet++. These neural networks, described in the References section below, can be pre-trained on other datasets, such as the open source COCO dataset, prior to training on the data processed in step 104 to improve their accuracy. To reduce computation time, high-resolution files can be subdivided into multiple pieces, which are used as separate inputs for the neural network. The neural network outputs can then be recombined into the original format. As described in more detail below, a sample of an analyzed sub-image detecting shear studs is shown in image 914 of FIG. 9G and a sample of a recombined photo is shown in image 916 of FIG. 9H.

In step 108, the neural network's accuracy is evaluated by comparing the machine learning predictions to the annotated data. If the accuracy is insufficient, it can be improved in step 110 by increasing the quality (e.g. by using more consistent images, using better lighting conditions, using better focus, avoiding obstacles, etc.) and/or quantity of the input data, improving annotations (e.g. by making the annotations more precise, consistent, etc.), varying some or all of the network hyperparameters (e.g. epochs, iterations, batch size, learning rate, dropout, decay rate, etc.), and/or varying the network itself. If the accuracy is sufficient, the neural network parameters are output in step 112. The networks and outputted parameters are incorporated into the machine learning tool for structures 208 as machine learning models 308 for use in analyzing new, raw data. Over time, new data can be added to the original dataset and can be used to develop new machine learning models by retraining existing networks. The machine learning models can also be updated with new and improved neural networks as they are created. New machine learning techniques can also be incorporated into the invention as they are created.

Figure 2:
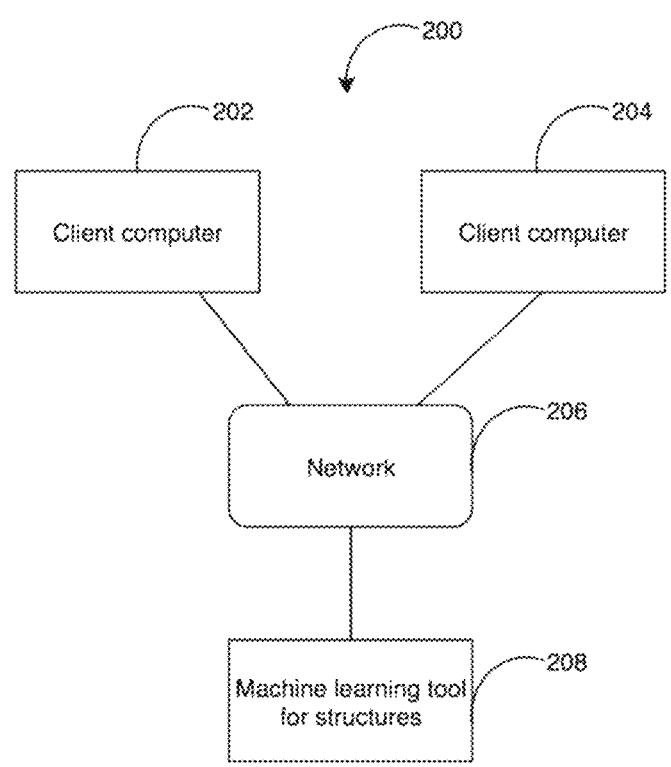
FIG. 2 depicts a block diagram showing a connection between a machine learning tool for structures employing principles disclosed herein and client computers through a network.

FIG. 2 depicts a block diagram showing a data processing system 200 comprised of a plurality of client computers 202 and 204 and a machine learning tool for structures 208 connected via a network 206. The machine learning tool for structures 208 is a specially configured computer or computer system, as described herein. The network 206 is of a type that is suitable for connecting the computers 202, 204, and 208 for communication, such as a circuit-switched network or a packet-switched network. Also, the network 206 may include a number of different networks, such as a local area network, a wide area network such as the Internet, telephone networks including telephone networks with dedicated communication links, connection-less network, and wireless networks. In the illustrative example shown in FIG. 2, the network 206 is the Internet. Each of the computers 202, 204, and 208 shown in FIG. 2 is connected to the network 206 via a suitable communication link, such as a dedicated communication line or a wireless communication link. Users can upload raw data to the machine learning tool for structures 208, analyze the data as well as view and export the results through the network connection.

Figure 3:
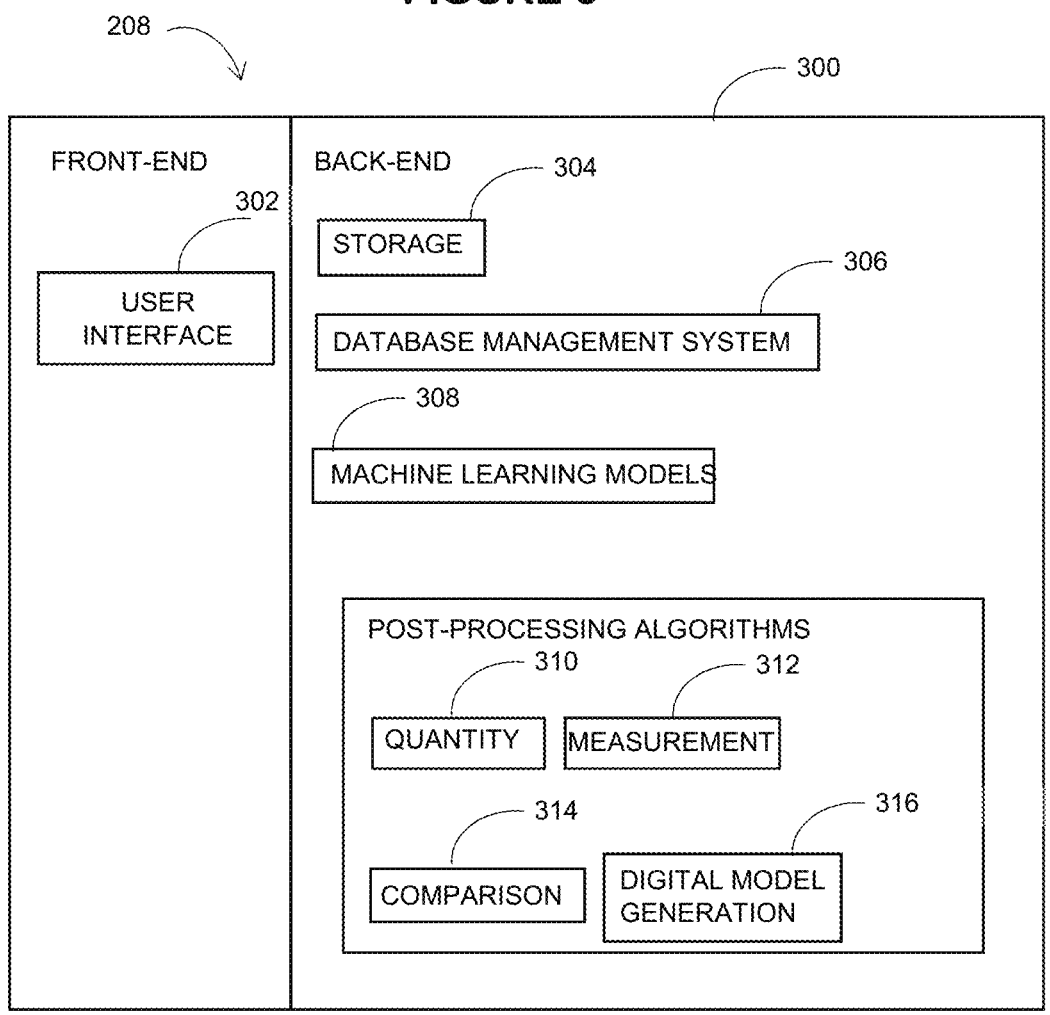
FIG. 3 depicts a block diagram illustrating different components comprising the machine learning tool for structures of FIG. 2.

FIG. 3 shows different components comprising the machine learning tool for structures 208 embodying principles of the invention. The machine learning tool for structures 208 is a specially configured computer system 300 comprised of a single computer or group of computers with one or more data processors (not shown) for executing non-transient data processor readable instructions as well as related memory (not shown) in which the instructions are stored. The system 300 may reside in a Cloud network.

On a front-end, a user interface 302 enables displays of options and results for a user or a client device such as a client computer. The front-end may also include a display and known input devices (e.g., a keyboard, mouse, or communications port, such as a USB port or a wireless communications means), or the options and results information may be communicated to a client computer with its own input devices and display. On a back-end, a storage component 304 stores a database which includes information necessary to the proper functioning of the machine learning tool for structures 208. The storage component can be any suitable storage device such as random access memory, a solid state drive, a magnetic disk drive, a magnetic tape drive, etc. A database server 306 communicates with the database 304. The database server 304 is a software product with the primary function of storing and retrieving data as requested by other software applications—which may run either on the same computer/platform or on another computer/platform across a network (including the Internet). SQL Server, a relational database management system developed by Microsoft Corporation is suitable as the database 304.

The back-end also includes various machine learning models 308 and post-processing algorithms or modules which are used to analyze the user data and results. The machine learning models incorporated into the tool 208 are neural networks that have been pretrained for specific purposes following the process outlined in FIG. 1 (e.g. to classify the design of a structure, such as its expected building performance under wind loads, to identify structural and non-structural components from photos or point cloud data, to identify components and subcomponents from drawings, to identify and classify damage, etc.).

The post-processing algorithms include, but are not limited to, a quantity algorithm 310, a measurement algorithm 312, a comparison algorithm 314 and a digital model generation algorithm 316. These algorithms are explained in in greater detail below in the section under the heading: Algorithms, although they are also discussed in connection with FIGS. 5-7.

The quantity algorithm/module 310 sums the number of instances of each class identified by the machine learning model(s) to provide a total count of identified instances for each class (e.g. total shear stud count in each image). The measurement algorithm/module 312 uses classical computer vision techniques to detect edges in the regions identified by the machine learning model, calculates pixel distance within those regions and converts the pixel distance to another unit of distance specified by the user based on known/inputted information about the camera properties and location/angle. The comparison algorithm/module 314 compares information extracted from the machine learning models to a benchmark obtained manually from information input by the user, obtained automatically through machine learning analysis of physical drawings, or obtained automatically from a digital drawing/model. The digital drawing/model can be in vector graphic format, any computer-aided design (CAD) format, any three-dimensional modeling or Building Information Modeling (BIM) software program (such as Revit, AutoCAD 3D, Tekla, Rhino) format or the like. Any deviations between the original machine learning results and the benchmark are reported. Comparisons may be based on any suitable criterion, including location, quantity, measurements or the like. In the case of comparing quantities or measurements, the quantity or measurement algorithms 310 and 312 may first be utilized. The machine learning results may first be converted to a digital model format using the digital model generation algorithm/module 316.

The digital model generation algorithm 316 uses the machine learning model results to generate two-dimensional digital drawings or a three-dimensional digital model of the identified elements. The digital drawing/model can be in vector graphic format, any computer-aided design (CAD) format, any three-dimensional modeling or Building Information Modeling (BIM) software program (such as Revit, AutoCAD 3D, Tekla, Rhino) format or the like. The digital drawings or model are generated by grouping the pixels or points identified by the machine learning models for each class and converting them into two-dimensional lines or three-dimensional components. Lines are created by reducing the groups of pixels or points down to lines or polylines running through the center of that pixel or point group. Components are created by determining the outer limits of the machine learning identified pixel or point group, determining its dimensions, location and orientation, and generating the appropriate component based on the class, centroid (location), angle (orientation) and dimension information obtained above. The machine learning models and post-processing algorithms can also be employed on their own, separate from the architecture illustrated in FIG. 3. They can be employed either individually or in combination with each other.

Figure 4A:
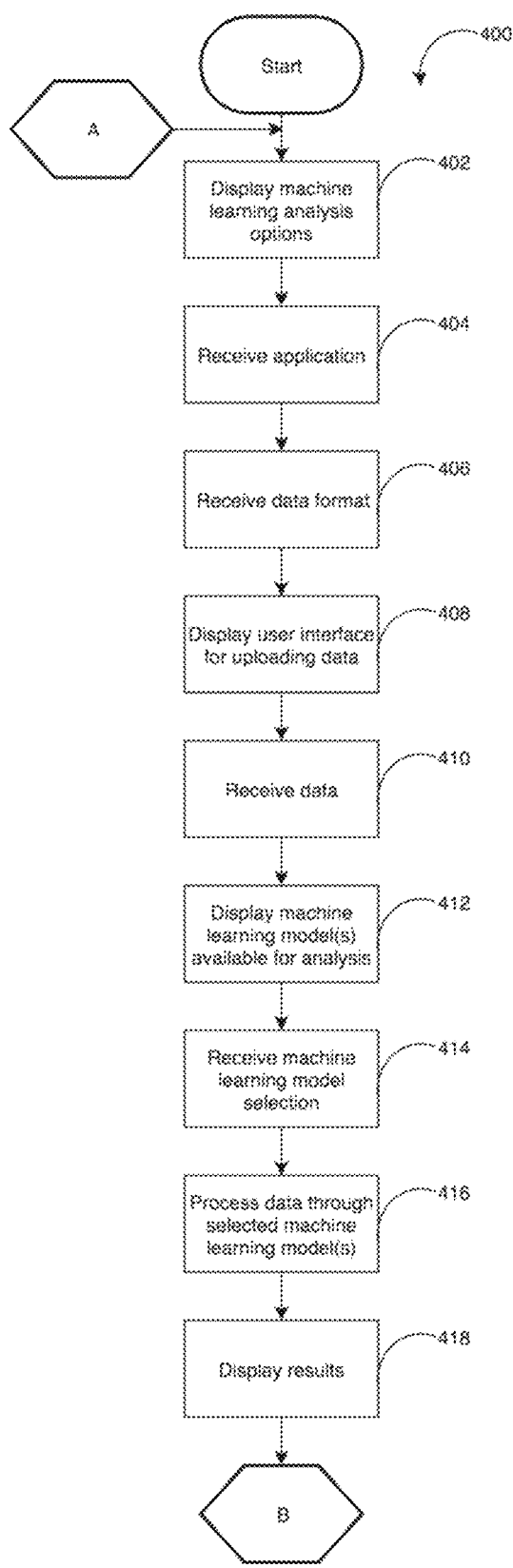
FIGS. 4A, 4B and 4C depict a flow chart illustrating exemplary steps by the machine learning tool for structures of FIGS. 2 and 3 for processing a data, determining quantities and/or measurements, generating a digital model, comparing results against a benchmark and exporting the results.
Figure 4B:
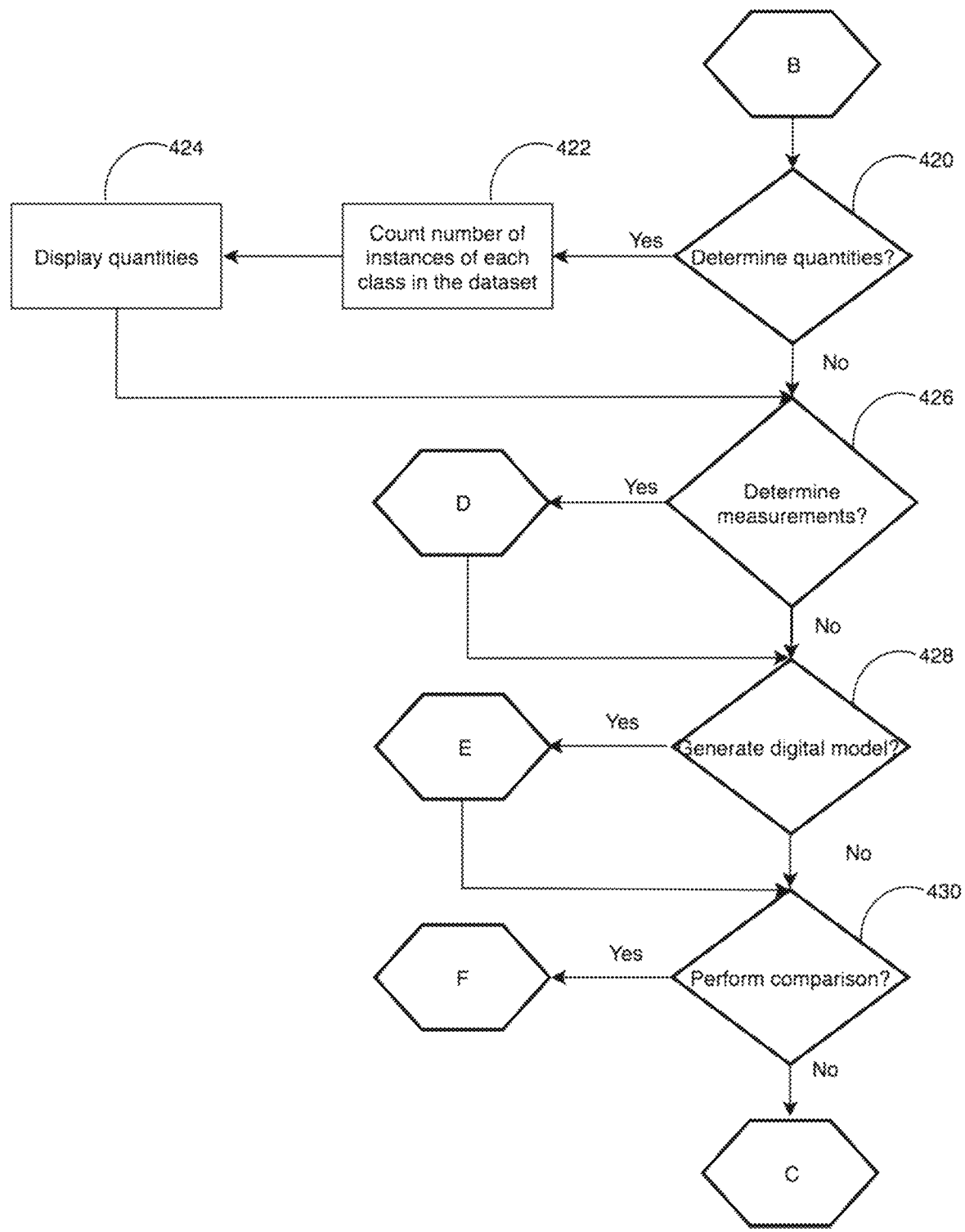
Figure 4C:
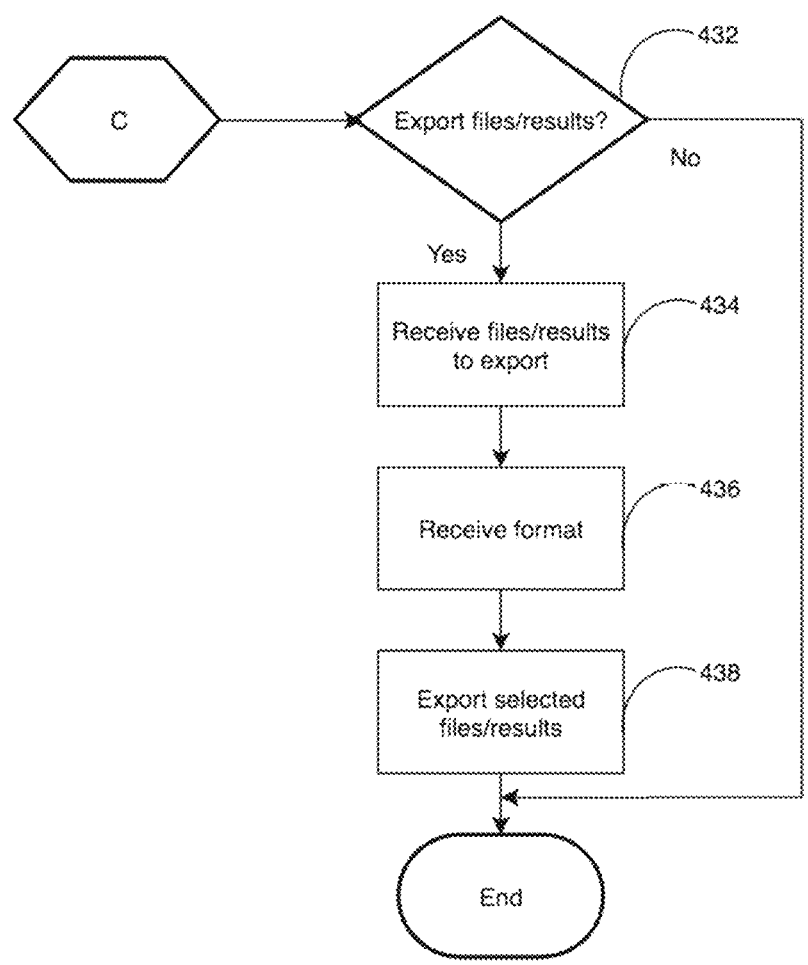
Figure 11:
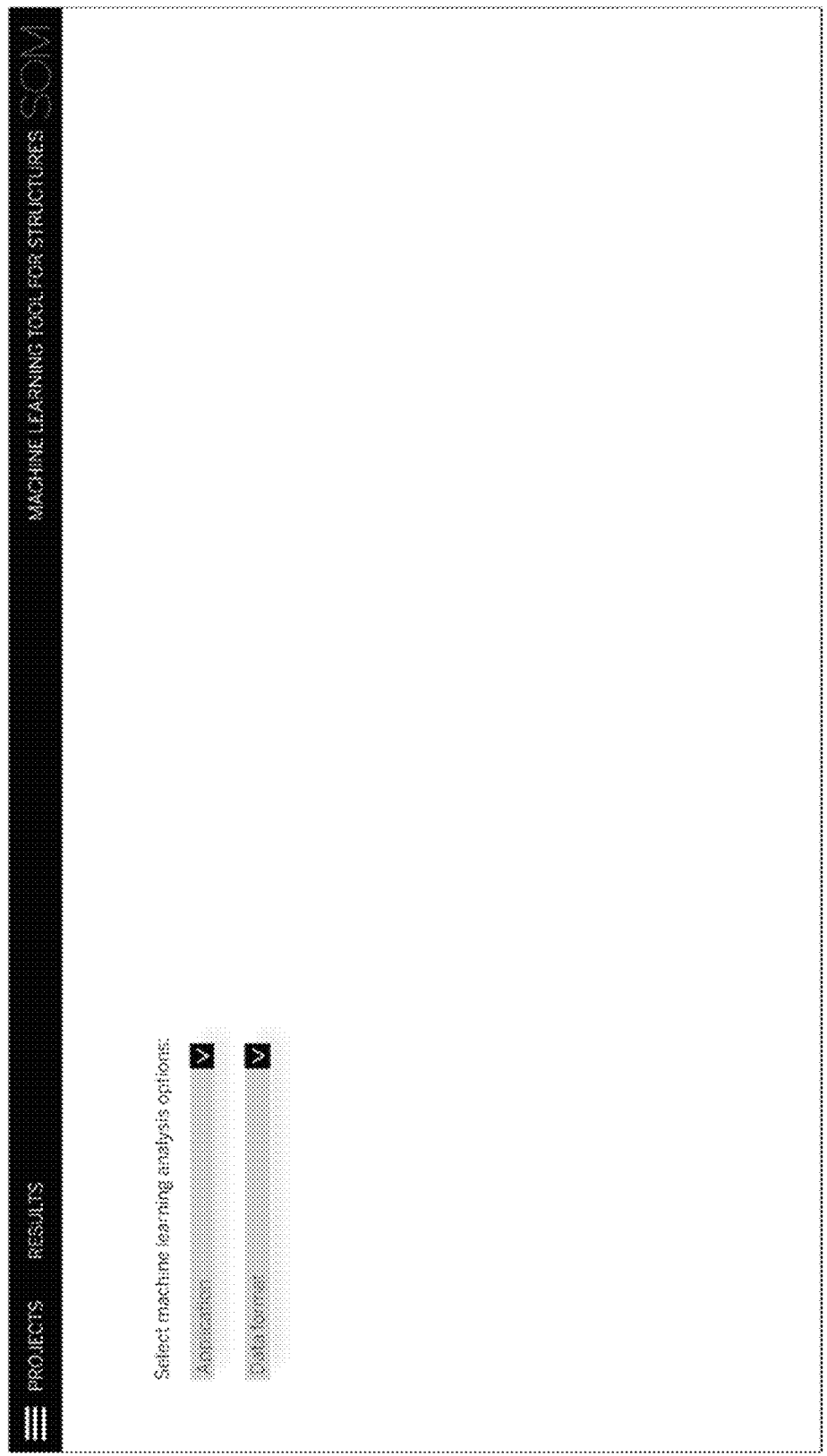
FIGS. 11-19, show screen shots from a user interface at various steps during use of the machine learning tool for structures.
Figure 12:
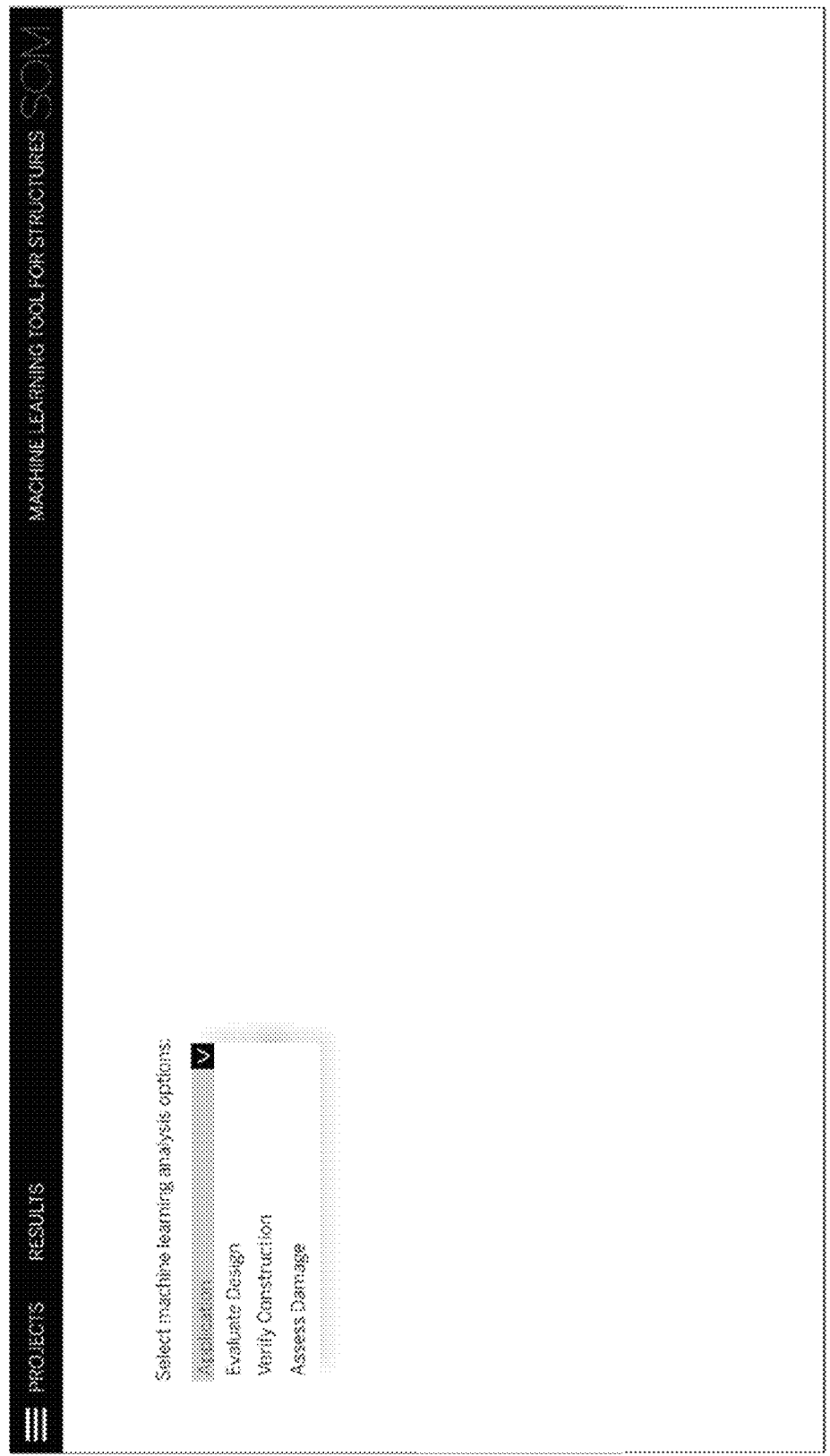
Figure 13:
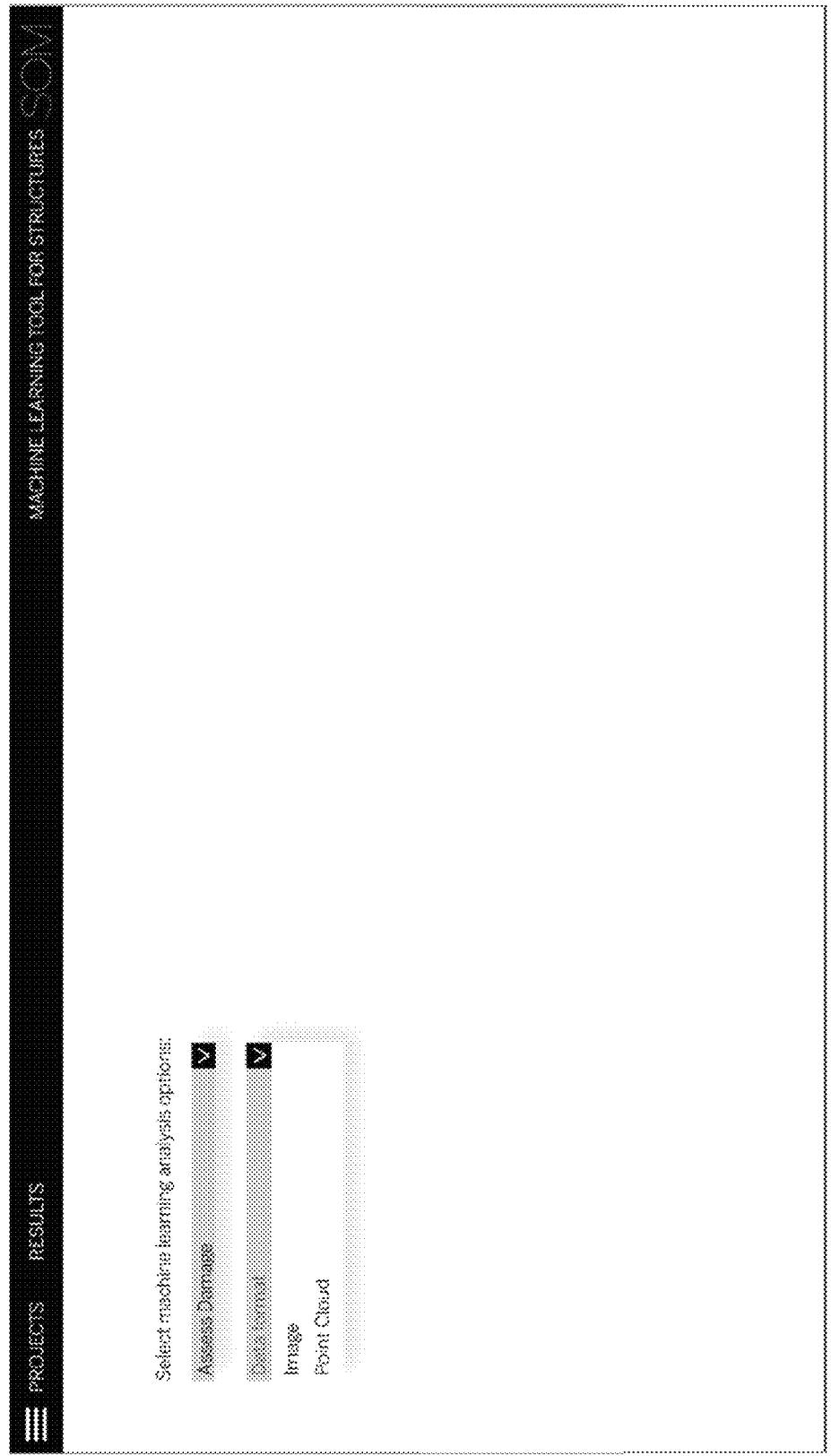

FIGS. 4A, 4B, and 4C depict a flow chart illustrating exemplary steps 400 by the machine learning tool for structures 208 for processing the raw data (input at A), determining quantities and/or measurements, generating a digital model, comparing results against a benchmark and exporting the results. In step 402, the user interface 302 causes the display of the different machine learning analysis options for the user, including the application and the data format. The application can include but is not limited to evaluating the design, identifying components (e.g., to verify construction), and identifying damage. In some cases, data in point cloud format can be pre-processed using CloudCompare, an open source software for the processing of point cloud and mesh models. The noted steps are effected by data processor executable instructions or software FIG. 11 shows a screen shot of an initial display of the user interface 302, with menu selections for Application and Data format. FIG. 12, shows a screen shot of a display of the user interface 302 with the drop down menu for Application selected. FIG. 13, shows a screen shot of a display of the user interface in which the Application "Assess Damage" has been selected, and the drop down menu for Data format has been selected. These applications and data format options are exemplary for this particular tool but other applications and data formats could be included or some of those listed could be omitted.

Figure 14:
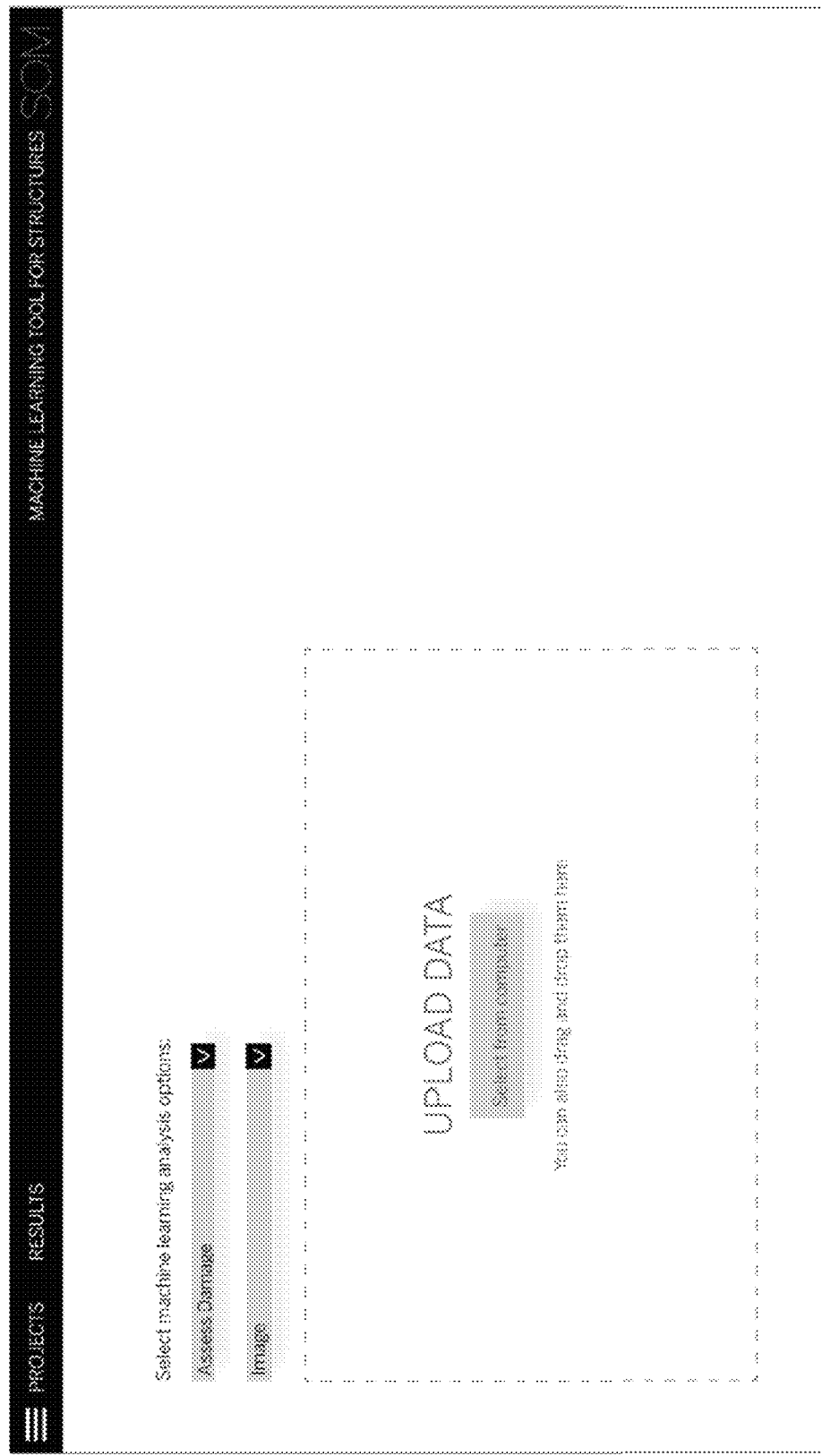
Figure 15:
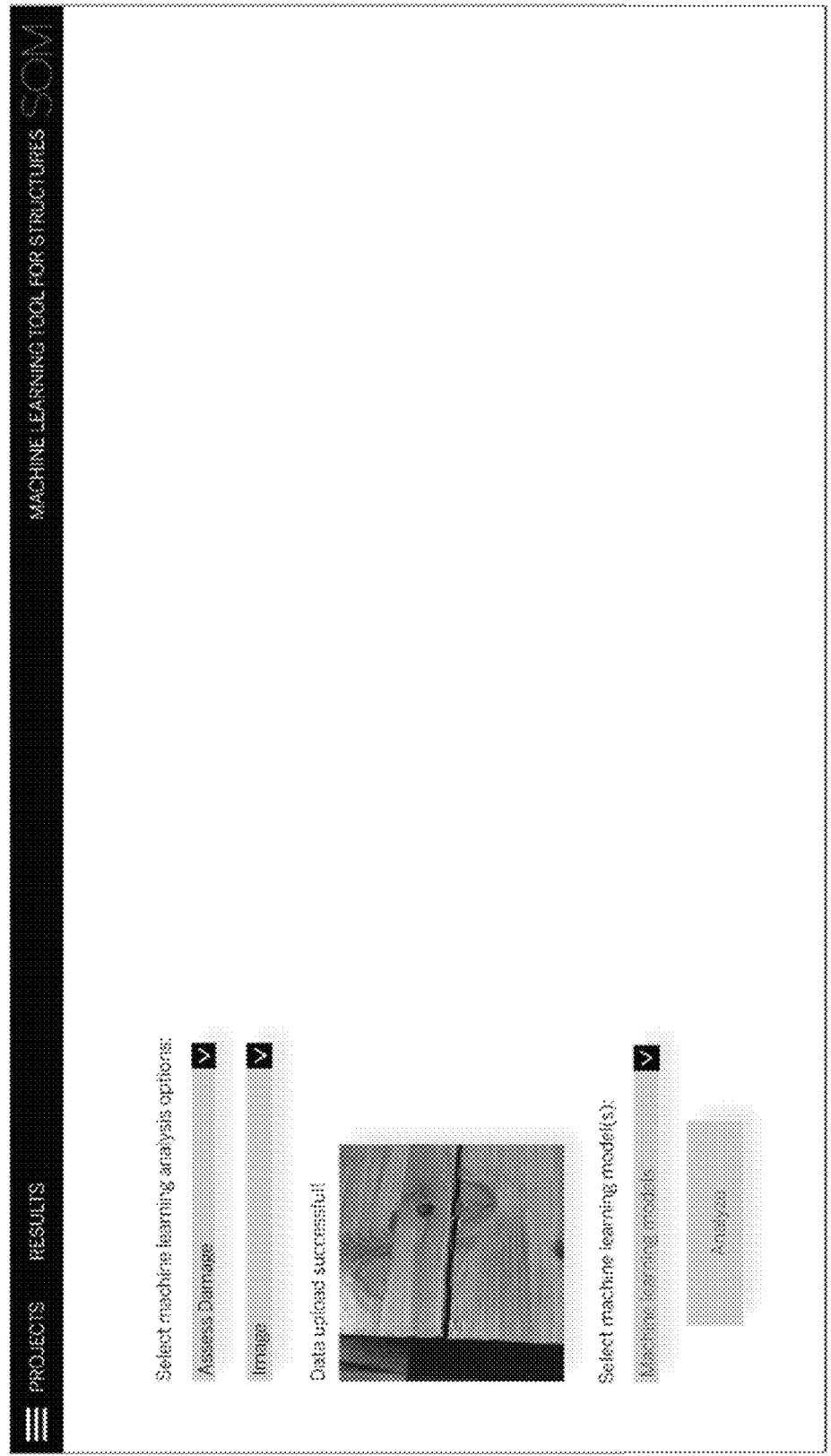
Figure 16:
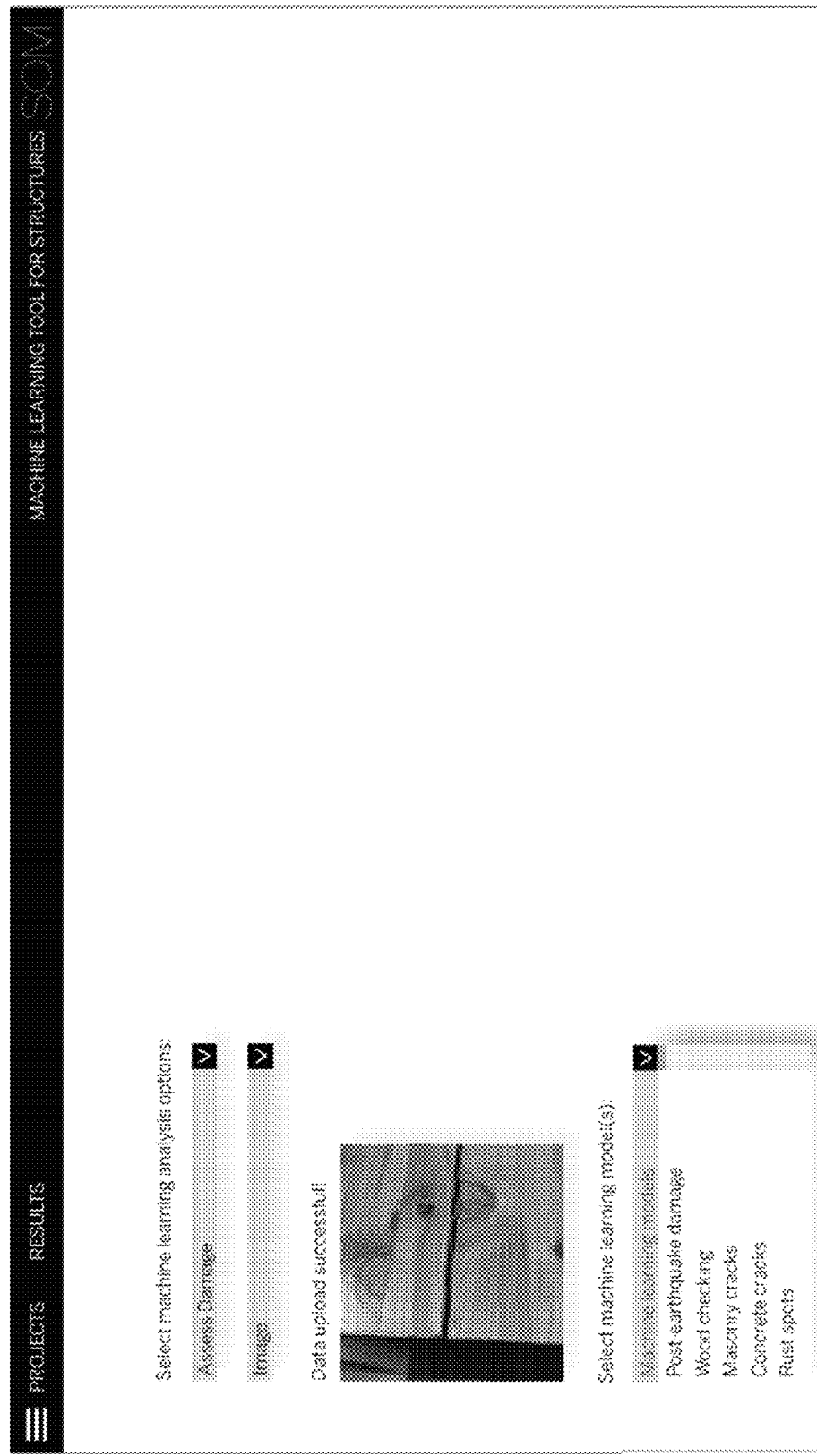
Figure 17:
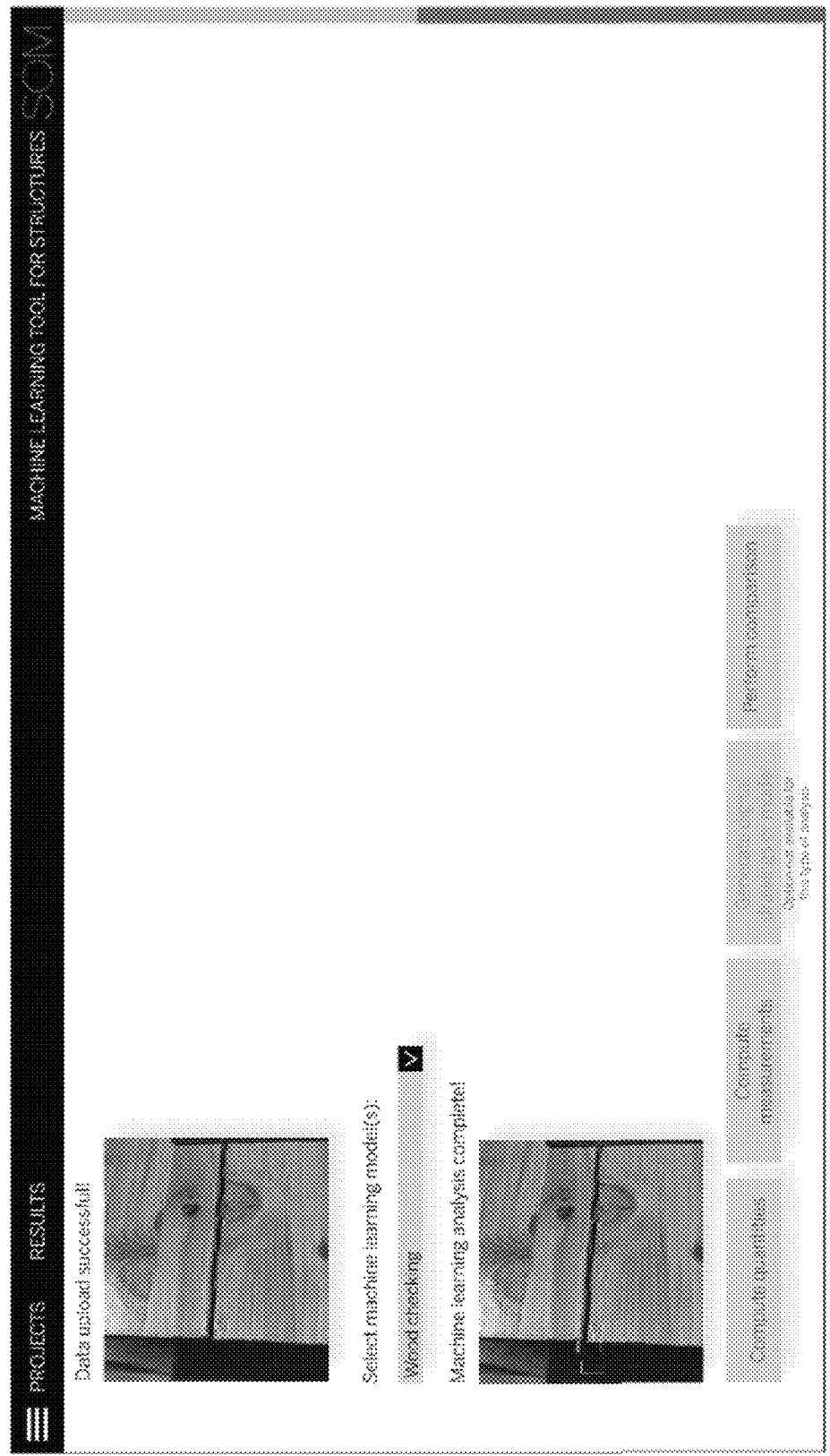

In steps 404 and 406, the tool receives the application and data format information from the user. In step 408, the interface for uploading the data is displayed and the data is received in step 410 once it is uploaded by the user. FIG. 14 shows a display of the user interface in which the user is prompted to upload image data. In step 412, the user interface 302 causes the display of the different machine learning models that are available to analyze the data based on the application and data format information received in steps 404 and 406. Multiple machine learning models can be selected and employed at the same time. In step 414 the machine learning model selection is received from the user. FIG. 15 shows a screen shot of a display for step 412 in which the user is prompted to select a machine learning model. As can be seen, the user has uploaded an image of a wooden glued laminated beam. FIG. 16 shows a screen shot of a display of the user interface with the drop down menu of machine learning models selected, in which "Post-earthquake damage," "Wood checking," "Masonry cracks," "Concrete cracks," and "Rust spots" model options are visible. Not all available models are shown in this figure. These are exemplary for this particular tool and application received in step 404 but other models could be included or some of these models could be omitted. In step 416 the data is analyzed using the selected machine learning models and in step 418 the user interface causes the display of the results. FIG. 17 shows a screen shot of the user interface with the display of a result using the "Wood checking" model. As can be seen, two checks in the beam were detected, a longer one along the beam, and shorter one at an end of the beam. At this time, the user is provided with options for selecting post-processing algorithms as is visible at the bottom of the screen shot.

If consistent with the application and data format selected in steps 404 and 406, the user then has the option to determine quantities from the results in step 420 using the quantity algorithm/module 310. If selected, the number of instances of each class in the dataset are counted in step 422 and the quantities are displayed in step 424. If consistent with the application and data format selected in steps 404 and 406, the user has the option to determine measurements from the results in step 426 using the measurement algorithm/module 312. If selected, the measurements are computed following the process outlined in FIG. 5 and described in detail below and then the system proceeds to step 428. If not selected, the system proceeds to step 428.

If consistent with the application and data format selected in steps 404 and 406, the user has the option to generate a digital model in step 428 using the digital model generator module 316. If selected, the digital model is created following the process outlined in FIG. 6 and described in detail below and then the system proceeds to step 430. If not selected, the system proceeds to step 430.

If consistent with the application and data format selected in steps 404 and 406, the user has the option to perform a comparison against a benchmark in step 430 using the comparison module 314. If selected, the comparison is performed following the process outlined in FIG. 7 and described in detail below and then the system proceeds to step 432. If not selected, the system proceeds to step 432.

In step 432, the user can choose to export the files/results. In steps 434 and 436, the machine learning tool for structures 208 receives the user's selection of files/results to export and their format. Formats can include but are not limited to image files, pdf files, excel files, csv files and text files. In step 438, the selected files/results are exported in the selected format.

Figure 5:
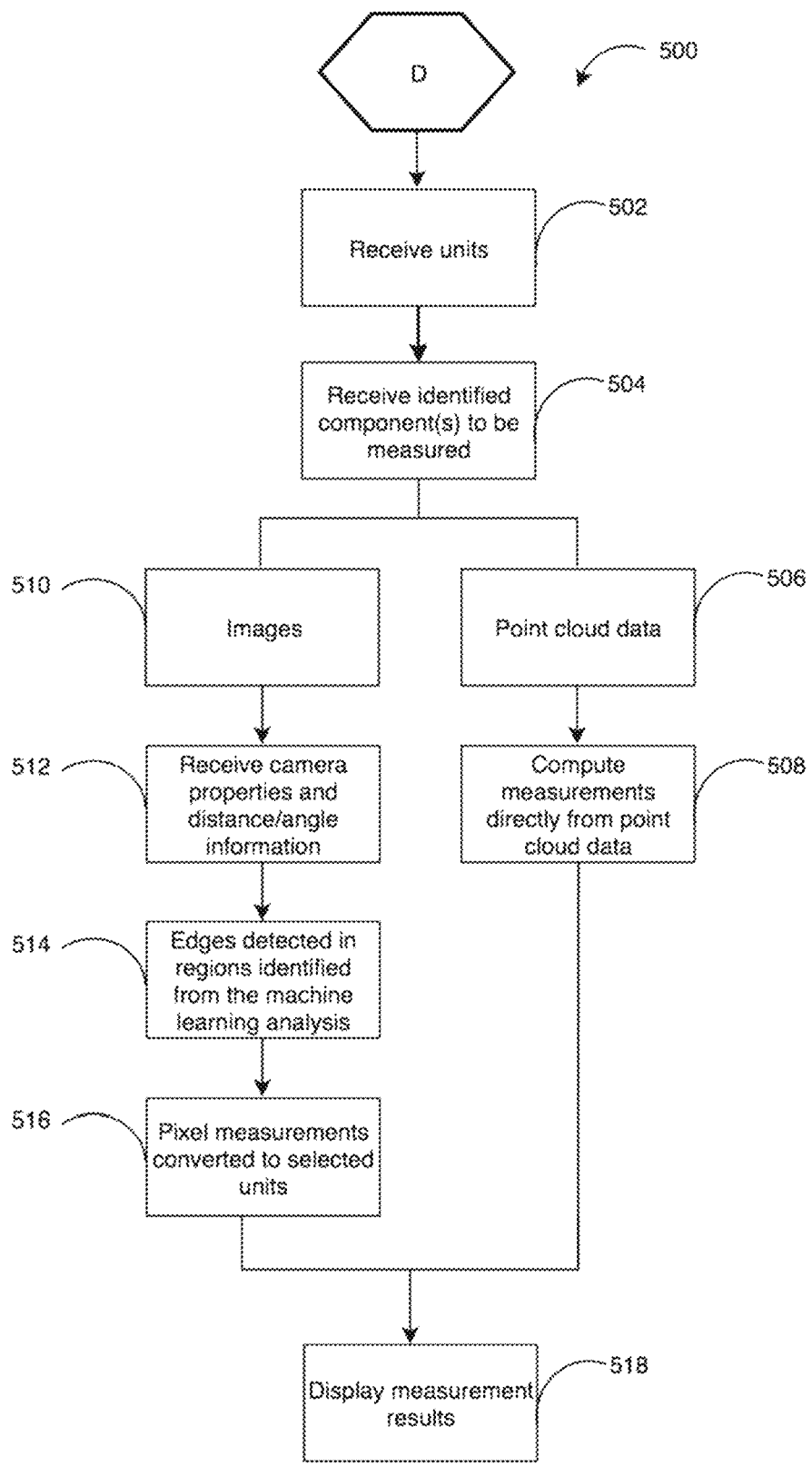
FIG. 5 depicts a flow chart illustrating exemplary steps by the machine learning tool for structures of FIGS. 2 and 3 for determining quantities and/or measurements from the analyzed data.

FIG. 5 depicts a flow chart 500 illustrating exemplary steps by the machine learning tool for structures for determining measurements from the processed data. The user inputs the measurement units in step 502. In step 504, the user inputs the identified component(s) to be measured.

With image datasets 510, in step 512 the user inputs the information required to convert pixel measurements to the units specified in step 502. The user selects the camera type from a pre-set list that already contains the camera properties associated with each camera type in the list. Alternatively, the user can input the camera properties manually. The user then also inputs (1) the distance between the camera lens and the component in question, (2) the dimensions of a known reference object in the plane of the component in question and/or (3) the angle between two images used to capture the same area. In step 514, classical computer vision is used to detect edges in the region(s) of the component(s) identified in step 416. In step 516, the edge pixel measurements(s) in the identified region(s) are computed and the information obtained in step 512 is used to convert these measurement(s) to the units specified in step 502.

With the point cloud data 506, the measurements are computed directly from the geospatial information stored in the point cloud data in step 508.

Figure 18:
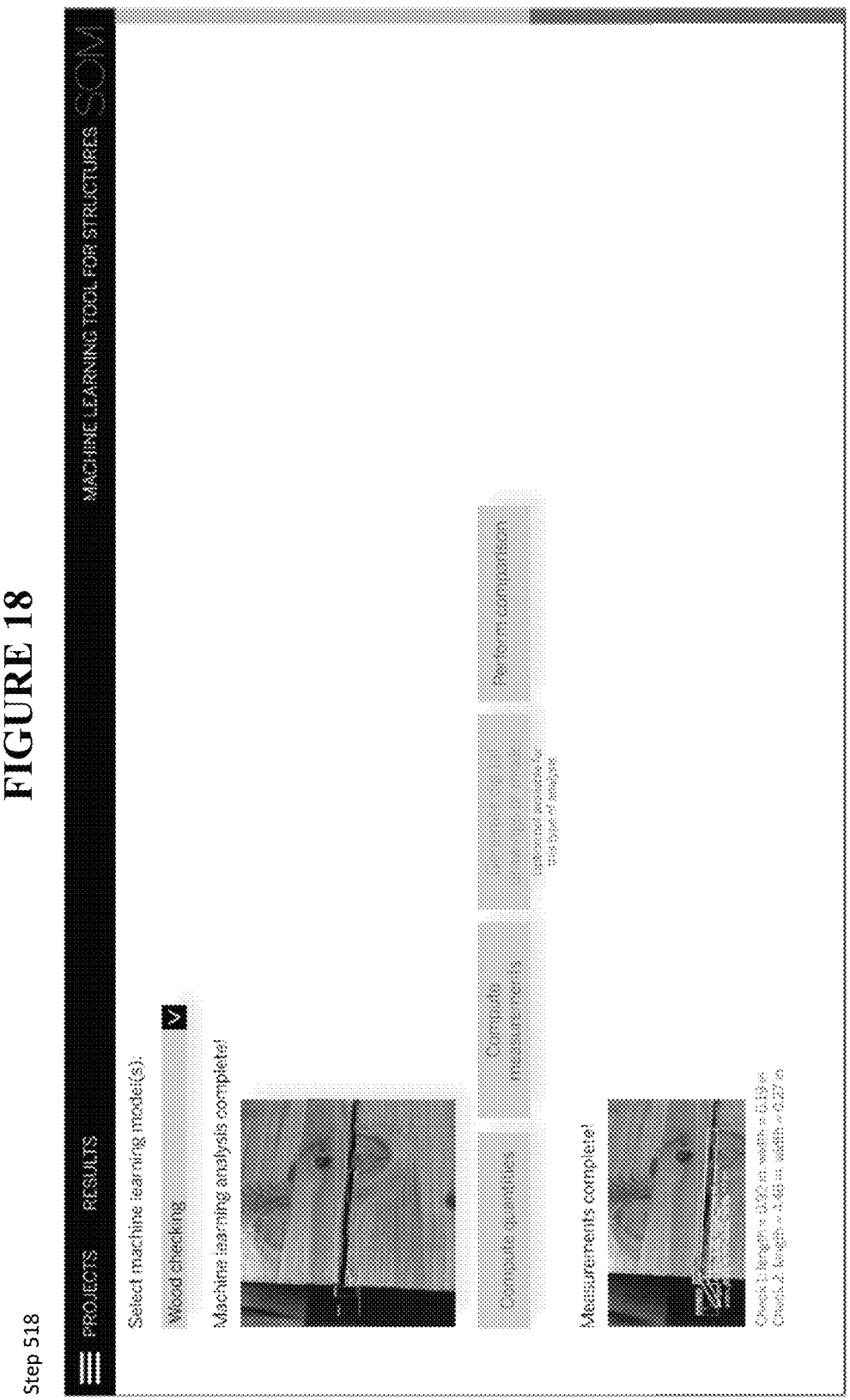

The measurement results are displayed in step 518. FIG. 18 shows a screen shot of a display of the user interface after running the calculate measurements post-processing algorithm on the result of the "Wood checking" machine learning model. As can be seen, measurements of the two checks were generated. The two checks are referred to as Check 1 and Check 2.

Figure 6:
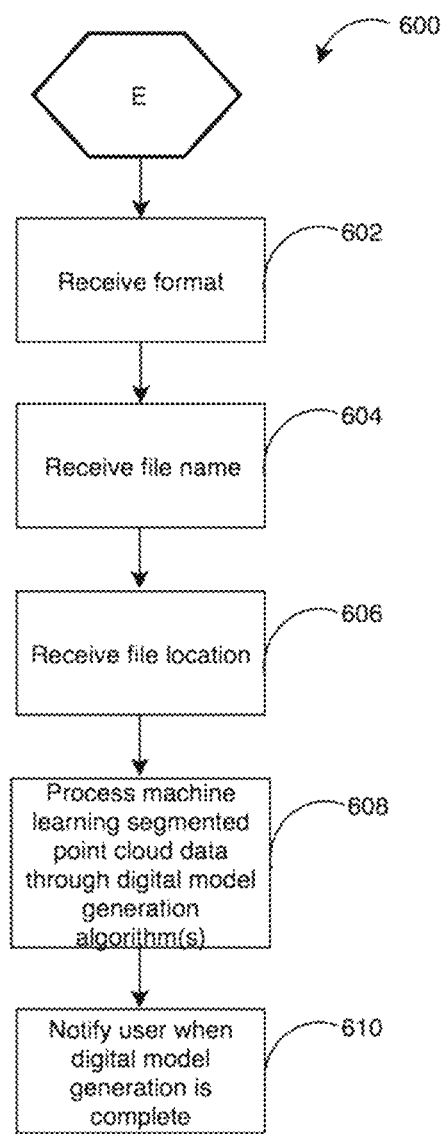
FIG. 6 depicts a flow chart illustrating exemplary steps by the machine learning tool for structures of FIGS. 2 and 3 for generating a digital model from the analyzed data.

FIG. 6 depicts a flow chart 600 illustrating exemplary steps by the machine learning tool for structures 208 for generating a digital drawing/model from the processed data using the digital drawing/model generation algorithm/module 316. For example, regions of post-tensioned tendons can be identified from drone images and/or point cloud data using the machine learning models. These regions are then converted into detail lines or tendon components in a digital drawing/model.

In step 602, the user inputs the file format for the digital model. In step 604 and 606, the user inputs the file name and the file location for saving the digital model. In step 608, an algorithm converts the point cloud data that was segmented in step 416 into the digital model format specified in step 602. In step 610, the user is notified when the creation of the digital model is complete.

Figure 7:
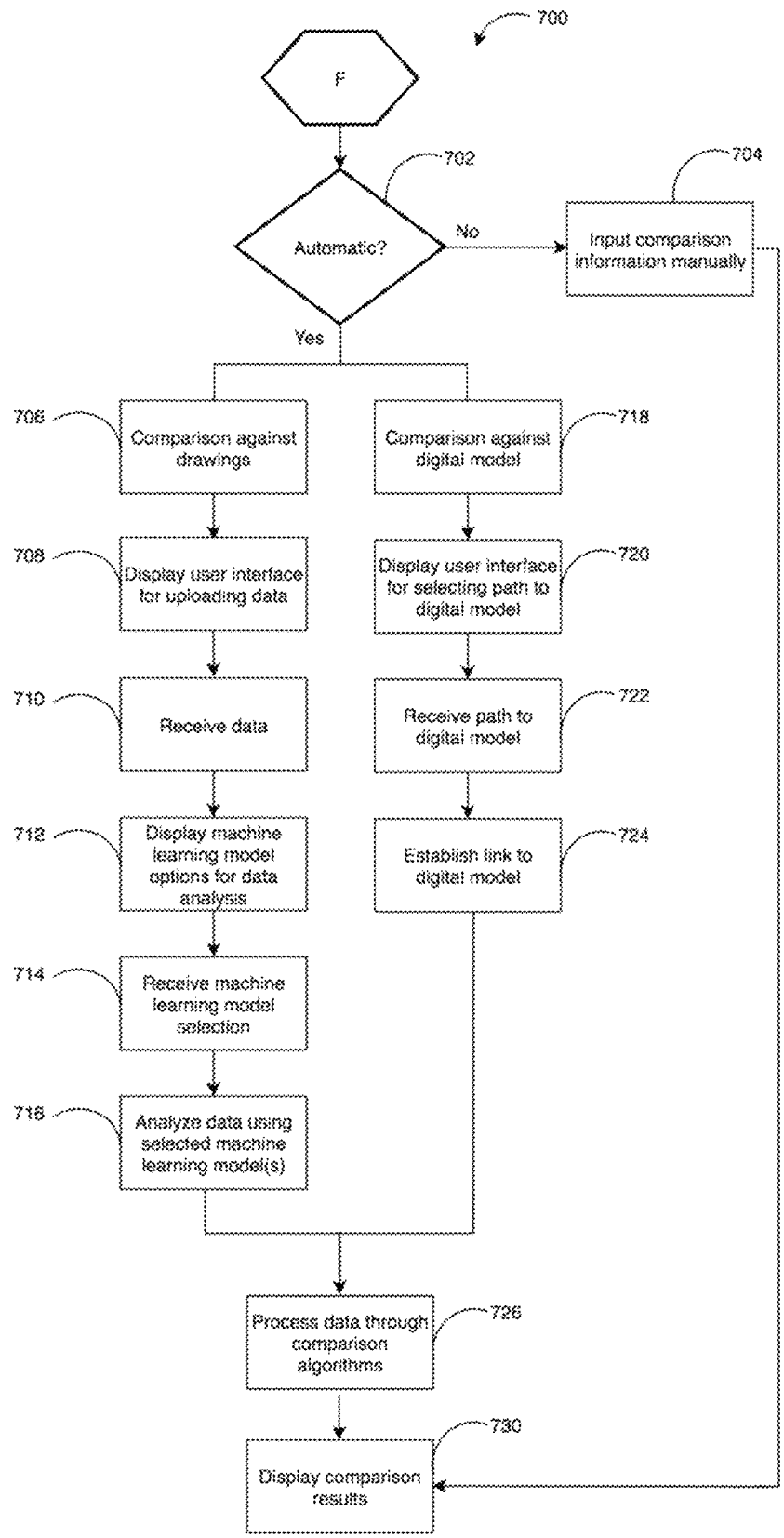
FIG. 7 depicts a flow chart illustrating exemplary steps by the machine learning tool for structures of FIGS. 2 and 3 for comparing the results of the analyzed data against a benchmark.

FIG. 7 depicts a flow chart 700 illustrating exemplary steps by the machine learning tool for structures 208 for comparing the results of the processed data against a benchmark. The user has the option to perform the comparison manually or automatically in step 702. If the user selects the manual comparison, the information is input into the system 300 manually in step 704. If the user selects the automatic comparison option, the information extracted using the machine learning models, quantity and measurement algorithms can be compared to the intended design through drawings in step 706 and/or a digital model in step 718. Drawings can be produced by the design professional or shop drawings produced by the contractor, subcontractor, fabricator or other. The digital model can be developed by design professionals, fabricators or other.

In the case of automatic comparison to drawings, a user interface for uploading the data is displayed in step 708. In step 710 the data is received. In step 712, the user interface displays the different machine learning models available to analyze the data. Multiple models can be selected. Preferably, different machine learning models have been trained to identify different drawing components, such as different elements and views, and subcomponents, including dimension lines and weld symbols. Using optical character recognition, the text associated with each component and subcomponent can be detected. In step 714 the machine learning tool for structures 208 receives the user's model selection and in step 716 the data is analyzed using those models.

In the case of automatic comparison to a digital model, the user specifies the path to the digital model in step 720. The path is received in step 722 and a link to the digital model is established in step 724.

In both cases of comparison to drawings and comparison to a digital model, the data is then processed through the comparison algorithm/module 314 in step 726. In the case of automatic comparison to drawings, the information extracted from the image(s) and/or point cloud data is automatically compared to that extracted from the drawing (s) and any deviations are reported. For example, gusset plate dimensions extracted from an image can be automatically compared against those extracted from the shop drawing for the gusset plate in question. With a digital model comparison, the relevant information from the digital model to the results from the image(s) and/or point cloud data analyses are directly compared, with any deviations being reported out. For example, the system 300 can compare regions of post-tensioned tendons identified from drone images and/or point cloud data in step 416 to the profile in the digital model and highlights any deviations that are beyond the specified tolerance.

Figure 19:
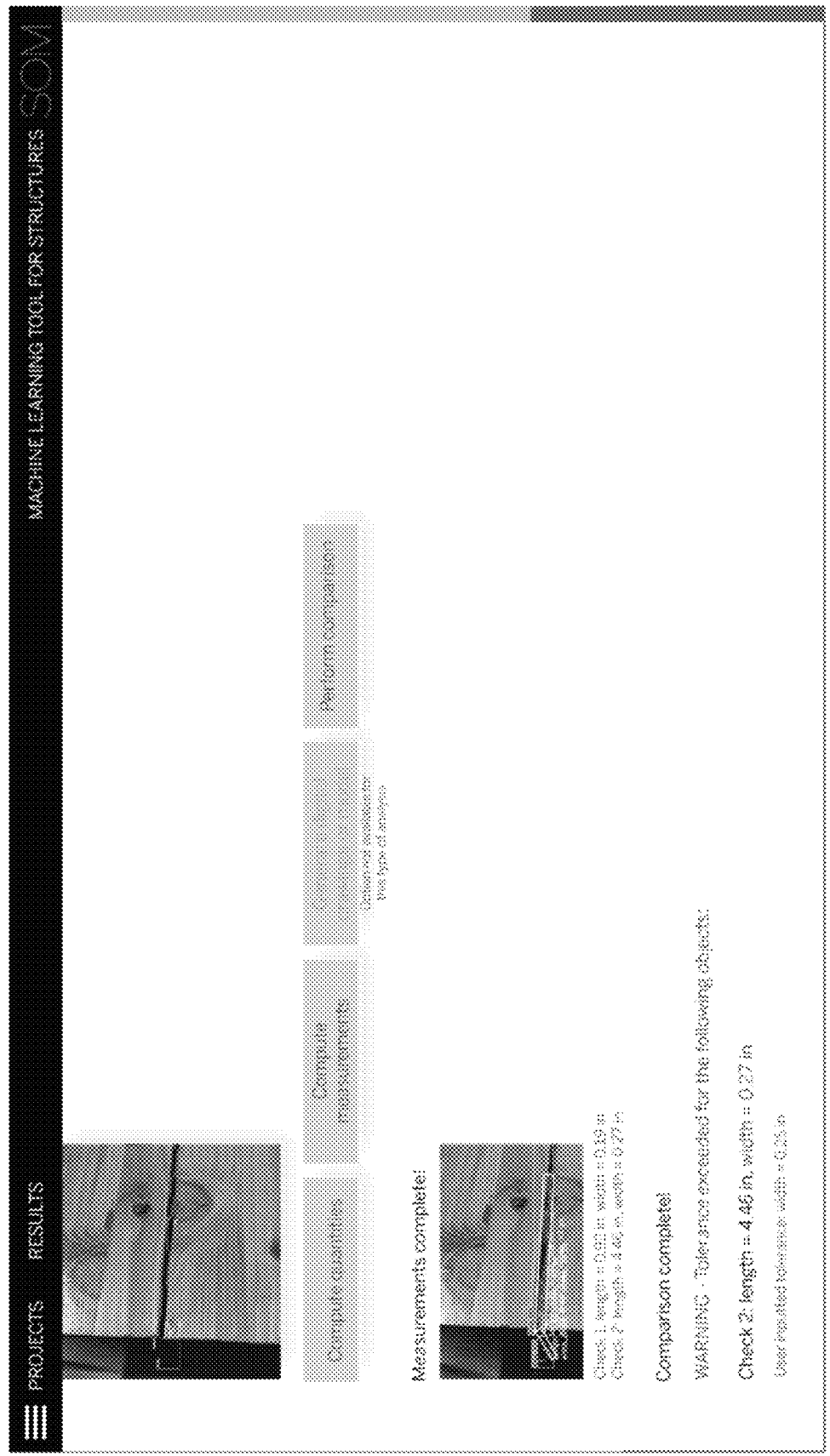

In step 730, the manual and/or automatic comparison results are displayed. FIG. 19 shows a screen shot of the user interface in which the results of the comparison are shown. As can be seen, the shorter and less wide check at the end of the beam, Check 1, is within tolerance levels, while the longer and wider check along the beam, Check 2, is not within the user inputted tolerance.

FIGS. 8 to 10 provide examples of the machine learning tool for structures' different applications.

In terms of design, machine learning tool for structures can be employed to evaluate the design of a structure using two-dimensional or three-dimensional representations of the structure. The design can be evaluated for structural performance, aesthetic qualities, material quantities, environmental conditions or the like. machine learning tool for structures can be used to help designers quickly evaluate numerous massing options without depending on feedback from experienced professionals. It can also be used to propose new massing options and be combined with other machine learning models to optimize shapes for multiple parameters such as aesthetics, wind effects, solar energy, material quantities and the like.

For example, the machine learning tool for structures can be used classify tall building shapes as bad, fair, moderate, good and excellent for mitigating wind effects. A particular machine learning model was trained using the results from physical wind tunnel tests. FIG. 8A shows examples of the Styrofoam models 802 that were tested in the wind tunnel. Digital versions of these models are shown in image 804. The wind tunnel results were interpreted by engineers employed by the assignee and classified into the five different wind performance categories listed above. The machine learning model was trained using two-dimensional image representations of the building shapes, which were each labelled with the appropriate wind performance classification. Some examples of these two-dimensional representations are shown in image 806. These images are composed of vertical and horizontal sections of the building that are tiled together into one image, in this case a square image as shown in image 816. Different shades of grey are used to represent the background and the plane of the building through which the section is taken. FIG. 8B shows different tall building design permutations 808, 810 and 812 analyzed by the machine learning model before arriving at a shape 814 that was classified by the machine learning model as excellent for mitigating wind effects. Image 816 shows the two-dimensional image representation of shape 814.

In terms of construction verification, the machine learning tool for structures can be employed to inspect on-site work, track construction progress, improve construction quality assurance and quality control processes as well as generate as-built drawings or digital models. The components identified by the machine learning tool for structures can be either structural or non-structural in nature and can comprise a variety of materials, such as steel, concrete, wood, masonry, glass or the like. Examples of components the tool can detect are post-tensioned tendons, reinforcing steel bars, gusset plates, bolts, shear studs, welds, embedments, exterior wall anchors and the like. The results of the machine learning analysis can be used to compute quantities and measurements.

The machine learning tool for structures can also comprise machine learning models that identify components and extract text from drawings. The results from the on-site machine learning analysis can be compared to the results from the drawing machine learning analysis and/or directly to the digital model.

FIGS. 9A, 9B, 9C, 9D, 9E, 9F, 9G and 9H show components that were identified from site photos using in accordance with principles of this disclosure. In image 904 and 908, post-tensioned tendons and wall anchors were identified from a drone photo 902 using segmentation and object detection techniques, respectively. Image 906 shows the machine learning results for the post-tensioned tensioned tendons overlain with the design drawings for that slab. The difference in the actual layout of the post-tensioned tendons compared to the design layout is apparent in this image, demonstrating the importance of using the present tool for construction verification. In image 910, bolts were identified using object detection. In image 912, a weld was identified using segmentation. In images 914 and 916, shear studs used to make the metal deck and concrete slab composite with the steel framing were identified using object detection. Because shear studs are small and are typically counted over a large area, a digital single-lens reflex (DSLR) camera can be used to take high-resolution photographs of large areas containing shear studs. The images are divided into nine sub images and then each sub-image is analyzed independently. The analyzed sub-images are then recombined to display the results in the original photo format. This allows the onsite user to take a single photograph, while enabling the system to process the images at an effective resolution. A sample of an analyzed sub-image is shown in image 914 and a sample of a recombined photo is shown in image 916.

FIGS. 9I, 9J, 9K, and 9L show components identified from shop drawings as well as an example of using the machine learning analysis results to compute measurements. By subdividing shop drawings into manageable components and subcomponents through object detection and using optical character recognition to extract their associated text blocks, the machine learning tool for structure can be used to "read" shop drawings. Images 918 and 920 show the results of the identification of different component views in a steel beam shop drawing and shows different subcomponents in a steel shop drawing, such as dimension lines, weld symbols and bolt grouping. Images 922 and 924 show the same gusset plate identified from a site photo and a shop drawing using object detection. These two results then can be used by the machine learning tool for structures to perform a comparison analysis.

An example of combining machine learning with measurement techniques for construction verification is the identification of reinforcing steel bars and computation of their size and spacing. In images 926 and 928, the reinforcing steel bars are identified using segmentation. Once the rebar has been identified, the machine learning tool for structures can utilize classical computer vision to detect edges in those regions as shown in image 930. The measurements are determined by using known information about the camera properties, camera location, camera angle and/or reference object dimensions, as described in more detail below.

In terms of damage detection, a machine learning tool for structures can be employed to monitor the health of a structure, evaluate its performance and perform damage assessments after a destructive event. Herein, the term "destructive event" is meant to include all man-made and natural destructive events, including, but not limited to, earthquakes, storms, hurricanes, tornadoes, high winds, terrorist attacks, explosions and any other man-made or natural destructive event which may damage a structure. The damage identified by the machine learning tool can be structural or non-structural in nature and can be categorized into different severity levels, including but not limited to light, moderate, heavy or severe. The machine learning tool for structures can also detect defects in materials, including but not limited to checks in wood members and cracks in masonry, concrete, steel or other similar type members. It can also identify collapsed structures or collapsed portions of a structure. The machine learning analysis results can also be combined with measurement techniques to compute the size (area, length, height, depth) of the damaged area identified.

FIGS. 10A, 10N, 10C, 10D and 10E show machine learning damage assessment results of images following the 2017 Puebla-Morelos earthquake in Mexico. The locations that were visited following this earthquake are identified in image 1002. Images 1004, 1006, 1008, 1010 and 1012 show the different damage types (structural/non-structural) and severity levels (light/moderate/heavy/severe) that were identified by the machine learning model using object detection. Images 1010 and 1012 show the difference in results between a machine learning model that was trained using 3,000 iterations (image 1010) and one that was trained using 10,000 iterations (image 1012), demonstrating that adjustments to the model training can be made to improve the accuracy of the model as described in more detail below.

Use of a machine learning tool for structures such as described herein provides users with immediate feedback regarding the level of damage of a structure, whether it can be occupied and whether it requires major repairs. These results can be used to expedite the evaluation process of structures following a destructive event and mitigate lost time from manual inspections. The machine learning tool for structures can also use natural disaster databases to automatically identify and assess damage from photographs uploaded by reconnaissance teams and local volunteers in real time, rather than manually cataloging the photographs in the weeks and months following the event.

FIGS. 10F, 10G, 10H, 10I and 10J demonstrate how such a machine learning tool for structures can be employed to evaluate a structure's performance. The images show the results of a machine learning model that was trained to identify abnormal deformations, hinges and collapsed portions of masonry vaults that were physically tested on a shake table subjected to lateral loading. In images 1014, 1016, 1018 and 1020, abnormal vault deformations were identified from overall shots of the test specimens and shake table using object detection. In images 1022 and 1024, collapsed portions of the vaults were identified from side view photographs of the test specimens using object detection. These photographs were collected from 240-frame per second (fps) slow motion videos captured with cameras installed on tripods next to the shake table. In image 1026, a hinge was detected from an overhead photograph of the test specimen using object detection. This photograph was also collected from a 240-fps slow motion video captured on a camera that was positioned over the shake table.

As should be appreciated, a machine learning tool for structures can be used for in-place structures or structures that are being researched. Accurate, immediate, time-sensitive behavior is detected.

FIGS. 10K, 10L, 10M, and 10N illustrate an example of how a machine learning tool for structures can be used to monitor the health of a structure by identifying and measuring changes over time to detect deterioration of components. In this example, heavy timber glued laminated timber (glulam) beams are monitored for check formation at a construction site. The monitoring is performed over a long period of time, from when the beams are installed through building operation, to assess how the timber is acclimating to the environment. Digital single-lens reflex (DSLR) cameras and auxiliary equipment are housed inside camera boxes installed in the building. The DSLR cameras are programmed to take a picture of the beams once per day using a timed remote shutter release. Those images are automatically uploaded to an online cloud account and can be processed using the machine learning tool for structures to identify checks and compute their dimensions.

Image 1030 shows a glulam beam with the lines of tape indicating the locations of some notable timber checking. Image 1032 shows the results of a machine learning analysis used to identify checking in a close-up image and the use of classical computer vision in that region to compute the dimensions of the identified checks. Image 1036 and 1038 show the camera boxes installed in the building.

The camera box designs are shown in image 1040. The boxes were fabricated out of plywood. They were designed to fit between and be secured to parallel joists. An adjustable base was designed to adjust the camera angle for each location being monitored. A hole was cut in the front of the box to provide the camera lens with an unobstructed view of the girder being monitored.

Algorithms

In this section there are described in greater detail various of the above-mentioned algorithms.

Measurement Algorithm 312

Figure 20A:
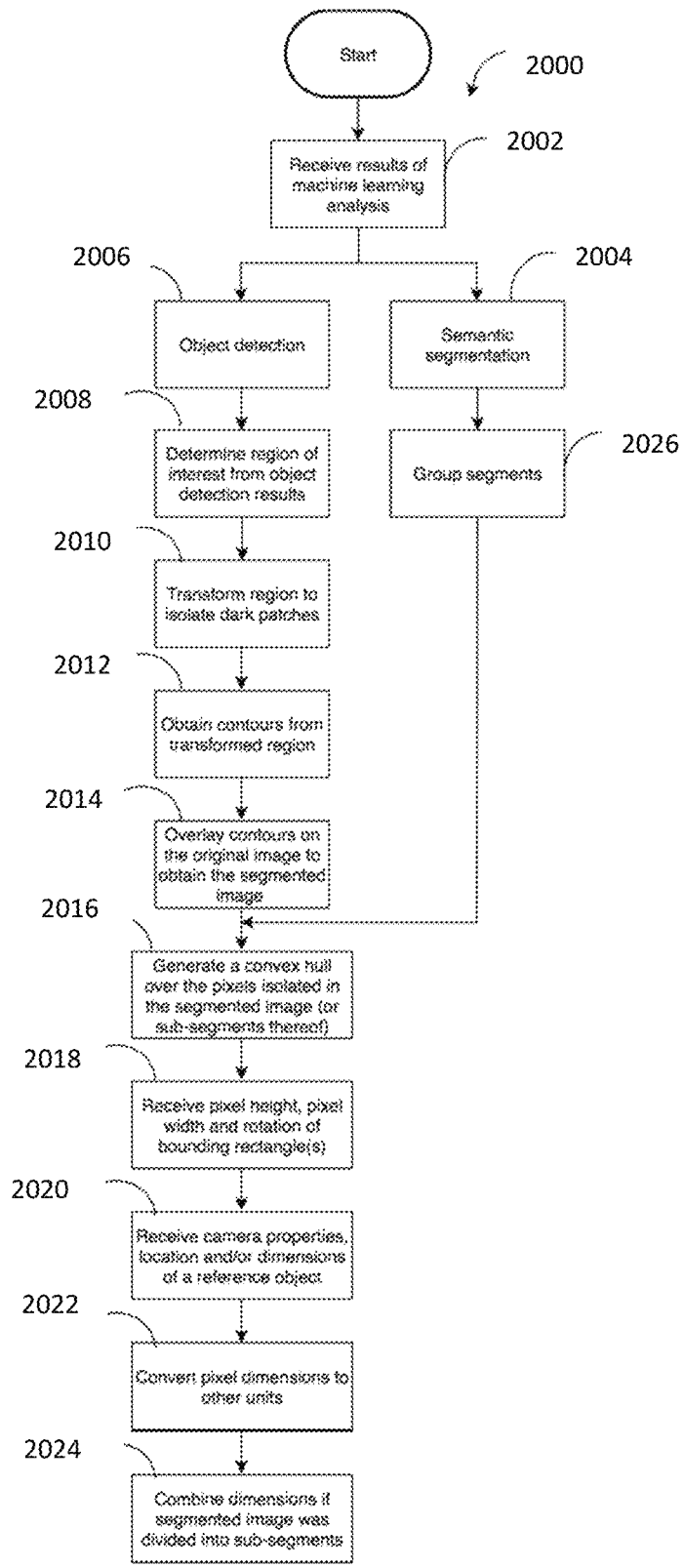
FIG. 20A depicts a flow chart illustrating exemplary steps by the machine learning tool of FIGS. 2 and 3 to implement a measurement algorithm in accordance with principles disclosed herein.
Figure 20B:
Figure 20C:
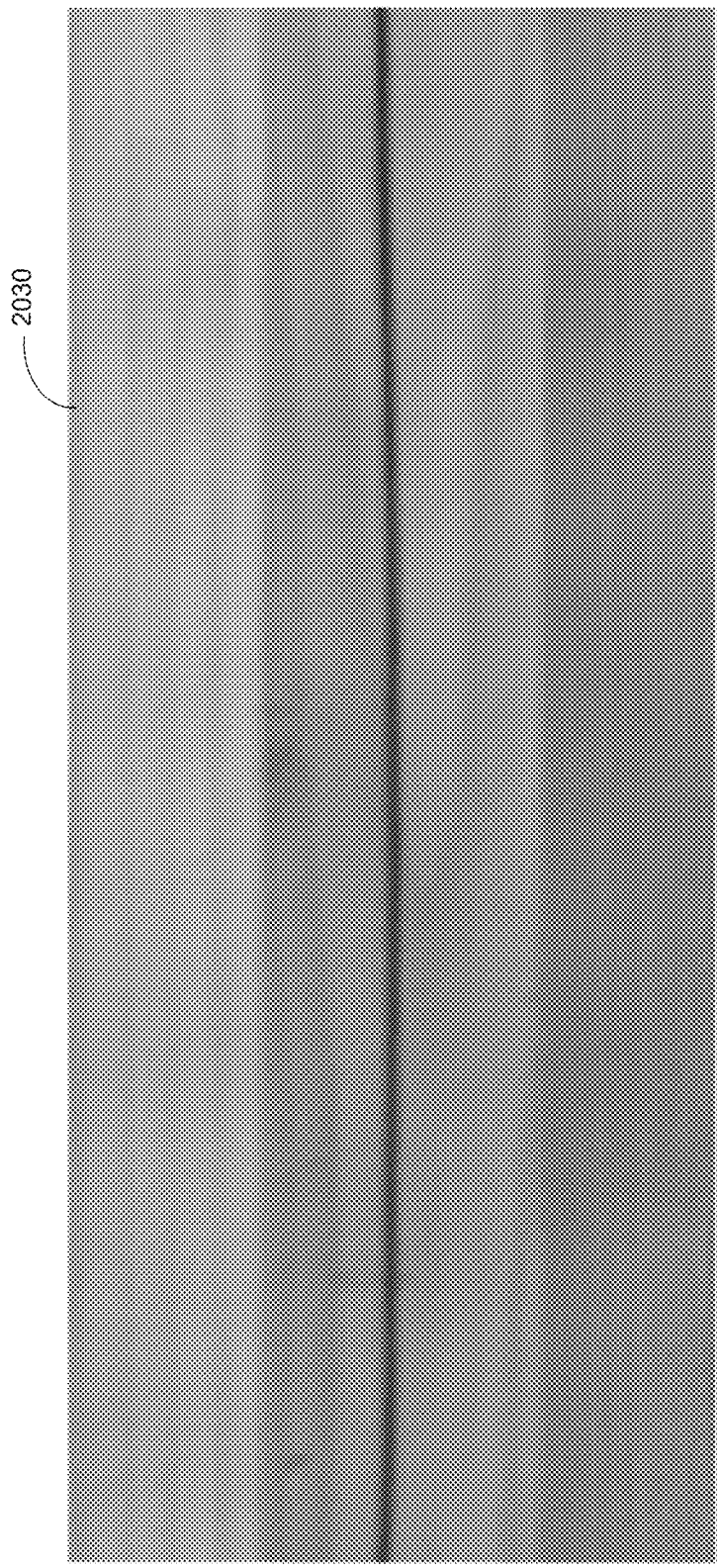
Figure 20D:
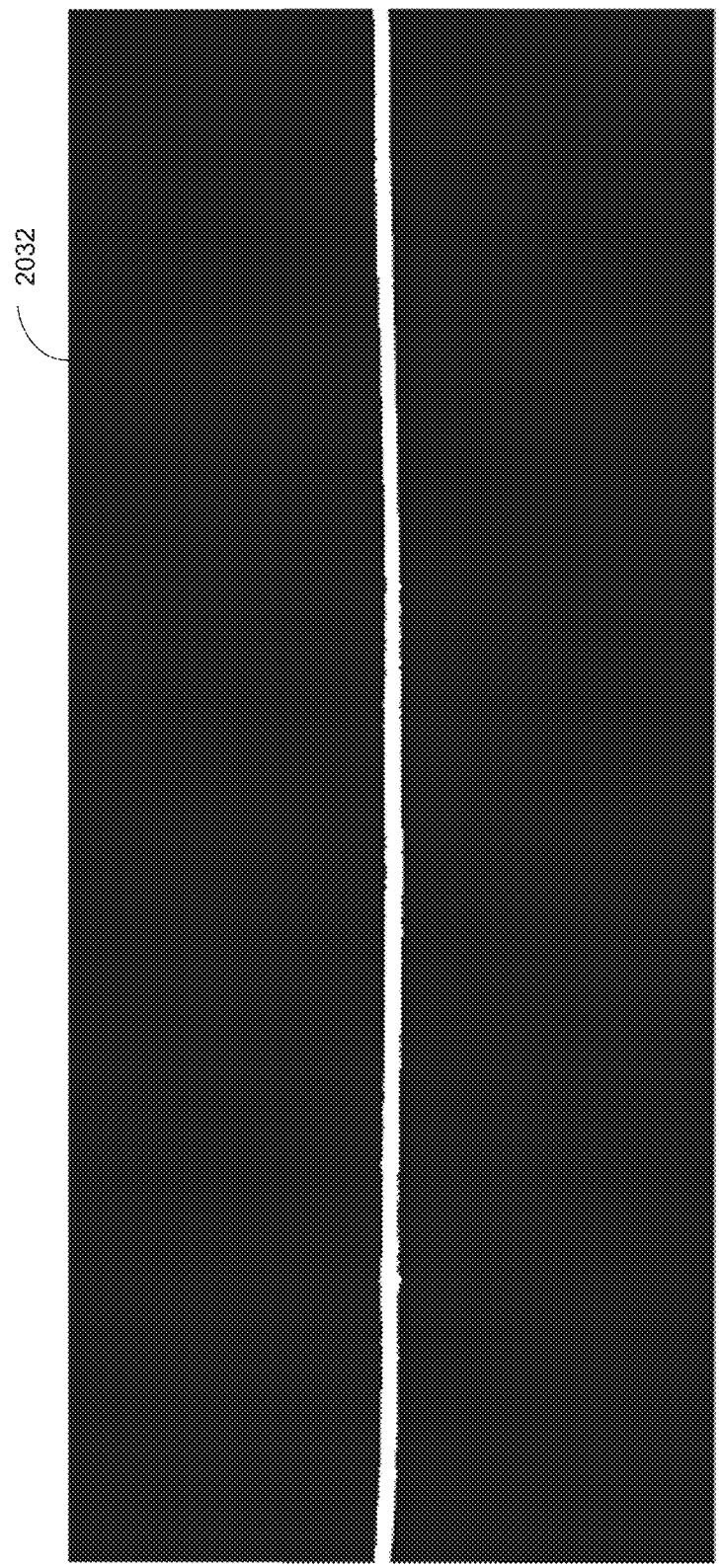
Figure 20E:
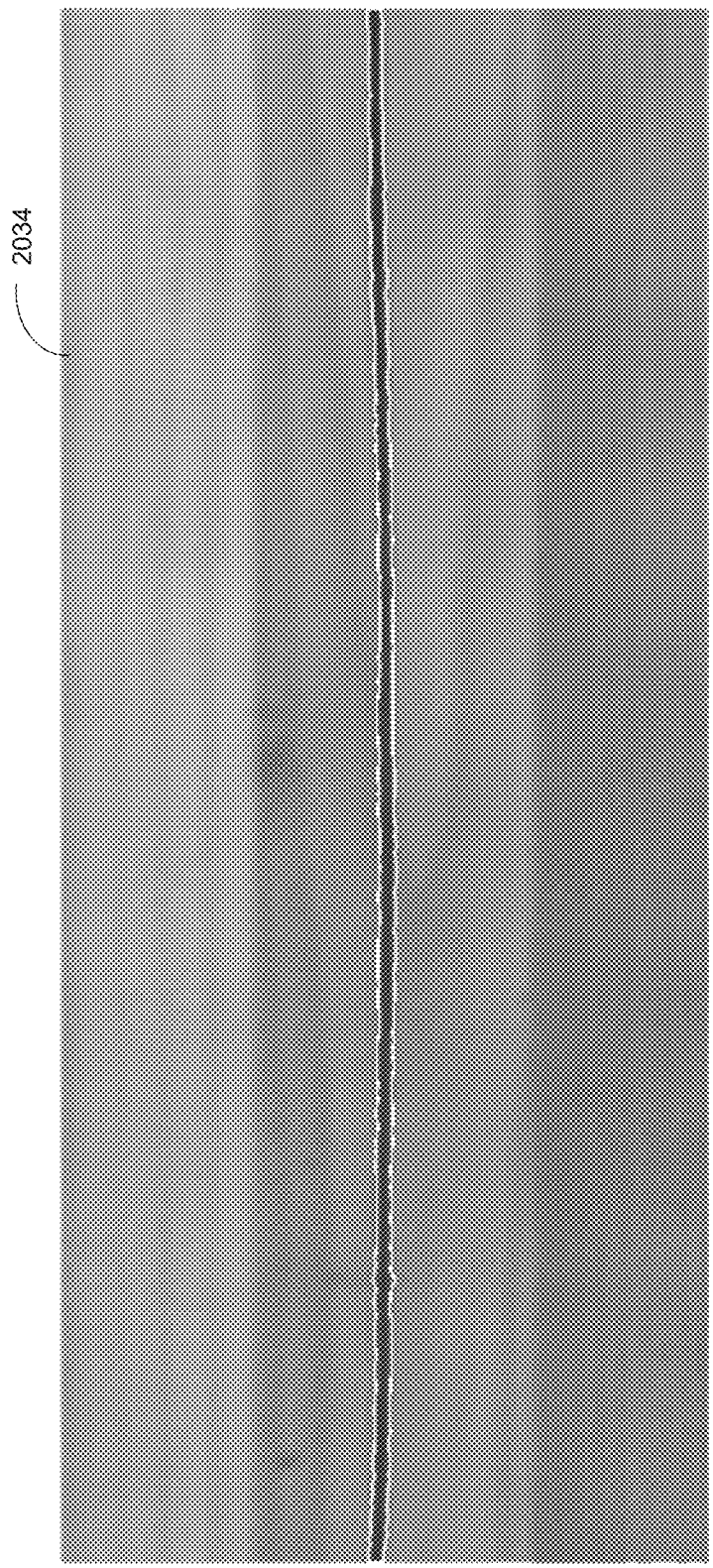
Figure 20F:
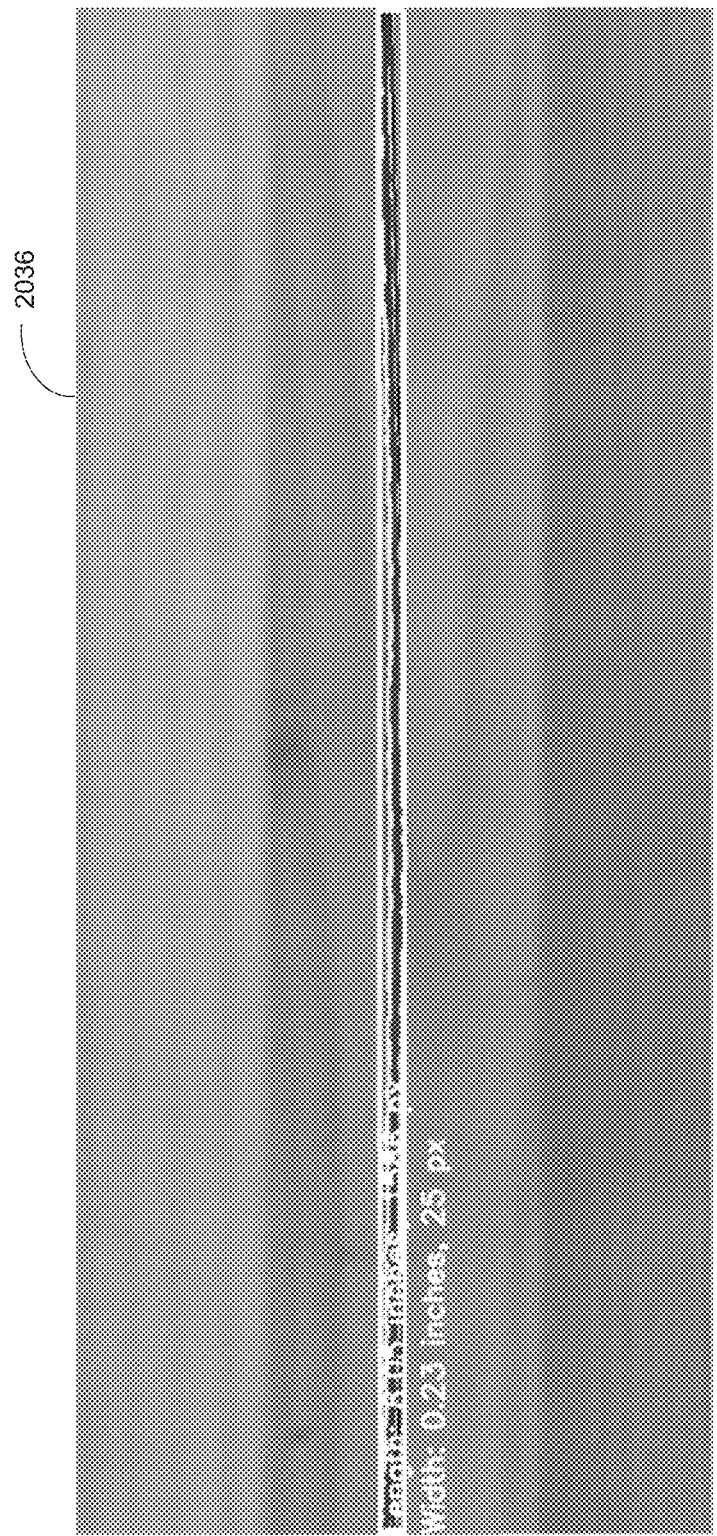

FIG. 20A depicts a flowchart 2000 illustrating the different steps in a process for determining measurements from images that have been analyzed by the tool's machine learning models. First, the results of the machine learning analysis are received in step 2004. If the image was analyzed using object detection 2006, then the object detection results are isolated from the rest of the image as regions of interest in step 2008. Image segmentation is then performed on these regions of interest to isolate the pixels associated with checks in the image. In step 2010, the region is transformed to isolate dark patches in the image. Then, contours are obtained from the transformed image in step 2012 and the contours are overlain over the original image in step 2014. Next, a convex hull is generated over the isolated pixels in step 2016. The convex hull is created using the function minAreaRect in OpenCV. This function creates a rectangle with minimum area bounding all the pixels, returning pixel height, pixel width and rotation of the rectangle drawn over the pixels. This process may be performed in smaller sub-steps to accurately determine the dimensions of objects that are curved, bent, angled, convoluted and the like. The convex hull may be fit over smaller sub-segments of the segmented regions of interest to achieve a closer fit on the overall object. In step 2018, the pixel height, pixel width and rotation of the bounding rectangle(s) are received from the minAreaRect function. In step 2020, the camera properties, location and/or reference object dimensions are received and in step 2022 and are used to convert the pixel distance to other units. If the convex hull was fitted over smaller sub-segments of the segmented regions of interest, the dimensions determined individually for each sub-segment are combined to determine the overall dimensions of the object. If the image was analyzed by the tool's machine learning models using segmentation 2004, then the segments are grouped in step 2016 using a clustering nearest neighbor approach, then steps 2016 through 2024 are followed as described above.

Equations 1 and 2 below can be used to convert object height in pixels, $h_{op}$ to object height in millimeters, $h_o$. Equation 1 uses the camera focal length f (mm), the distance between the camera lens and the component in question $d_o$ (mm), height of object in question $h_{op}$ (pixels), height of sensor $h_s$ (mm) and height of image $h_i$ (pixels). Equation 2 uses the dimensions of a known reference object, $h_{kp}$ (pixels) and $h_k$ (mm) in the plane of the component in question $h_o$ (mm) and the object measurement $h_{op}$ (pixels).

$$h_o = \frac{d_o h_{op} h_s}{f h_i} \quad (1)$$

$$h_o = \frac{h_{op} h_k}{h_{kp}} \quad (2)$$

If two cameras are used to take a picture of the same object, their location and properties can be used to determine the object distance do. In Equation 3, the object distance do is determined from the distance between the two cameras B, the image pixel resolution x, the cameras' horizontal angle of view φ and the pixel distance between the same object in both pictures hi1-hi2. Then, Equations 1 and 2 can be used to convert pixel measurements to millimeters as described above.

$$do = \frac{Bx}{2\tan\left(\frac{\Phi}{2}\right)(hi1 - hi2)}$$

To obtain object measurements in different units, the millimeter measurements can be replaced by other units in the equations above. The same equations can be used to compute any measurements in the plane of the object.

FIGS. 20B to 20F show the results of the different steps in the measurement algorithm process applied to measure check dimension in glued laminated timber (glulam) beams from images analyzed by the tool using object detection. Image 2028 shows the original image before it is analyzed by the tool's machine learning models using object detection to detect and localize checks in the image. A sub-segment of the region of interest extracted from the object detection results is shown in image 2030. The transformed sub-segment is shown in image 2032. The contour overlain on the original image is shown in image 2034. The convex hull and check dimensions determined by the tool are shown in image 2036.

Digital Model Generation Algorithm 316

Digital model generation refers to the generation of digital drawings and/or models in the following formats: vector graphic format, any computer-aided design (CAD) format, any three-dimensional modeling or Building Information Modeling (BIM) software programs, such as Revit BIM, AutoCAD 3D, Tekla, Rhino, or the like.

Image Cleaning (Segmentation)

Figure 21A:
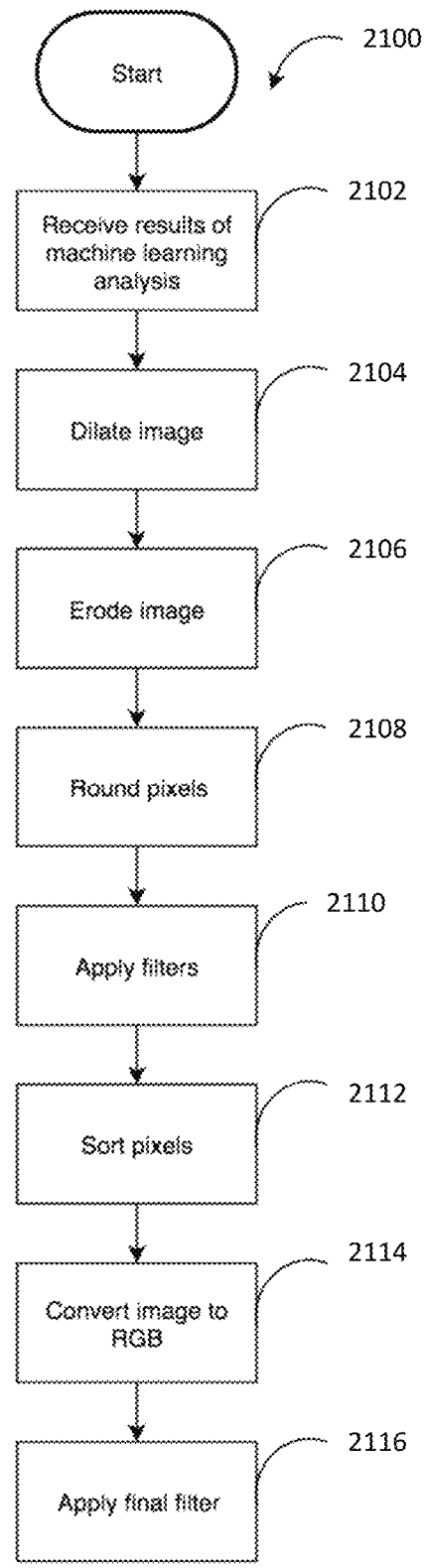
FIG. 21A depicts a flow chart illustrating exemplary steps by the machine learning tool of FIGS. 2 and 3 to implement a digital model generation algorithm in accordance with principles disclosed herein.
Figure 21B:
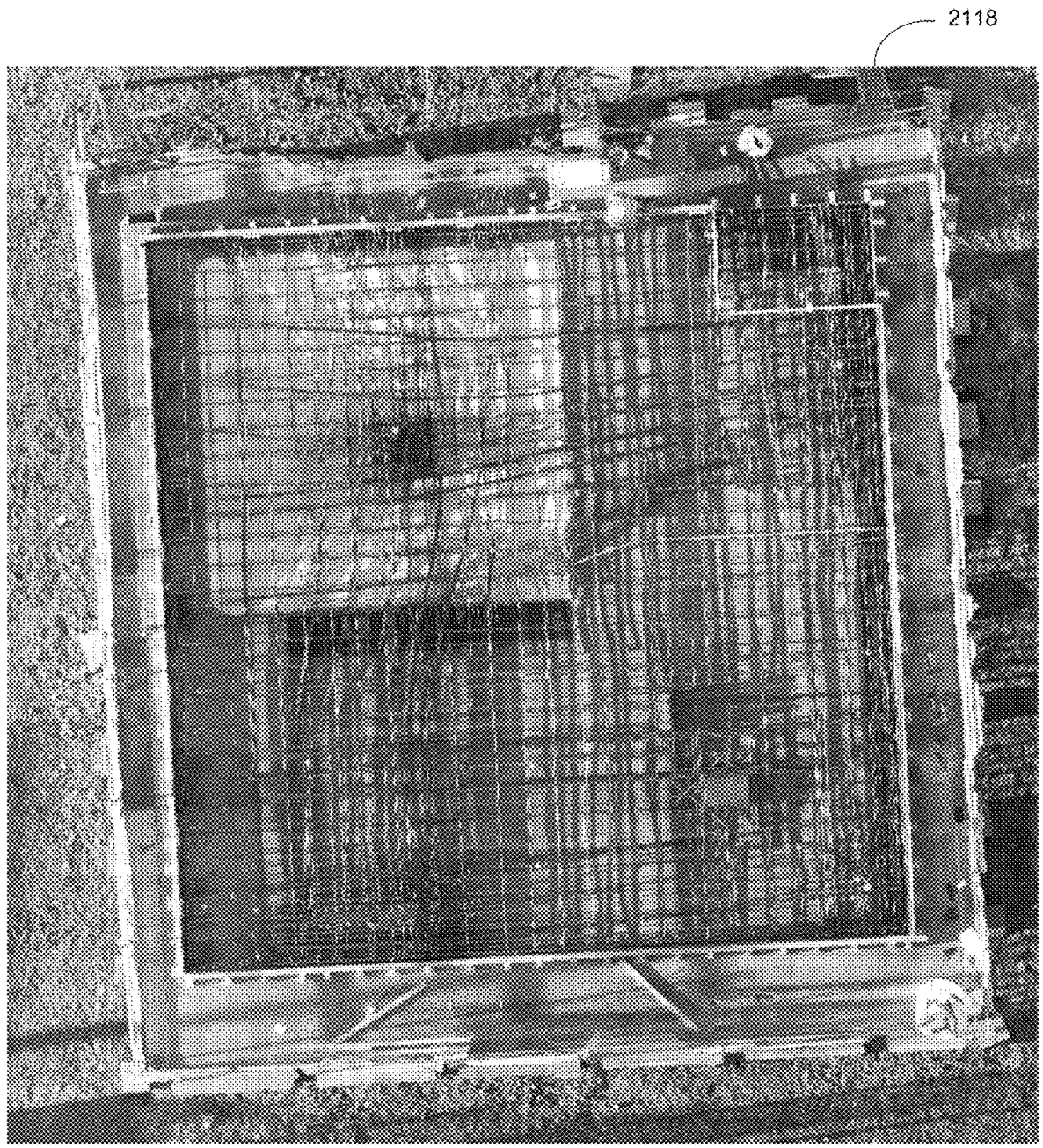
Figure 21C:
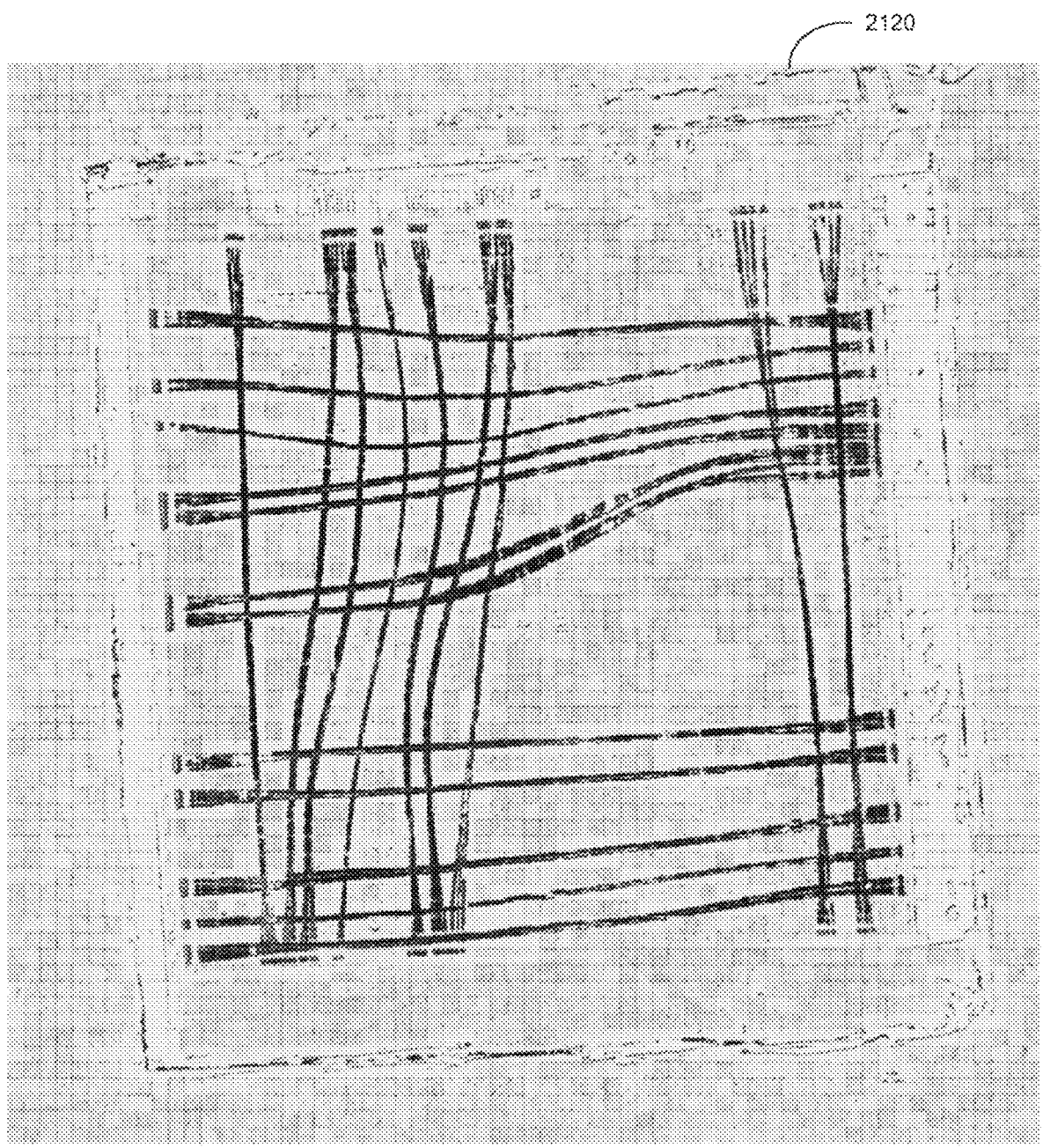
Figure 21D:
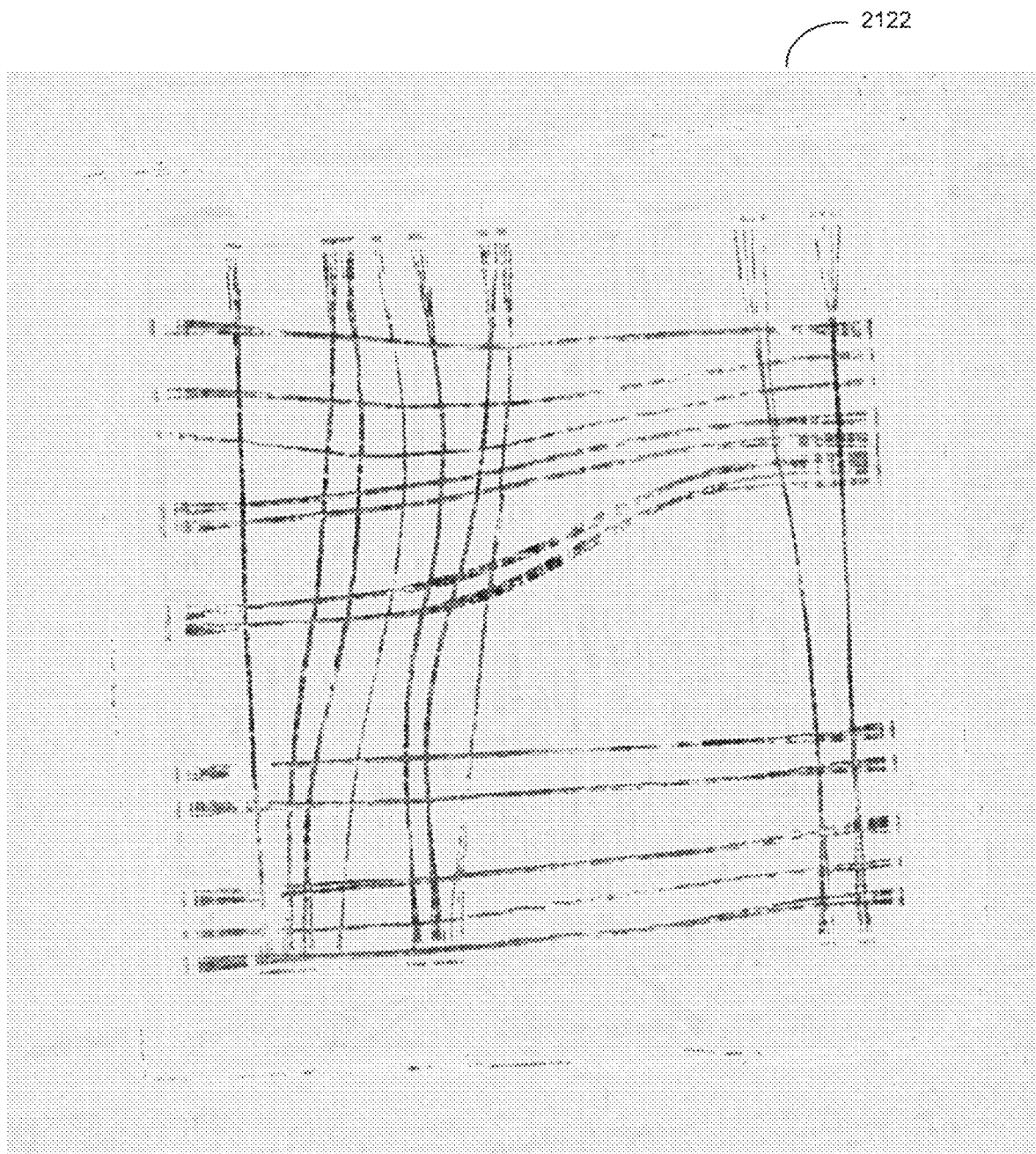
Figure 21E:
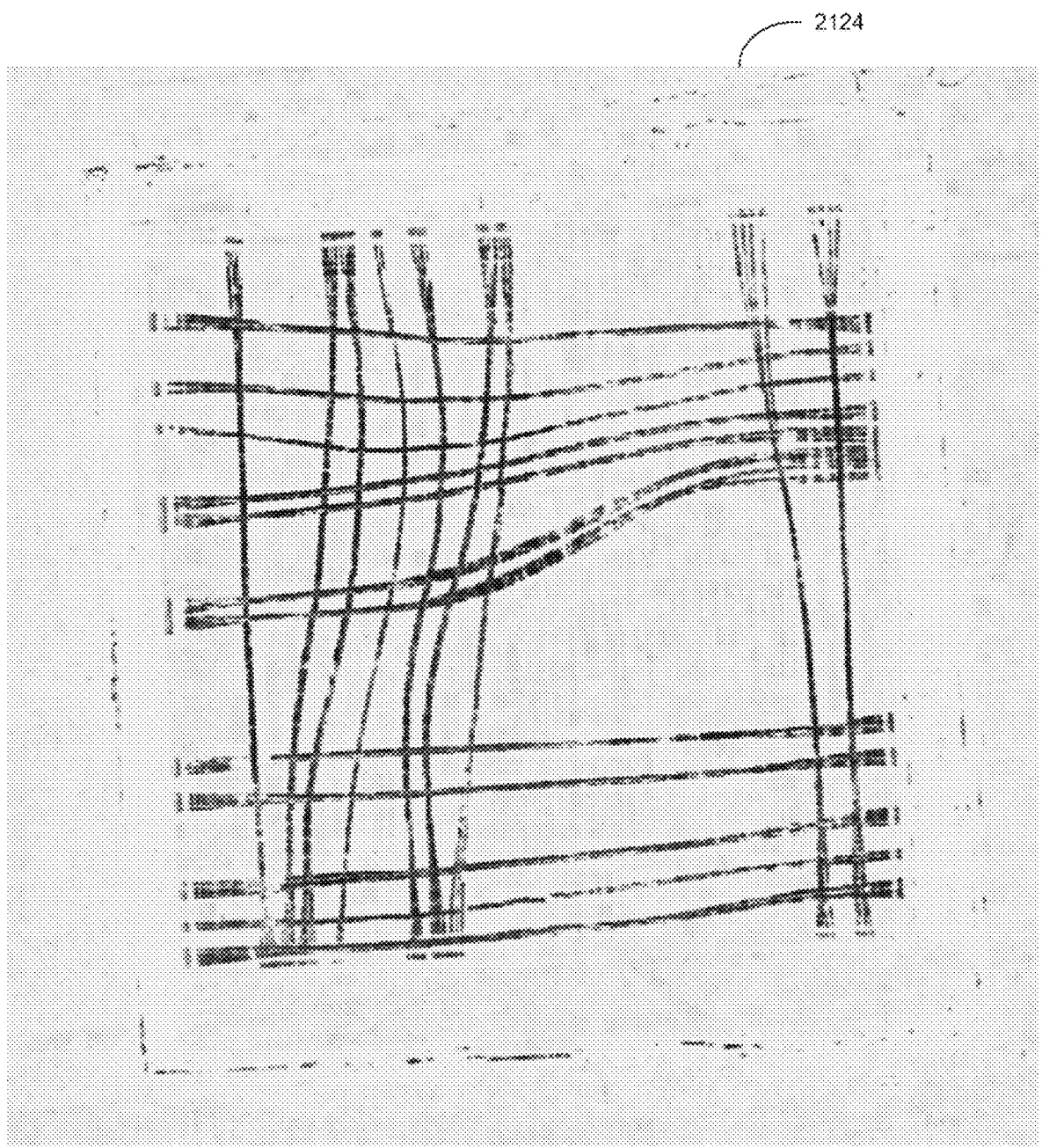
Figure 21F:
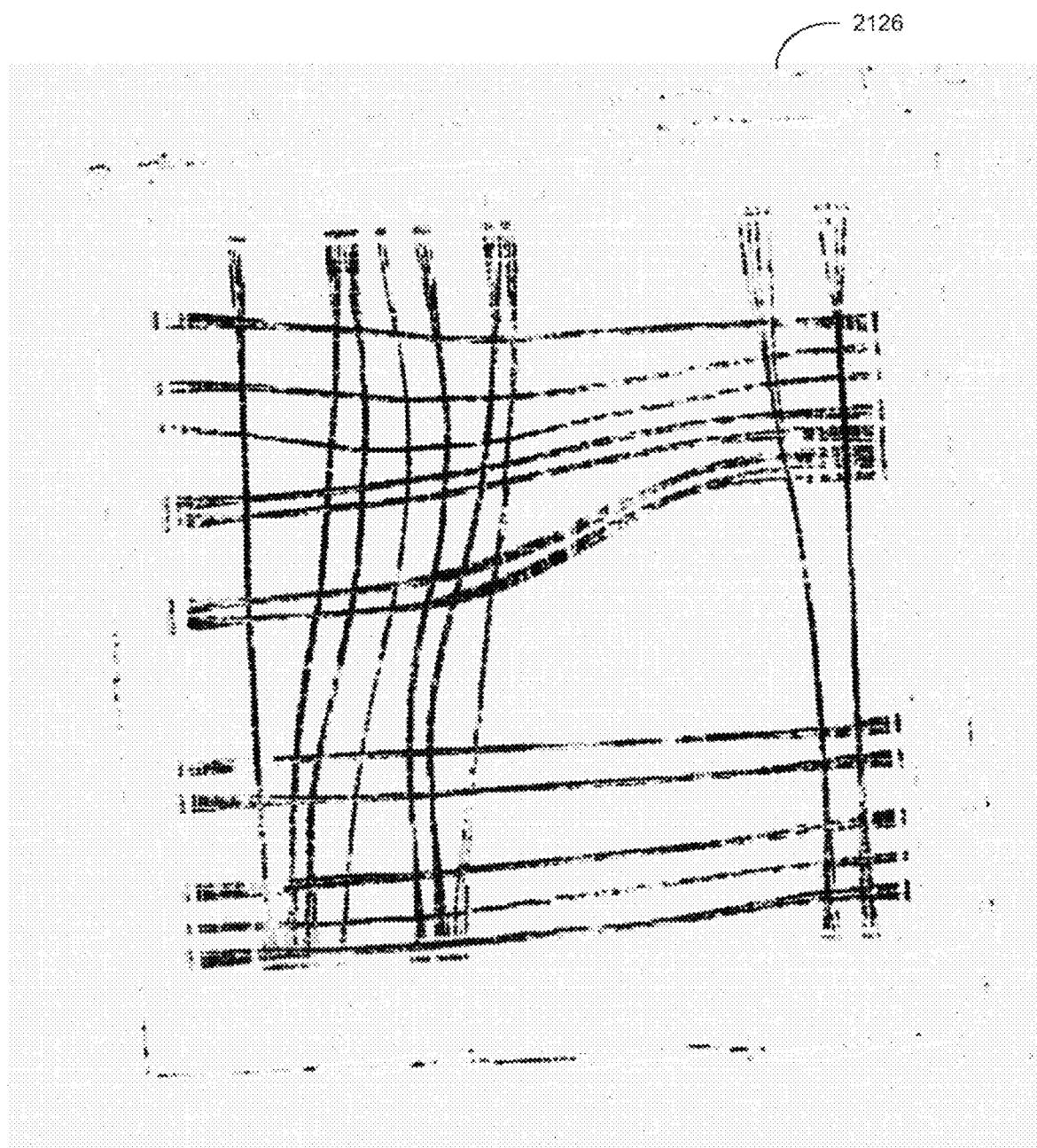
Figure 21G:
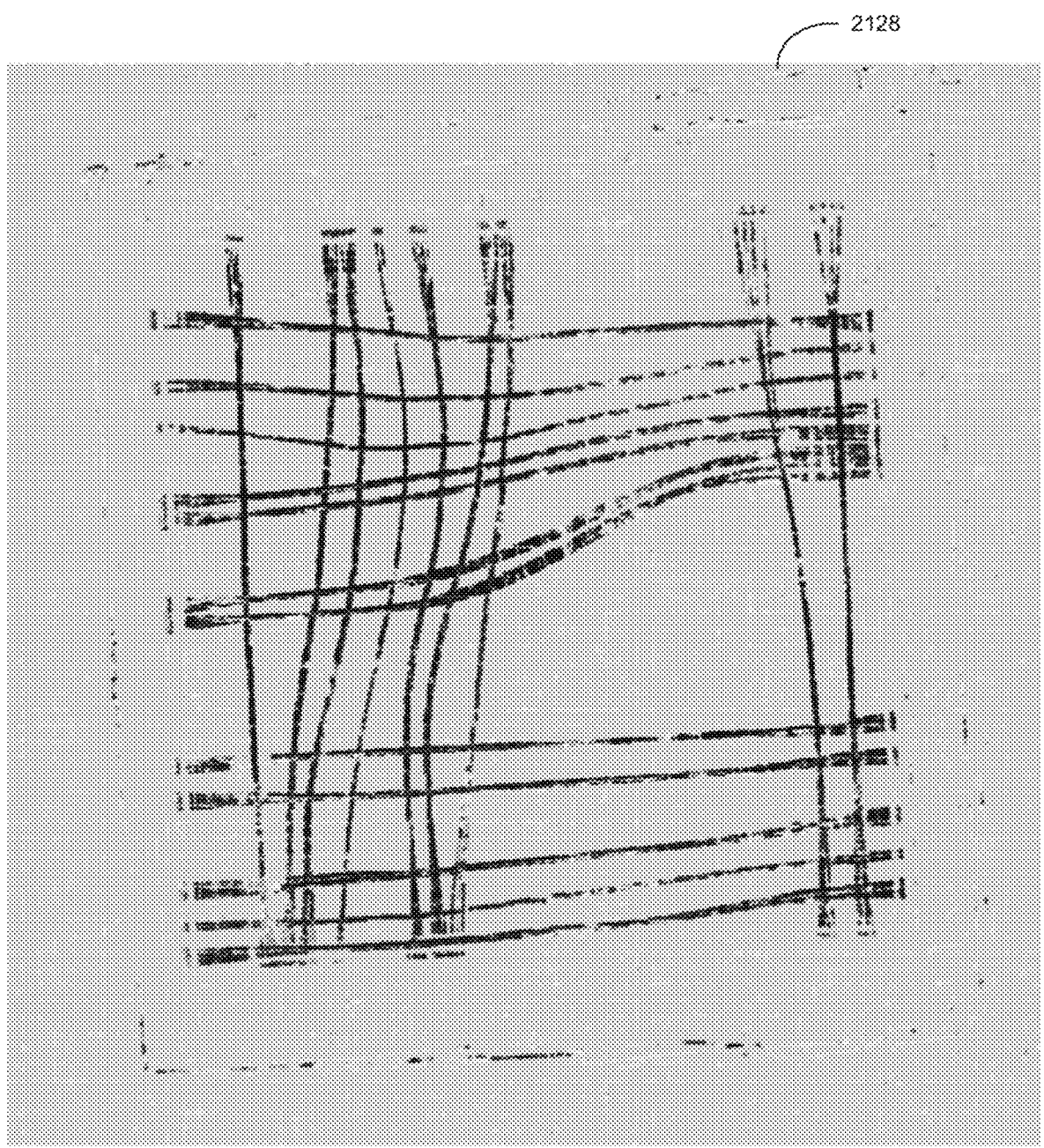
Figure 21H:
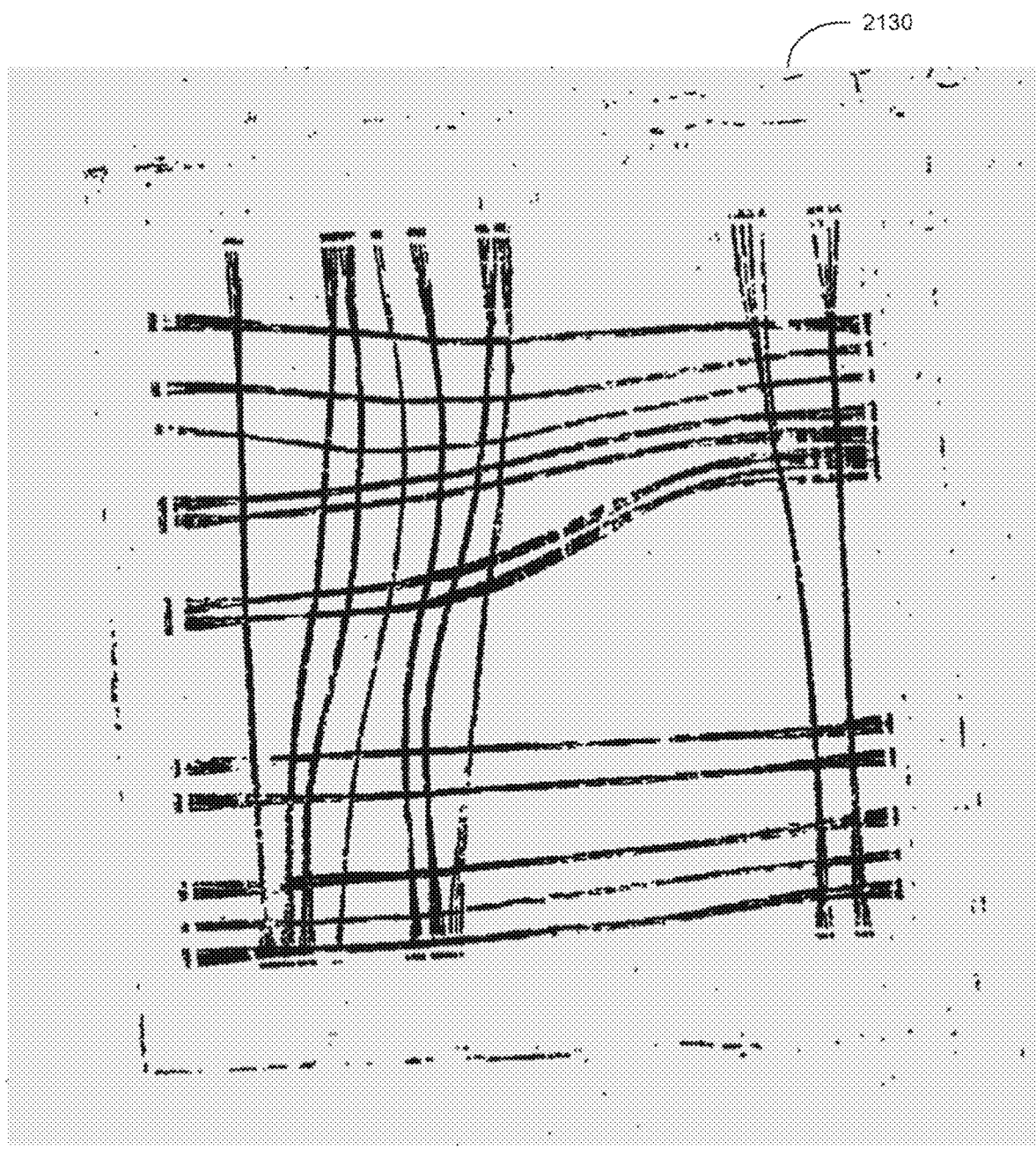
Figure 21I:
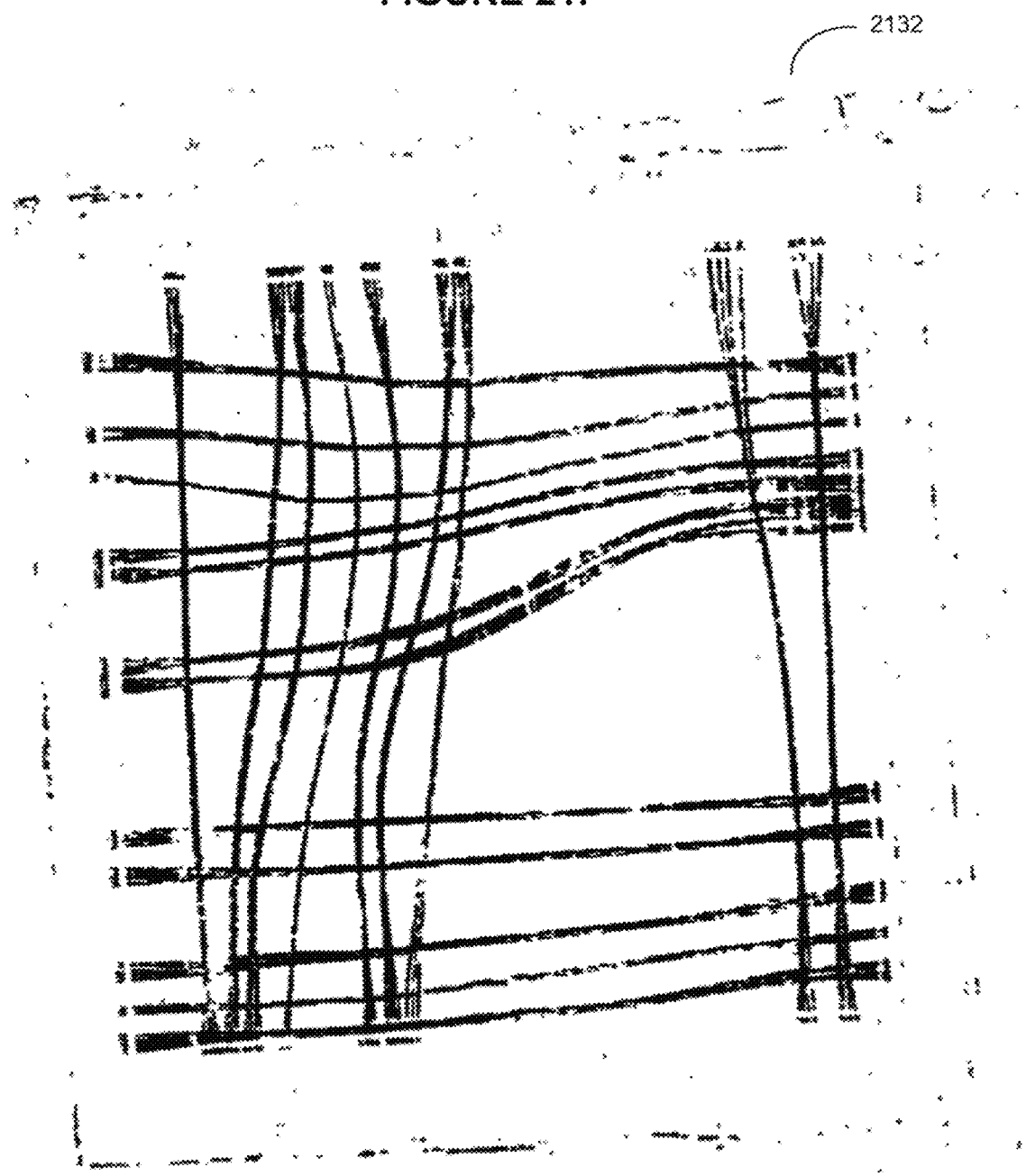
Figure 21J:
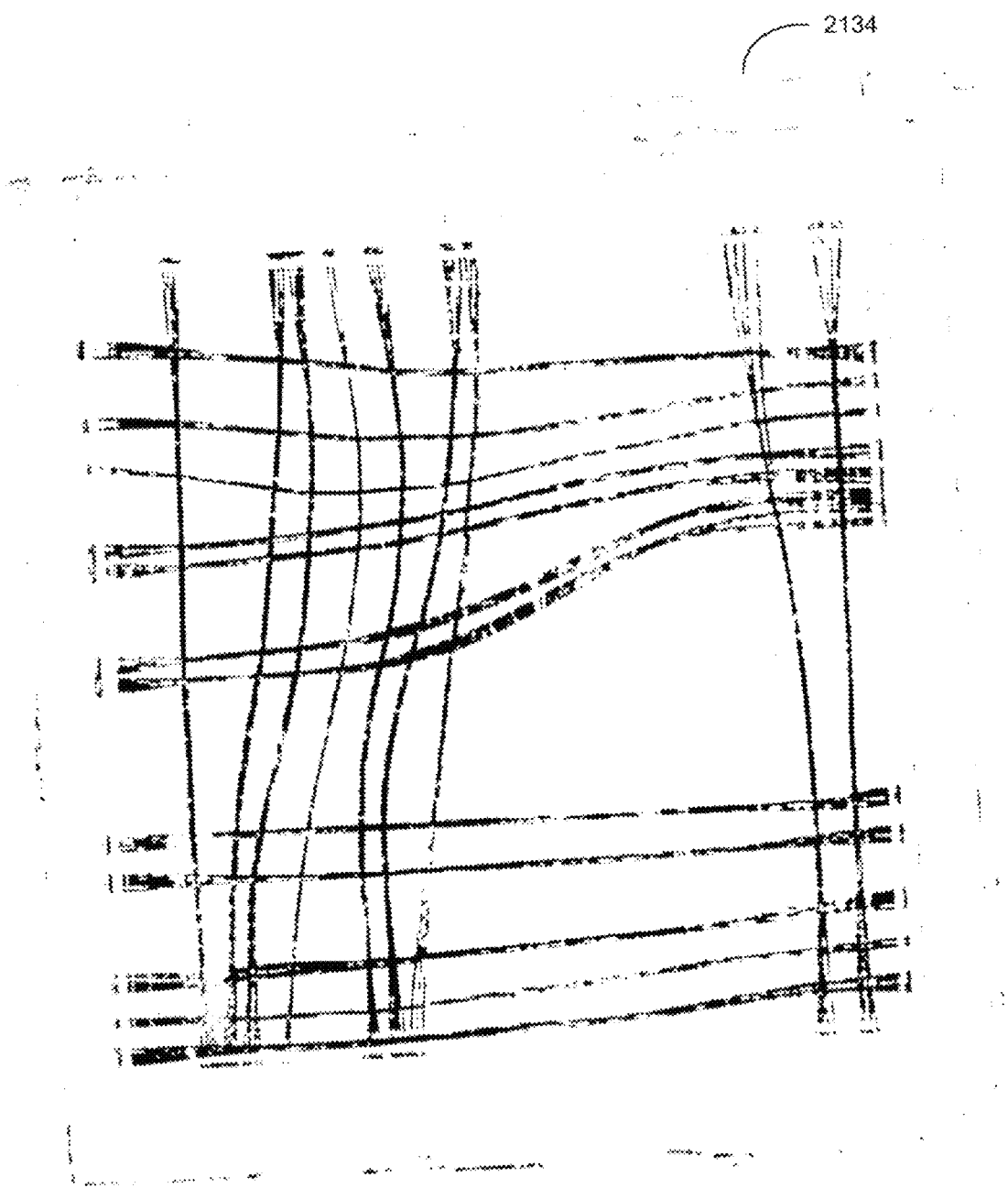
Figure 21K:

Prior to generating the digital model elements, the segmented image result from the tool's machine learning models may be cleaned following the procedure outlined in flowchart 2100 of FIG. 21A. In step 2102, the results from the tool's machine learning analysis are received. In step 2104, image from step 2102 is dilated using the OpenCV function dilate. This function finds the maximum pixel value in a kernel centered at each pixel. In step 2106, the image is eroded using the OpenCV function erode. This function does the opposite of the dilate function, computing the local minimum over the area of kernel. Both functions together in combination can help to reduce noise in image and isolate the main elements in the image. In step 2108, the pixel values are rounded to their nearest integer value to further reduce noise in the image. In step 2110, filters are applied to the image obtained in step 2108. Pillow (PIL) functions MaxFilter and MinFilter are used to determine the largest and lowest pixel value in a window of a given size, respectively. The pixels in the image are then converted to single channel format such that each pixel has a value ranging from 0 to 255. In step 2112, all the pixels in the image obtained in step 2110 are reassigned into two values: 0 or 255 based on whether the pixel value was above 200 or not. This operation is done to eliminate all the intermediate light and dark pixels in the image and only retain the extreme pixel values. In step 2114, the image is converted to Red Green Blue (RGB) format. In step 2116, the PIL MaxFilter function can be applied once again to thin out dark pixels in the image to further reduce noise and isolate the important elements in the image. The different steps outlined in this process may be used in any order or combination. Similar techniques may be used to clean the image in lieu of or in addition to those outlined in the flow chart 2100.

FIGS. 21B to 21K show the results of cleaning a drone image analyzed by the tool's machine learning models to identify post-tensioned tendons using segmentation. Image 2118 shows the original drone image, while image 2120 shows results from the machine learning analysis (step 2102). Image 2122 shows the dilation of the image after 4 iterations and image 2124 shows the subsequent erosion of the image (steps 2104 and 2106). Image 2126 shows the image after rounding of the pixel values (step 2108). Image 2128 shows the image after the filters are applied to it and image 2130 shows the image after the pixels have been sorted into two groups (steps 2110 and 2112). Image 2132 shows the image after it has been converted to RGB format (step 2114). Image 2136 shows image 2132 overlain on the original image 2118. Image 2134 shows the image after the final filter has been applied (step 2116).

Generating Two-Dimensional Lines or Polylines from Images (Segmentation)

Figure 22A:
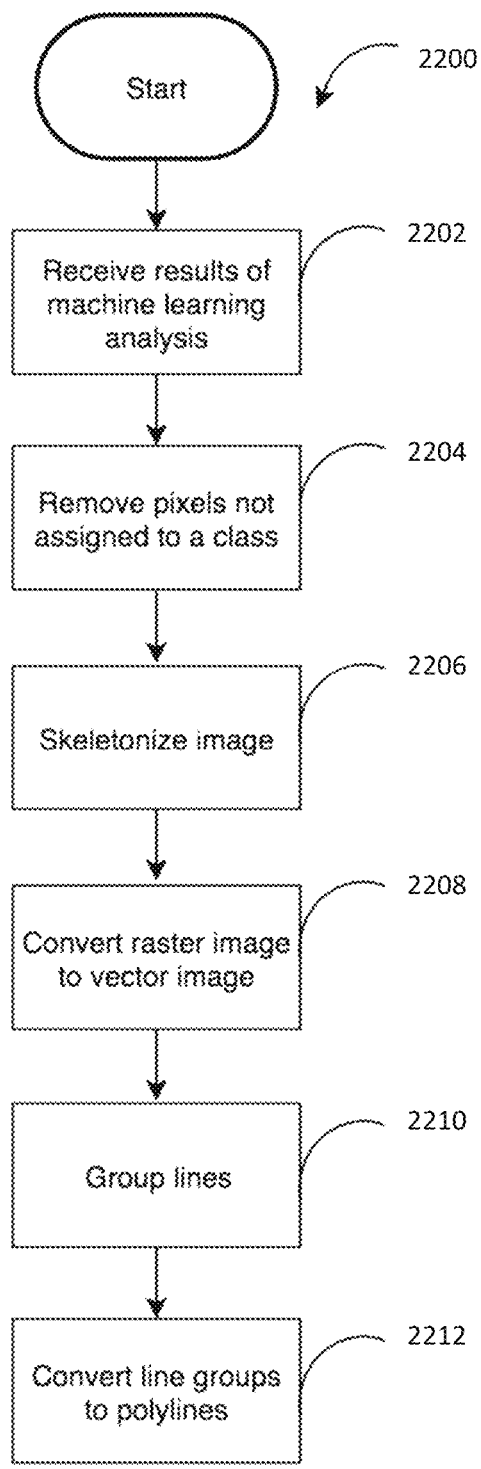
FIG. 22A depicts a flow chart illustrating exemplary steps of the machine learning tool of FIGS. 2 and 3 to implement an algorithm for generating two-dimensional lines or polylines from images in accordance with principles disclosed herein.

FIG. 22A depicts a flowchart 2200 illustrating the different steps in a process for generating vector lines from images that have been analyzed by the tool's machine learning models using segmentation. In step 2202, the results from the tool's machine learning analysis and, if applicable, the results of the image cleaning process outlined in flow chart 2100, are received. In step 2204, the pixels not assigned to a class in the image obtained from step 2202 are removed. In step 2206, the image is skeletonized using the skeletonize function in the Scikit-Image library, which reduces the image to a one pixel-wide representation. In step 2208, the raster image is converted to a vector image. In step 2210, the lines in the vector image are grouped depending on their location and orientation. In step 2212, the line groups can be converted to polylines. These lines or polylines can be used as-is by the user or imported by the user into the digital drawing or modeling software program of their choice.

Figure 22B:
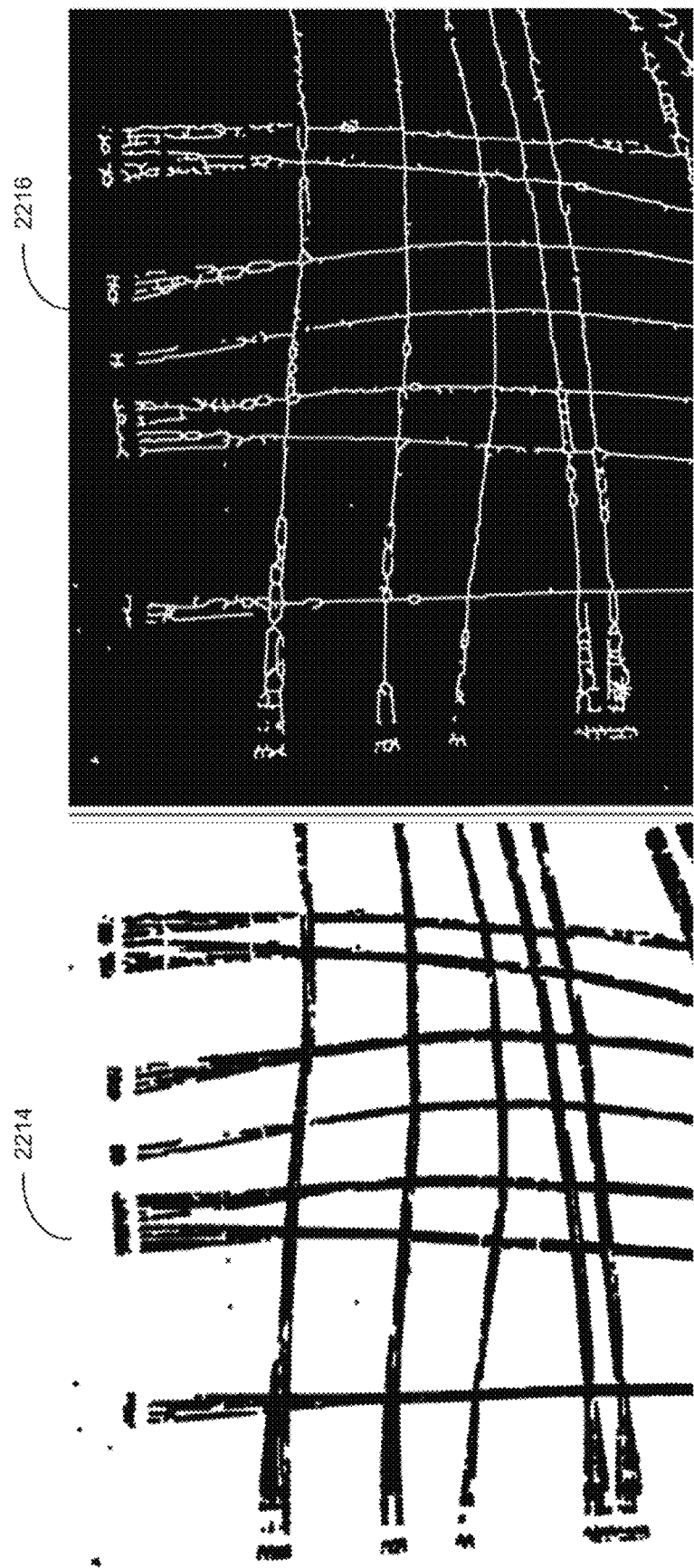
FIG. 22B is an image useful for explaining the steps of the steps of FIG. 22A.

In FIG. 22B, image 2214 shows the cleaned image 2134 and image 2216 shows the skeletonized version (step 2206).

Generating Three-Dimensional Digital Model Components from Images

To generate digital model components from images, the machine learning results are first processed through the measurement algorithm following the process outlined in flowchart 2000. In lieu of or in addition to the convex hull in step 2016, a wire boundary outline (x-shape) may be generated around the group of pixels. These outlines can be used to compute the measurements as well as centroid and angle of each shape. Once the measurements, centroid (location) and angle (orientation) have been obtained for each object of each class identified in the image, this information will be used to generate the corresponding model component in the appropriate digital model format.

Generating Three-Dimensional Digital Model Components from Point Cloud Data

Figure 23A:
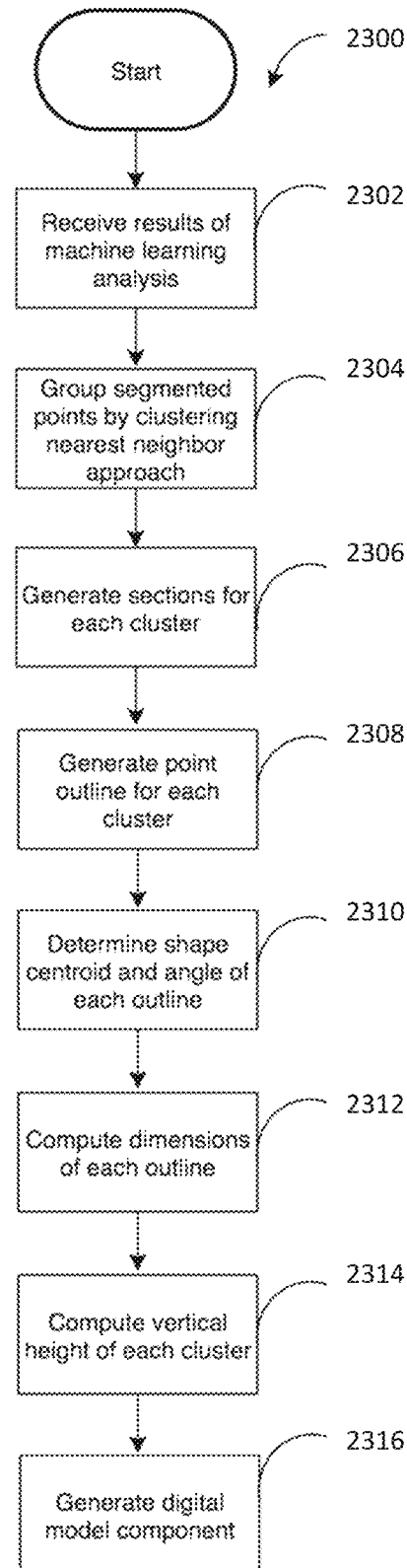
FIG. 23A depicts a flow chart illustrating exemplary steps of the machine learning tool of FIGS. 2 and 3 to implement an algorithm for generating three-dimensional digital model components from point cloud data in accordance with principles disclosed herein.

FIG. 23A depicts a flowchart 2300 illustrating how the tool can be used to generate digital model components from point cloud data. In step 2302, the results of the machine learning analysis segmenting the point cloud data into different classes are received. In step 2304, the segmented points are grouped using a clustering nearest neighbor approach. In step 2306, sections are generated for each cluster at set intervals over their height. In step 2308, a point outline is generated at each section using the convex hull and/or x-shape (wire boundary) techniques. In step 2310, the shape outline(s) are used to compute the shape centroid and angle. In step 2312, the shape outline(s) are used to determine the section dimensions. In step 2314, the vertical height is computed for each cluster. In step 2316, a digital model component is generated for each cluster using the cluster class, centroid (location), angle (orientation), and dimension information obtained above.

FIG. 23B shows an image 2318 that illustrates how an outline is generated around a point cluster section.

Comparison Algorithm 314

Comparison to Digital Model

Comparison to a digital model encompasses comparison to digital drawings or models in the formats described in the section above.

Figure 24A:
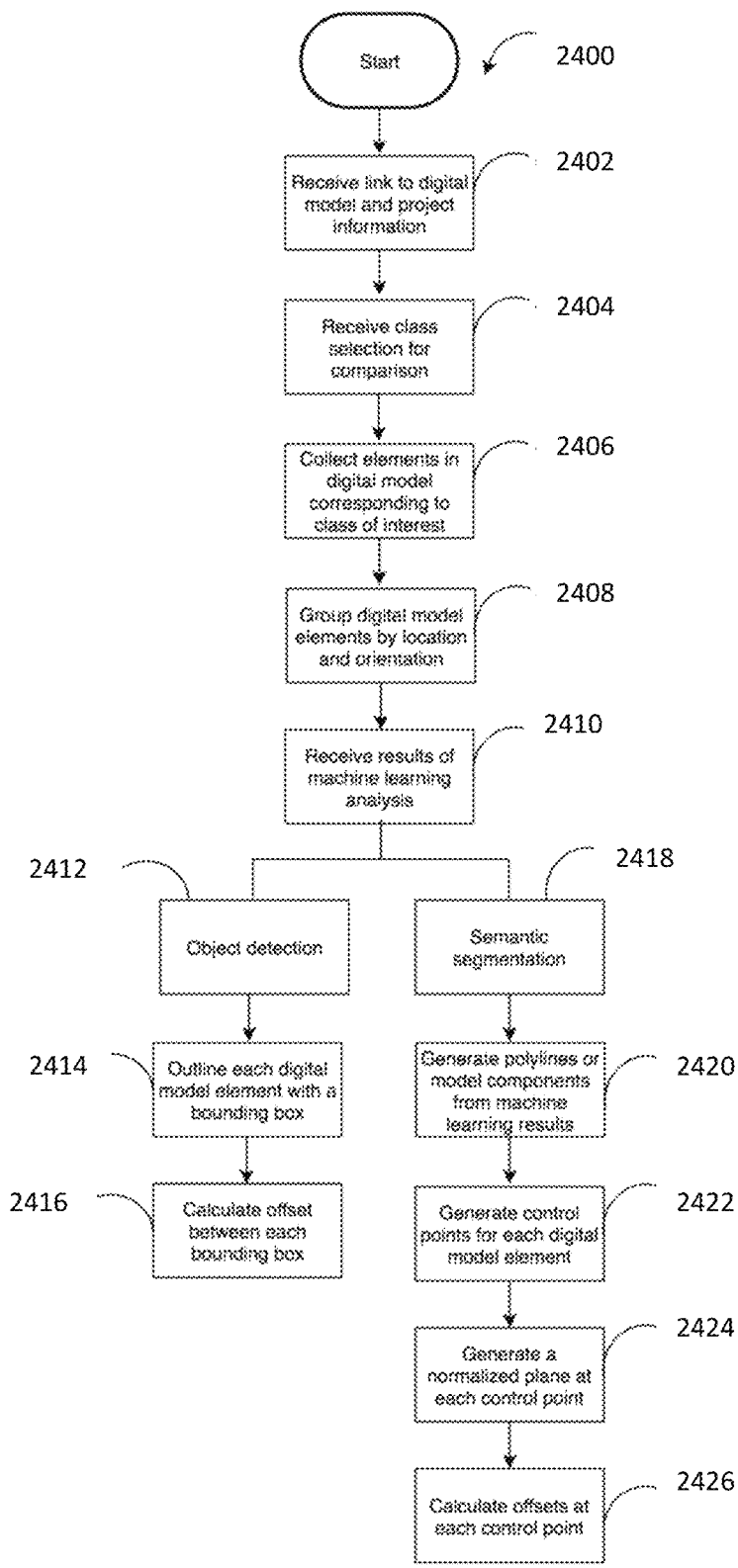
FIG. 24A depicts a flow chart illustrating exemplary steps by the machine learning tool of FIGS. 2 and 3 to implement a comparison algorithm in accordance with principles disclosed herein.

FIG. 24A depicts a flowchart 2400 illustrating how the tool can be used to compare the machine learning results to a digital model of the structure. In step 2402, the link to the digital model is established and project information, such as project coordinate location and units, is received. In step 2404, the class for which the comparison is to be performed is received. In step 2406, the elements in the digital model corresponding to the class of interest are collected. In step 2408, these elements are grouped according to location and orientation. In step 2410, the results of the machine learning analysis are received. If the results were obtained through object detection techniques 2412, then each digital model element is outlined with a bounding box in step 2414. In step 2416, the offsets between the digital model bounding box and the bounding box obtained through machine learning are computed. If the results of the machine learning analysis were obtained through semantic segmentation 2418, then in step 2420, lines, polylines or digital model components are generated following the procedure outlined in flowchart 2300. In step 2422, control points are generated for the digital model elements collected in step 2406. In step 2424, a normalized plane is generated at each control point. In step 2426, offsets between the digital model elements and the elements generated from the machine learning analysis results are computed.

Figure 24B:
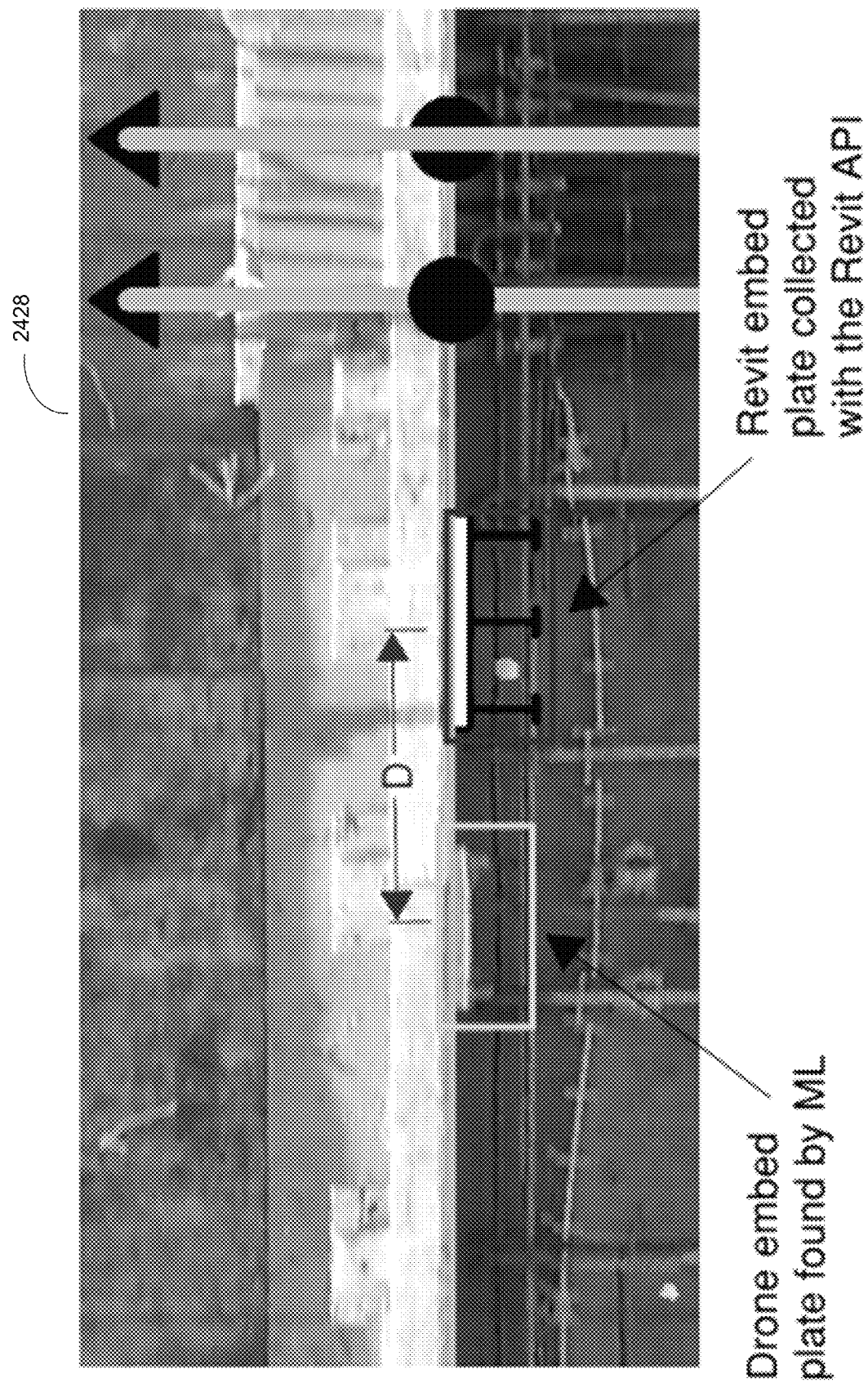
FIGS. 24B to 24E are images useful for explaining the steps of FIG. 24A.
Figure 24C:
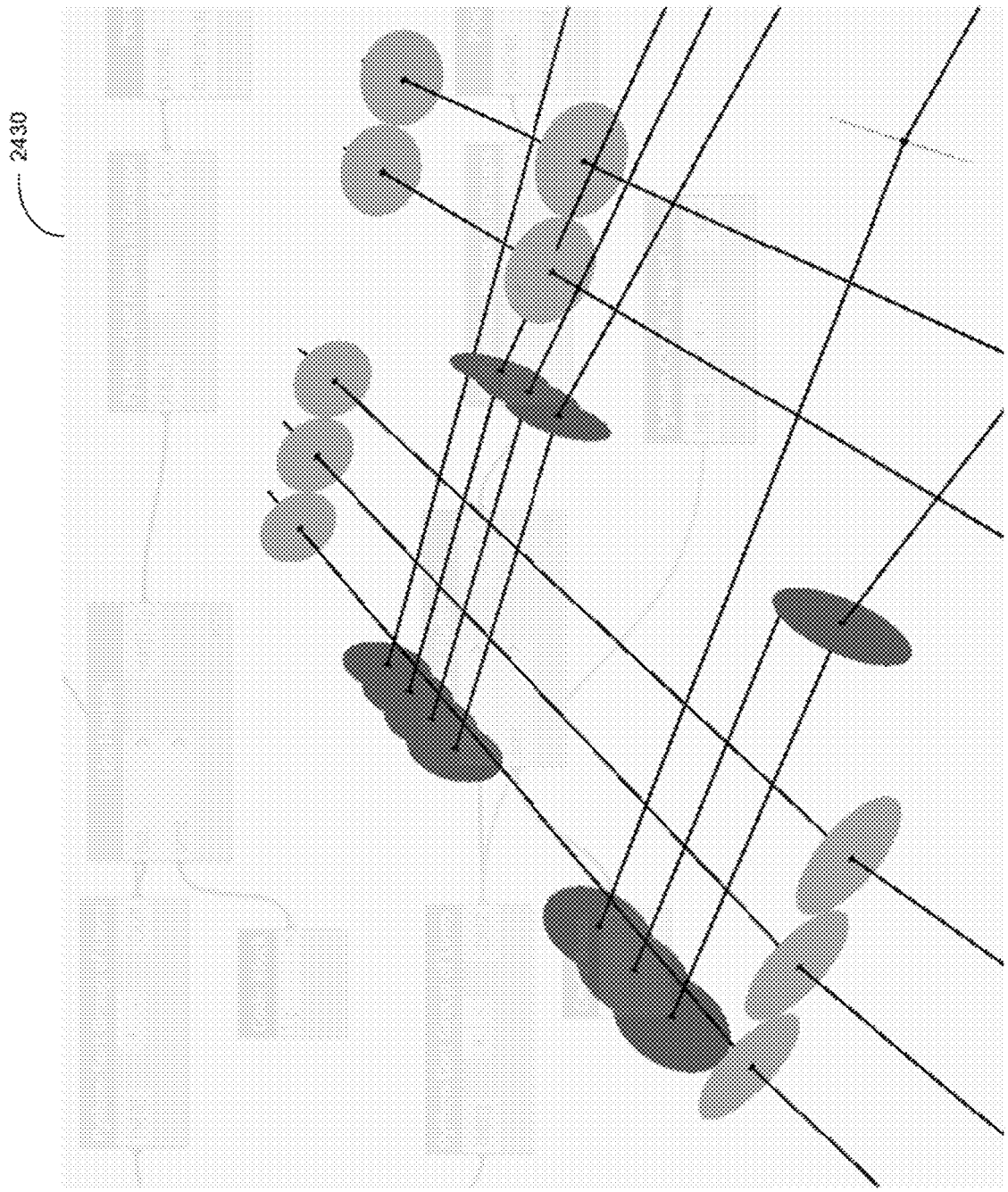
Figure 24D:
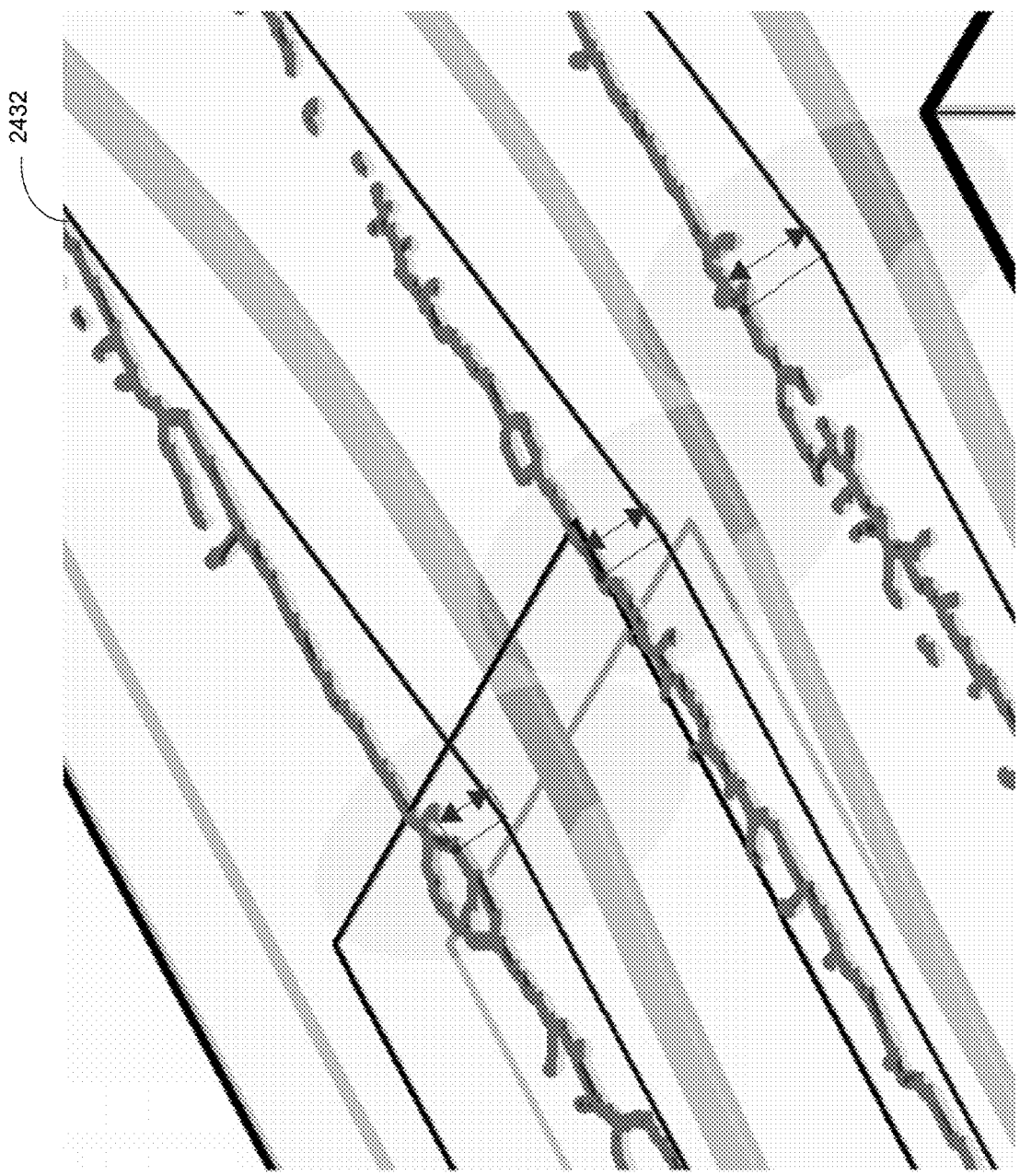
Figure 24E:
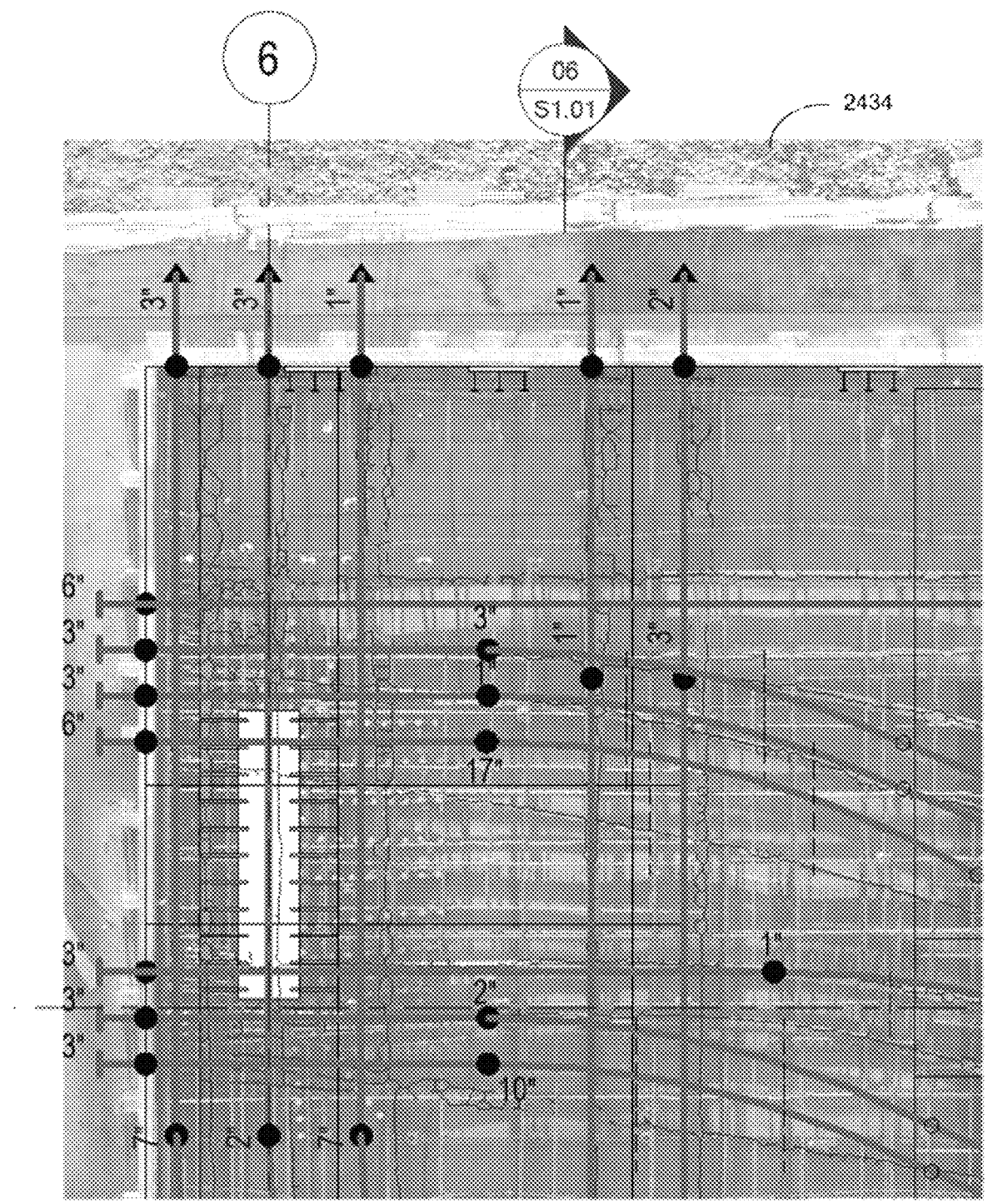

FIG. 24B is an image 2428 showing an example of the offset distance between an embed plate from a digital model and one detected through the tool's machine learning analysis using object detection. FIG. 24C is an image 2430 showing an example of normalized planes at each control points generated in step 2424 for post-tensioned tendons. FIG. 24D is an image 432 showing the offset distance at the control points between the digital model and the lines generated from the machine learning results. In FIG. 24E, image 2434 shows an example of how the results from the comparison algorithm may be displayed for post-tensioned tendons in which the offsets calculated at each control point are indicated in a plan view showing the digital model and machine learning results.

REFERENCES

The following constitutes a non-exhaustive list of open-source, third-party resources that were employed in the development of the machine learning tool for structures:

You Only Look Once (YOLO): YOLO is a machine learning network the open source MIT license. This network was used to train image-level classification models in the development of the presently disclosed machine learning tool for structures. See, https://pjreddie.com/darknet/yolo/.

Tensorflow: Tensorflow is Google's open source framework for machine learning, which is the machine learning framework employed in the development of the presently disclosed machine learning tool for structures. Tensorflow is available under the Apache 2.0 open-source license. See, https://www.tensorflow.org.

Tensorflow Object Detection API: Tensorflow Object Detection API is an open source framework built on top of TensorFlow to construct, train and deploy object detection models. It was used to train object detection models in the development of the presently disclosed machine learning tool for structures and is available under the Apache 2.0 license. See https://github.com/tensorflow/models/tree/master/research/object_detection.

Faster Region-Convolutional Neural Network (R-CNN): Faster R-CNN is a machine learning network that is available under the open source MIT license. This network, initialized with the pretrained weights from the MS COCO dataset, was used to train object detection models in the development of the presently disclosed machine learning tool for structures. See, https://github.com/ShaoqingRen/faster_rcnn and https://github.com/rbgirshick/py-faster-rcnn.

DeepLabV2: DeepLabV2 is a deep neural network for semantic segmentation that is available under the open source MIT license. This network was used to train semantic segmentation models in the development of the presently disclosed machine learning tool for structures. See, https://github.com/tensorflow/models/tree/master/research/deeplab.

ResNet101: ResNet101 is a residual neural network that is trained on more than a million images from the ImageNet database and is available under the open source MIT license. This network was used to train both the object detection and semantic segmentation machine learning models in the development of the presently disclosed machine learning tool for structures. See, https://github.com/KaimingHe/deep-residual-networks.

PointNet and PointNet++: PointNet and PointNet++ are neural networks for point cloud data that are available under the open source MIT license. These networks were used to train machine learning models directly on point cloud data in the development of the presently disclosed machine learning tool for structures. See https://github.com/charlesq34/pointnet and https://github.com/charlesq34/pointnet2.

Common Objects in Context (COCO) dataset: The COCO dataset is a large-scale object detection, segmentation, and captioning dataset. Some of the neural networks were initialized with the pre-trained weights from the COCO dataset in the development of the presently disclosed machine learning tool for structures. The COCO dataset is available under the Creative Commons Attribution 4.0 License. See, http://cocodataset.org.

Google's Optical Character Recognition (OCR): Google's OCR is a tool to detect text within images, which was used to extract text from drawings in the development of the presently disclosed machine learning tool for structures. Google's OCR is available under the Apache 2.0 open-source license. See https://cloud.google.com/vision/docs/ocr.

CloudCompare: CloudCompare is a software application for the processing of 3D point cloud and triangular mesh models, which was employed in some cases to process the point cloud data and prepare it for machine learning analysis in the development of the presently disclosed machine learning tool for structures. CloudCompare is available under the GNU Library General Public License, version 2.0. See, cloudcompare.org.

Revit BIM is a building information modeling application available from Advenser LLC in the United States, and Advenser Engineering Services PvT, Ltd. in India. See, www.revitmodeling.com.

Open Source Computer Vision Library (OpenCV): OpenCV is an open source computer vision and machine learning software library available under the Berkeley Software Distribution (BSD) license. See, opencv.org.

Pillow (PIL): Pillow is a PIL fork licensed under open source PIL Software License. It was developed by Alex Clark and contributors. See, https://pillow.readthedocs.io/en/stable.

Scikit-image: Scikit-image is an open-source image processing library for the Python programming language available under the Berkeley Software Distribution (BSD) license. See, https://scikit-image.org.

Python: Python is an open-source programming language available under the Python license. See, python.org.

NumPy: NumPy is an open-source Python package for scientific computing available under the NumPy license. See, www.numpy.org.

Note that the machine learning models can be updated with new and improved frameworks and neural networks as they are created. New machine learning techniques can also be incorporated as they are created. Therefore, additional open-source, third-party resources different than those listed above may be employed in the development of the presently disclosed machine learning tool for structures.

What is claimed is:
1. A machine learning tool, comprising:
a computing system with one or more data processors and memory;
a user interface via which information can be output to a user and via which information and data can be input by the user, the data identifying one or more structures, components thereof, or both;

a database in which the data are stored;

a database management system that communicates with the database to store and retrieve the data in and from the database; and non-transient data processor executable instructions stored in the memory, the instructions comprising one or more pre-trained machine learning models and one or more post-processing algorithms, wherein, the one or more machine learning models are pre-trained to process the data in the database to (a) evaluate performance or design of a structure from an image of the structure, point cloud data characterizing the structure, a three-dimensional representation of the structure, or a drawing of the structure, (b) identify one or more components of the structure from the image, the point cloud data, the three-dimensional representation, or the drawing, identify the one or more components of the structure and extract text related to the one or more components from the drawing, identify and assess damage in the one or more components of the structure from the image or the point cloud data, or any combination of the foregoing, and (c) generate a first output file with the identified one or more components individually bounded, and the one or more post-processing algorithms comprise, a quantity algorithm, a measurement algorithm, a comparison algorithm, a digital model generation algorithm, or any combination of the foregoing that process the first output file and generate a second output file containing a classification of the identified one or more components and a count by class of the one or more components, an area measurement of each of the identified one or more components, deviations between output of one of the machine learning models and a benchmark, two-dimensional lines or three-dimensional representation of the one or more components, or any combination of the foregoing, wherein, (1) the measurement algorithm comprises the steps of (a) using computer vision, detecting edges in regions identified by the one or more machine learning models, and (b) calculating pixel distance within those regions and converting the pixel distance to another unit of distance specified by the user based on properties of a camera and its spatial relationship to the structure, (2) the comparison algorithm comprises the steps of (a) comparing information extracted from the one or more machine learning models to a benchmark (i) input by the user, (ii) obtained automatically through machine learning analysis of physical drawings, or (iii) obtained automatically from a digital drawing or a digital model, and (b) reporting out any deviation between the information extracted from the one or more machine learning models and the benchmark, and (3) the digital model generation algorithm comprises using results from the one or more machine learning models to generate two-dimensional digital drawings or a three-dimensional digital model of the identified elements by grouping the pixels or points for each class identified components and converting them into two-dimensional lines or three-dimensional components with the lines being created by reducing the groups of pixels or points down to lines or polylines running through a center of that pixel or point group, wherein, the converted components are created by determining the outer limits of the machine learning identified pixel or point group, determining its dimensions, location and orientation, and generating the appropriate component based on the class, centroid (location), angle (orientation) and dimension information obtained above.

2. The machine learning tool of claim 1, wherein the one or more machine learning models are pre-trained to process the data in the database to evaluate the design of the structure, identify the components of the structure, and assess damage in the structure.

3. The machine learning tool of claim 1, wherein the one or more post-processing algorithms comprise, the quantity algorithm, the measurement algorithm, the comparison algorithm, and the digital model generation algorithm.

4. The machine learning tool of claim 1, wherein:

the one or more machine learning models are pre-trained to process the data in the database to evaluate the design of the structure, identify the components of the structure, and assess the damage in the structure, and the one or more post-processing algorithms comprise, the quantity algorithm, the measurement algorithm, the comparison algorithm, and the digital model generation algorithm.

5. The machine learning tool of claim 1, wherein the components of the structure include structural components and non-structural components.

6. The machine learning tool of claim 1, wherein, the quantity algorithm sums a number of instances of the components in one or more classes identified by the one or more the machine learning models to provide a total count of the identified instances of the components for each class of the components.

7. The machine learning tool of claim 1, comprising the measurement algorithm.

8. The machine learning tool of claim 1, comprising the comparison algorithm.

9. The machine learning tool of claim 1, comprising the digital model generation algorithm.

10. The machine learning tool of claim 1 wherein, specific damage is identified and incorporated into a broader resilience plan for various conditions considering at a minimum single structures, to a maximum of all the structures in cities, counties and the like.

11. A machine learning tool, comprising:

a computing system with one or more data processors and memory storing non-transient data processor executable instructions;

a user interface via which information can be output to a user and via which information and data can be input by the user;

a database in which data is stored; and a database management system that communicates with the database to store and retrieve the data in and from the database, wherein, when executed by the data processor, the data processor executable instructions effect the steps of:

processing the data using pre-trained machine learning models to evaluate a design of a structure, identify components of the structure, assess damage in the structure, or any combination of the foregoing, and generate a first output file with the identified components bounded; and process the first output file from the prior step by invoking a quantity algorithm, a measurement algorithm, a comparison algorithm, a digital model generation algorithm, or any combination of the foregoing and generate a second output file containing a count of the identified components, a measurement of the identified components, wherein,
  (1) the measurement algorithm comprises the steps of (a) using computer vision, detecting edges in regions identified by the one or more machine learning models, and (b) calculating pixel distance within those regions and converting the pixel distance to another unit of distance specified by the user based on properties of a camera and its spatial relationship to the structure,
  (2) the comparison algorithm comprises the steps of (a) comparing information extracted from the one or more machine learning models to a benchmark (i) input by the user, (ii) obtained automatically through machine learning analysis of physical drawings, or (iii) obtained automatically from a digital drawing or a digital model, and (b) reporting out any deviation between the information extracted from the one or more machine learning models and the benchmark, and
  (3) the digital model generation algorithm comprises using results from the one or more machine learning models to generate two-dimensional digital drawings or a three-dimensional digital model of the identified elements by grouping the pixels or points for each class identified components and converting them into two-dimensional lines or three-dimensional components with the lines being created by reducing the groups of pixels or points down to lines or polylines running through a center of that pixel or point group, wherein, the converted components are created by determining the outer limits of the machine learning identified pixel or point group, determining its dimensions, location and orientation, and generating the appropriate component based on the class, centroid (location), angle (orientation) and dimension information obtained above.

12. A tool comprising:
a computing system with one or more data processors and memory;
a user interface via which information can be output to a user and via which information and data can be input by the user;
a database in which the data is stored;
a database management system that communicates with the database to store and retrieve the data in and from the database; and
non-transient data processor executable instructions stored in the memory,
wherein,
  when executed by the data processor, the data processor executable instructions cause:
  the user interface to prompt a user to select a machine learning analysis and a data format,
  receive the data from the user and store the data in the database,
  prompt the user to select from among one or more machine learning models pre-trained to process the data in the database to evaluate performance or design of a structure from an image, point cloud data, a three-dimensional representation or drawing thereof, by identifying components of the structure from the image or the point cloud data, identifying the components of the structure and extracting related text from the drawing, identifying and assessing damage in the structure from the image or the point cloud data, or any combination of the foregoing,
  invoke each selected machine learning model and process the data using the invoked machine learning model and generate a first output file with the identified components bounded,
  prompt the user to select one or more post-processing algorithms comprising, a quantity algorithm, a measurement algorithm, a comparison algorithm, a digital model generation algorithm, or any combination of the foregoing, and
  invoke each post-processing algorithm and process the first output file and generate a second output file,
  wherein,
    (1) the measurement algorithm comprises the steps of (a) using computer vision, detecting edges in regions identified by the one or more machine learning models, and (b) calculating pixel distance within those regions and converting the pixel distance to another unit of distance specified by the user based on properties of a camera and its spatial relationship to the structure,
    (2) the comparison algorithm comprises the steps of (a) comparing information extracted from the one or more machine learning models to a benchmark (i) input by the user, (ii) obtained automatically through machine learning analysis of physical drawings, or (iii) obtained automatically from a digital drawing or a digital model, and (b) reporting out any deviation between the information extracted from the one or more machine learning models and the benchmark, and
    (3) the digital model generation algorithm comprises using results from the one or more machine learning models to generate two-dimensional digital drawings or a three-dimensional digital model of the identified elements by grouping the pixels or points for each class identified components and converting them into two-dimensional lines or three-dimensional components with the lines being created by reducing the groups of pixels or points down to lines or polylines running through a center of that pixel or point group, wherein, the converted components are created by determining the outer limits of the machine learning identified pixel or point group, determining its dimensions, location and orientation, and generating the appropriate component based on the class, centroid (location), angle (orientation) and dimension information obtained above.

13. A machine learning tool comprising:
a computing system with one or more data processors and memory;
a user interface via which information can be output to a user and via which information and data can be input by the user, the data identifying a structure, components thereof, or both;
a database in which the data are stored;
a database management system that communicates with the database to store and retrieve the data in and from the database; and non-transient data processor executable instructions stored in the memory, the instructions comprising:
- (A) one or more pre-trained machine learning models, wherein, the one or more machine learning models are pre-trained to process the data in the database to evaluate performance or design of the structure from an image, point cloud data, or three-dimensional representations or a drawing thereof, by identifying the components of the structure from the image or the point cloud data, identifying one or more of the components of the structure and extracting related text from the drawing, identifying and assessing damage in the structure from the image or the point cloud data, or any combination of the foregoing and generate a first output file with the identified components bounded; and
- (B) one or more post-processing algorithms comprising, a quantity algorithm, a measurement algorithm, a comparison algorithm, a digital model generation algorithm, or any combination of the foregoing that process the first output file and generate a second output file containing a classification of the identified one or more components and a count by class of the one or more components, an area measurement of each of the identified one or more components, deviations between output of one of the machine learning models and a benchmark, two-dimensional lines or three-dimensional representation of the one or more components, or any combination of the foregoing, wherein,
- (1) the measurement algorithm comprises the steps of (a) using computer vision, detecting edges in regions identified by the one or more machine learning models, and (b) calculating pixel distance within those regions and converting the pixel distance to another unit of distance specified by the user based on properties of a camera and its spatial relationship to the structure,
- (2) the comparison algorithm comprises the steps of (a) comparing information extracted from the one or more machine learning models to a benchmark (i) input by the user, (ii) obtained automatically through machine learning analysis of physical drawings, or (iii) obtained automatically from a digital drawing or a digital model, and (b) reporting out any deviation between the information extracted from the one or more machine learning models and the benchmark, and
- (3) the digital model generation algorithm comprises using results from the one or more machine learning models to generate two-dimensional digital drawings or a three-dimensional digital model of the identified elements by grouping the pixels or points for each class identified components and converting them into two-dimensional lines or three-dimensional components with the lines being created by reducing the groups of pixels or points down to lines or polylines running through a center of that pixel or point group, wherein, the converted components are created by determining the outer limits of the machine learning identified pixel or point group, determining its dimensions, location and orientation, and generating the appropriate component based on the class, centroid (location), angle (orientation) and dimension information obtained above.

* * * * *